(12) United States Patent
Ryley et al.

(10) Patent No.: US 11,815,881 B2
(45) Date of Patent: Nov. 14, 2023

(54) MANAGING NON-CONTACT FORCES IN MECHANISMS

(71) Applicant: CBN Nano Technologies Inc., Ottawa (CA)

(72) Inventors: James F. Ryley, Downey, CA (US); Mark N. Jobes, Ottawa (CA); James MacArthur, Manchester (GB); Jeffrey E. Semprebon, Claremont, NH (US)

(73) Assignee: CBN Nano Technologies Inc., Ottawa (CA)

( * ) Notice: Subject to any disclaimer, the term of this patent is extended or adjusted under 35 U.S.C. 154(b) by 0 days.

(21) Appl. No.: 18/003,697

(22) PCT Filed: Sep. 22, 2021

(86) PCT No.: PCT/US2021/051411
§ 371 (c)(1),
(2) Date: Dec. 29, 2022

(87) PCT Pub. No.: WO2022/066681
PCT Pub. Date: Mar. 31, 2022

(65) Prior Publication Data
US 2023/0238965 A1      Jul. 27, 2023

Related U.S. Application Data

(60) Provisional application No. 63/083,265, filed on Sep. 25, 2020, provisional application No. 63/083,276, filed on Sep. 25, 2020.

(51) Int. Cl.
*H03K 19/20*       (2006.01)
*G05B 19/4155*   (2006.01)
(Continued)

(52) U.S. Cl.
CPC .......... *G05B 19/4155* (2013.01); *B82Y 10/00* (2013.01); *G06C 15/02* (2013.01);
(Continued)

(58) Field of Classification Search
CPC .......... H03K 19/20; H03K 19/21; G06D 3/00; G05B 19/4155; G05B 2219/33291;
(Continued)

(56) References Cited

U.S. PATENT DOCUMENTS 7,411,772 B1      8/2008   Tymes
10,481,866 B2 *  11/2019   Merkle .................. H01B 3/307
(Continued)

FOREIGN PATENT DOCUMENTS

WO          0131789 A2       5/2001
WO       2010019440 A1       2/2010
WO       2015147885 A1      10/2015

OTHER PUBLICATIONS

Liu et al. Flexible Logic Circuits by Using Van Der Waals Contacted Graphene Field-Effect Transistors. 2019 IEEE International Symposium on Circuits and Systems, IEEE, May 26, 2019, pp. 1-5.
(Continued)

*Primary Examiner* — Daniel A Hess

(57) ABSTRACT

Mechanisms can be designed to manage non-contact forces to reduce energy consumption and/or to control interactions between the parts. Management of non-contact forces is especially useful in micro-scale and nano-scale mechanisms, where van der Waals attraction between parts of the mechanism may be significant to the operation of the mechanism.

22 Claims, 34 Drawing Sheets

(51) Int. Cl.
| | |
|---|---|
| *B82Y 10/00* | (2011.01) |
| *G06F 5/01* | (2006.01) |
| *G06D 3/00* | (2006.01) |
| *G06N 10/00* | (2022.01) |
| *G06C 15/02* | (2006.01) |
| *H01B 3/18* | (2006.01) |
| *H01B 3/30* | (2006.01) |
| *H03K 19/21* | (2006.01) |

(52) U.S. Cl.
CPC ................ *G06D 3/00* (2013.01); *G06F 5/01* (2013.01); *G06N 10/00* (2019.01); *H01B 3/18* (2013.01); *H01B 3/307* (2013.01); *H03K 19/20* (2013.01); *H03K 19/21* (2013.01); *G05B 2219/33291* (2013.01)

(58) Field of Classification Search
CPC ........ G06N 10/00; B82Y 10/00; G06C 15/02; G06F 5/01; H01B 3/18; H01B 3/307
USPC ....................................... 235/61 R
See application file for complete search history.

(56) References Cited

U.S. PATENT DOCUMENTS

| | | |
|---|---|---|
| 10,683,924 B1 | 6/2020 | Ryley, III |
| 10,949,166 B2 | 3/2021 | Merkle et al. |
| 2005/0282516 A1 | 12/2005 | Bertin |
| 2010/0315123 A1 | 12/2010 | Neimer et al. |
| 2013/0020631 A1 | 1/2013 | Pott et al. |
| 2014/0262707 A1 | 9/2014 | Pawashe et al. |
| 2017/0192748 A1 | 7/2017 | Merkle et al. |

OTHER PUBLICATIONS

Zhang et al. Van der Waals magnets: Wonder building blocks for two-dimensional spintronics? InfoMat, v. 1 No. 4, Dec. 18, 2019, pp. 479-495.

R. Merkle et al. Mechanical computing systems using only links and rotary joints. ASME Journal on Mechanisms and Robotics. (2018) vol. 10, pp. 061006.

Sharma, Ram, & Amarnath. Mechanical Logic Devices and Circuits. 14th National Conference on Machines and Mechanisms (NaCoMM-09). (2009) pp. 235-239.

Peter J. Vis, "BigTrak Motor", excerpts from online article, URL https://www.petervis.com/gallery/Toys_and_Games/bigtrak/bigtrak-motor.html, accessed on Dec. 14, 2021.

V. Rochus et al., "Design of SiGe Nano-Electromechanical relays for logic applications," 2013 14th International Conference on Thermal, Mechanical and Multi-Physics Simulation and Experiments in Microelectronics and Microsystems (EuroSimE), Wroclaw, Poland, 2013, pp. 1-7, doi: 10.1109/EuroSimE.2013.6529971.

M. Huang et al. "Multifunctional high-performance van der Waals heterostructures." Nature nanotechnology 12.12 (2017): 1148-1154.

\* cited by examiner

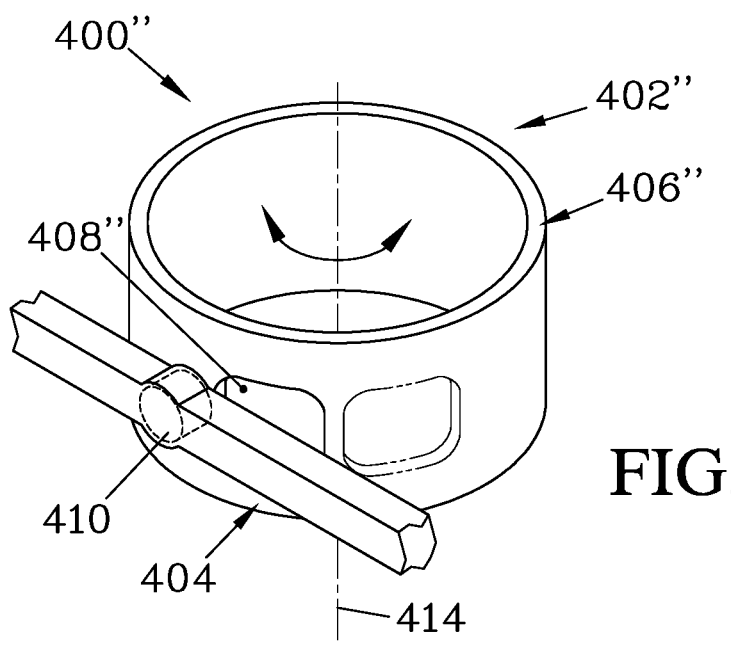
FIG. 4D
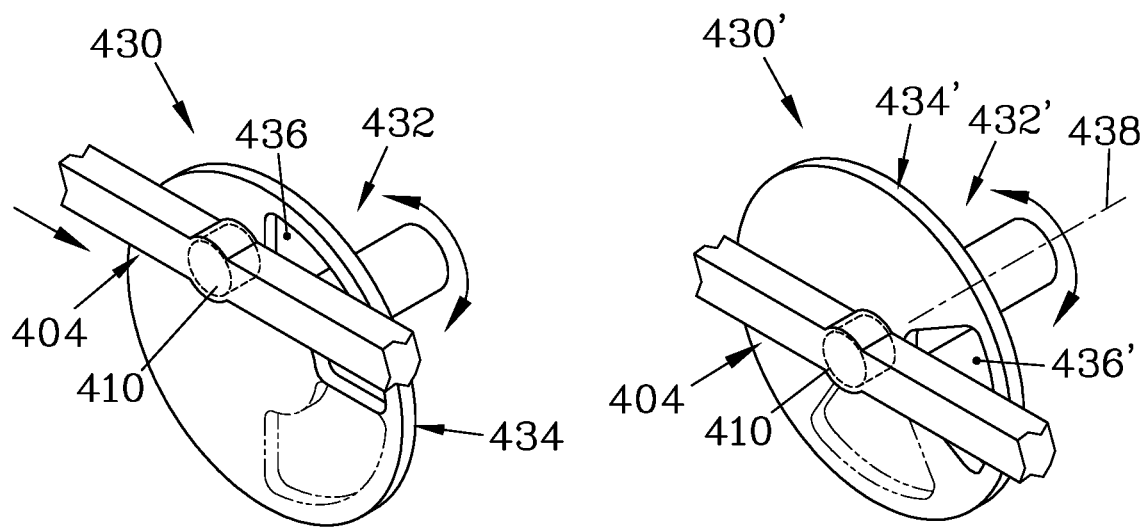
FIG. 4E
FIG. 4F

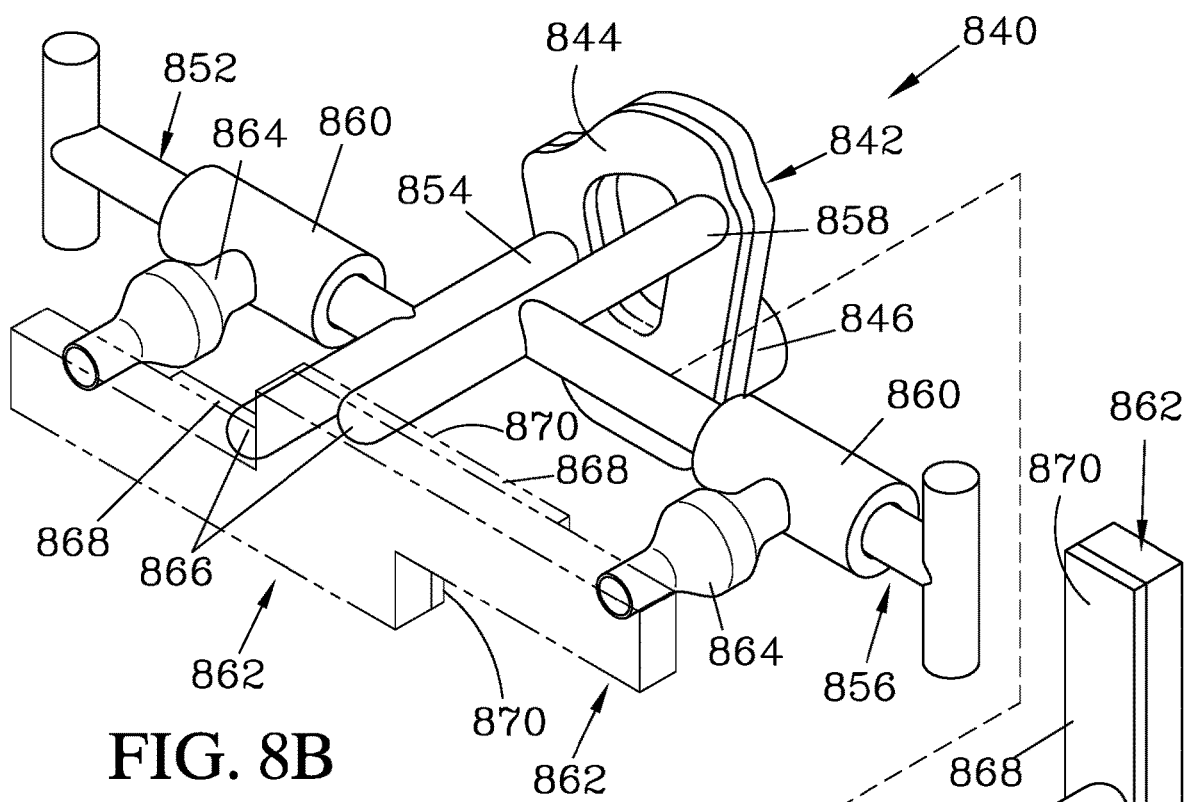
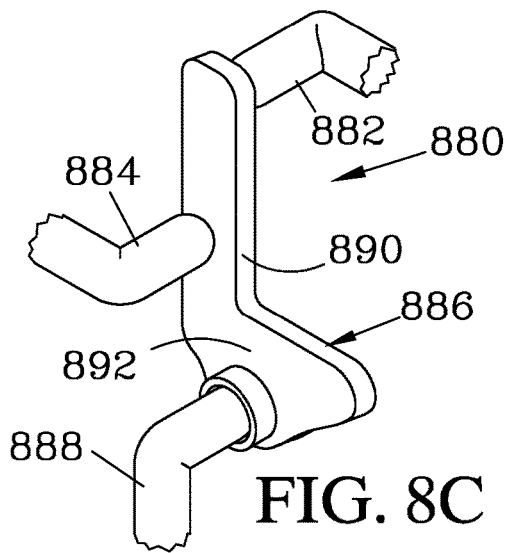
FIG. 8B
FIG. 8C

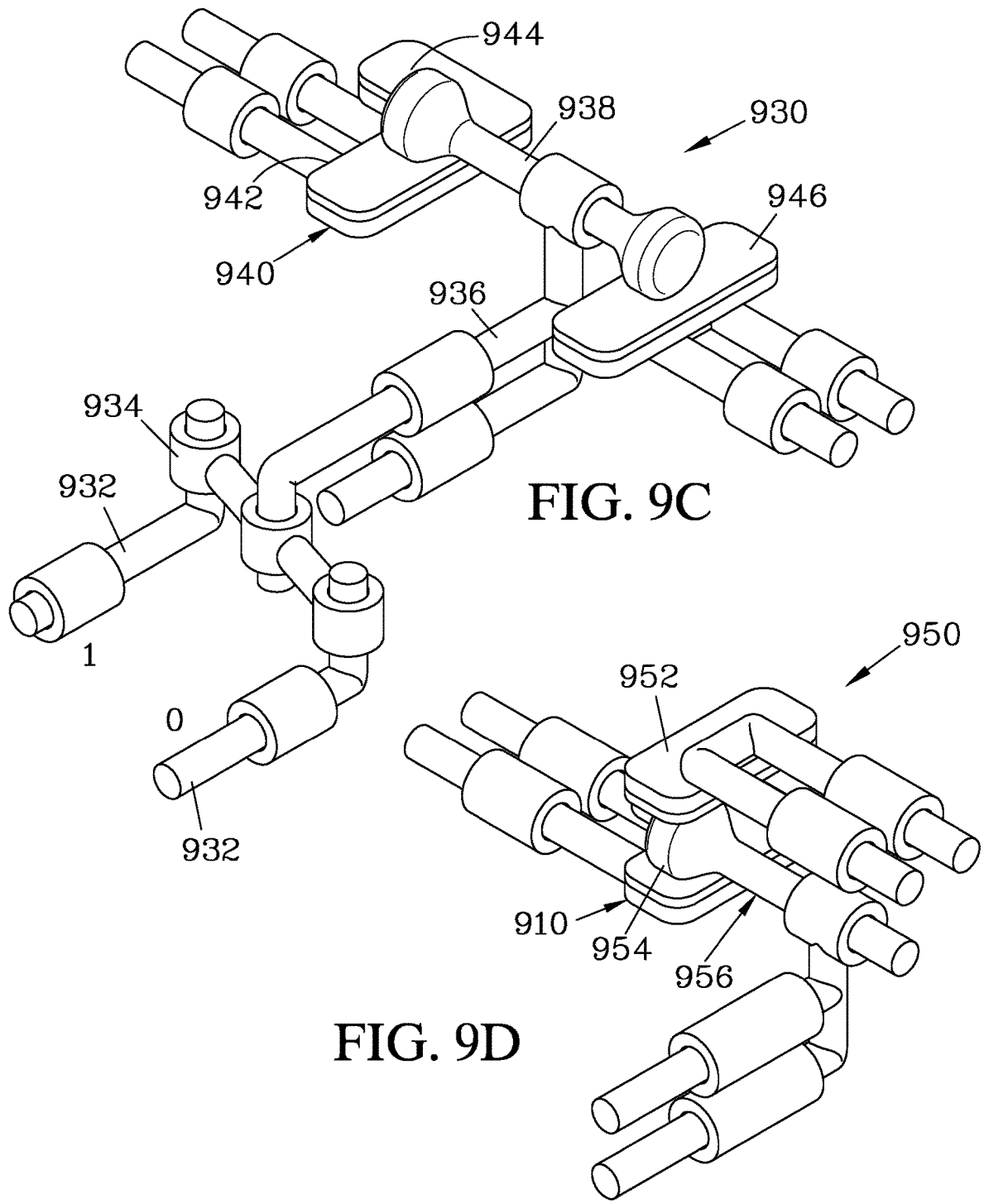

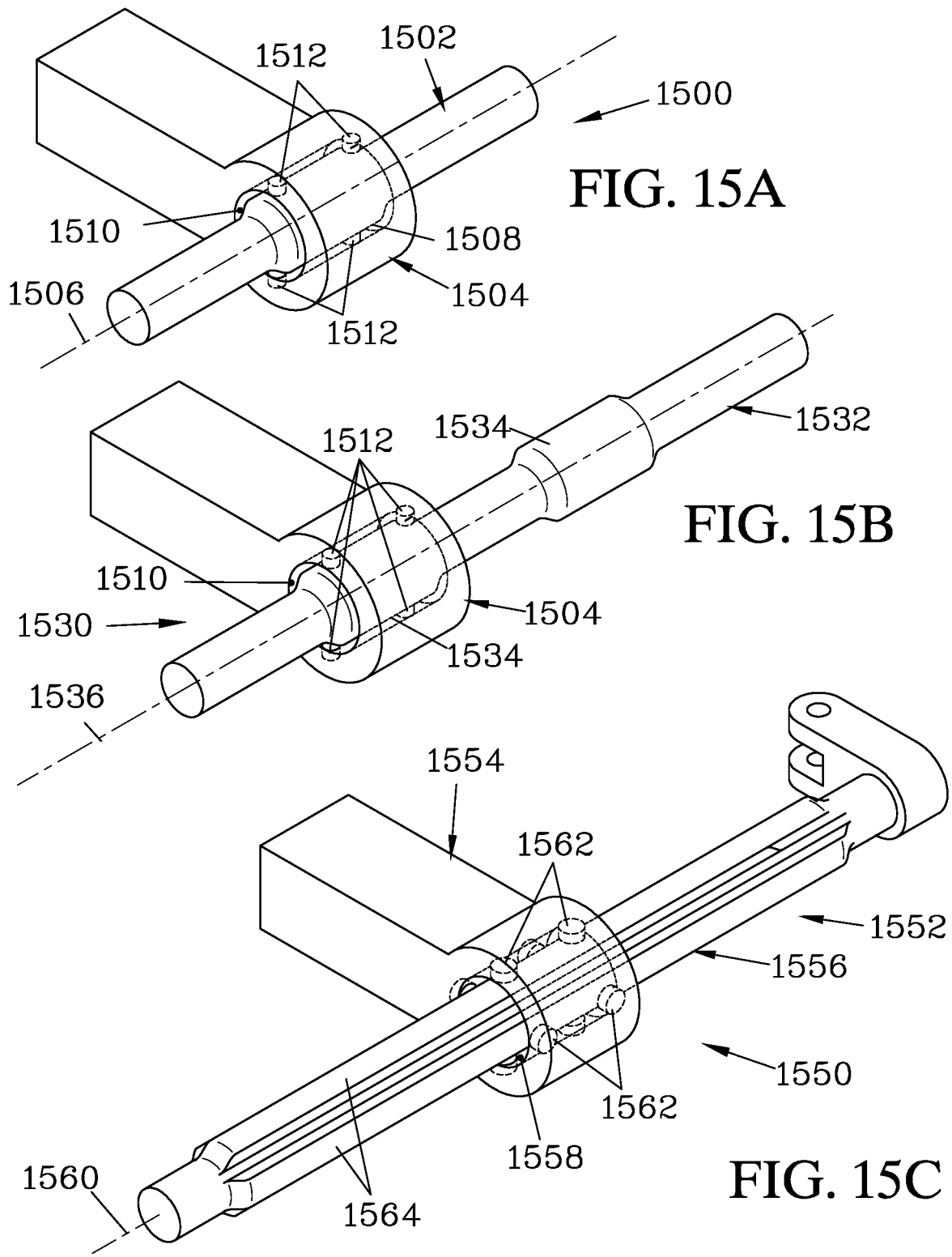

MANAGING NON-CONTACT FORCES IN MECHANISMS

TECHNICAL FIELD

The present application relates to moving parts subject to non-contact forces, where mechanisms are configured to avoid problems associated with overcoming such forces, and/or to employ such forces to coordinate motion between parts.

BACKGROUND

Van der Waals forces, and similar forces that do not rely on contact such as electrostatic forces and electromagnetic forces, can be characterized as non-bonded or "non-contact forces", abbreviated herein as "NFCs". Electrostatic forces, including London dispersion forces and dipole-dipole forces (collectively referred to herein as van der Waals, or "VDW"), operate over short distances (on the order of Angstroms). For macroscopic parts in mechanisms, these forces are generally inconsequential to the mechanism's operation because gravity, inertia, friction, and other forces dominate. But, for small parts separated by short distances, VDW can be significant. For example, if two parallel carbon nanotubes, anchored at their bases, are separated by a few Angstroms, VDW will cause them bend towards each other and stick together. VDW can not only be strong enough to bend small parts, but can also contribute to drag in moving parts when VDW pulls two surfaces together. In the field of MEMS/NEMS, this may be referred to as "stiction" (from "sticking" and "friction") and can create problems for micro-scale devices.

SUMMARY

The following Summary is provided to aid in understanding the novel and inventive features set forth in the appended claims, and is not intended to provide a complete description of the inventive features; thus, it should be appreciated that the entirety of the disclosure should be considered to properly construe the scope of the claims.

Various mechanisms are disclosed that rely on management of non-contact forces (NCFs) to function properly. Such NCFs can include, but are not limited to, van der Waals attraction, magnetic attraction, and electrostatic attraction. The functioning of a particular mechanism depends on its intended use, and typically relies on the management of NCFs to control and/or limit the motion of one or more components of the mechanism.

A mechanism may have a first part and a second part having an attractive NCF therebetween, where the second part is movable with respect to the first part through a defined range of motion, and these parts are configured relative to each other such that the NCF therebetween does not materially change throughout the defined range of motion. Such a mechanism may be configured to accept data in the form of one or more mechanical inputs that encode values by position, and to output data in the form of one or more mechanical outputs that encode values by position, and where the mechanism is configured such that the position of at least one output is determined by performing a logic operation on at least one of the inputs, the logic operation including at least one operation from the group of combinatorial logic operations, sequential logic operations, and Boolean logic operations. In some such mechanisms, the first part can move between at least an inactive position, in which the second part can move relative to the first part without materially changing the attractive force therebetween, and an active position, where motion of the second part relative to the first part would require overcoming a significant change in the attractive force. The first part may block motion of the second part in at least one direction when the first part in in its active position. In some mechanisms, the first part and the second part are configured with respect to each other such that (at least in an active operational state of the mechanism) movement of the first part requires a corresponding movement of the second part in order to maintain the attractive force between the parts materially unchanged. Some such mechanisms can be set in an inactive operational state, where movement of the first part can be accommodated without requiring movement of the second part in order to maintain the attractive force between the parts materially unchanged. A mechanism may have a driven element (which could be considered as another "input"), and be configured such that the position(s) of the (data) input(s) determine the allowed range of motion within the mechanism to determine whether or not displacement of the driven element can be accommodated without being conveyed to a selected one of the outputs. Such a mechanism having a first part and a second part configured relative to each other such that the NCF therebetween does not materially change throughout the defined range of motion may be able to fit within the volume of a cube measuring 100 μm on a side.

A mechanism may have first and second parts movable with respect to each other and interacting so as to generate a NCF therebetween, wherein these parts are configured with respect to each other such that the NCF between the parts defines the range of allowed motion of the second part with respect to the first part, such allowed motion not materially changing the NCF between the parts. In some such mechanisms, the first part is formed with at least one effective edge, and the range of motion of the second part is defined as the range of motion that does not move the second part relative to the effective edge(s) so as to create a material change in NCF between the first part and the second part. Such an effective edge can be provided by structure residing below a surface that continues beyond the effective edge.

A mechanism may have first and second movable parts, with at least one active surface having at least one effective edge being provided on one of these parts and at least one engaging element being provided on the other part; the engaging element(s) interacting with at least one of the active surface(s) so as to generate a NCF therebetween. In such a mechanism, the first and second parts can be configured such that motion of the second part is controlled by the motion of the first part, wherein the second part moves so as to minimize changes in the NCF due to the engaging element(s) moving relative to the effective edge(s). Alternatively, such a mechanism can have a driven element that acts to move the second part, where the first and second parts are configured such that motion of the second part resulting from motion of the driven element is controlled by the position of the first part, and wherein the second part moves so as to minimize changes in the NCF due to the engaging element(s) moving relative to the effective edge(s). In either of such mechanisms, the mechanism may be configured such that the second part moves so as avoid material changes in the NCF between the second part and the first part, or may be configured such that the second part moves so as to result in a less stiff change in the NCF between the second part and the first part than would result from the second part not moving. In some mechanisms, the mechanism can be selectively configured in an active operational state, where the second part moves responsive to motion of the engaging element(s) relative to the effective edge(s), and in an inactive operational state, where motion of the engaging element(s) can be accommodated without creating a material change in NCFs therebetween that would require motion of the second part. A mechanism may have the first part and/or the second part positioned by at least one input; in such cases, motion of the second part responsive to motion of the engaging element(s) relative to the effective edge(s) could be determined by a Boolean function performed on the positions of more than one input, and such mechanisms could provide the function of a logic gate selected from the group of NOR, NAND, and XOR gates. In cases where the mechanism is driven by a mechanical clock signal, it may be configured such that the position of at least one of the first element and the second element is stored between cycles of the clock signal.

A mechanism may have first and second inputs and at least one output, and be configured such that the positions of the inputs define a resulting position of the output(s) which results from the least resistance to change in NCFs between components of the mechanism responsive to any changes in the positions of the inputs. In some such mechanisms, the first input is positioned prior to positioning the second input; such a mechanism may have a control element (or multiple control elements) that selectively transmits motion of the second input to the output element(s) via NCF, where the mechanism is configured such that the position of the first input determines, at least in part, whether or not the control element(s) transmit motion of the second input. Such a mechanism may be configured such that the control element can be attracted to the second input by NCF, and the position of the first input can determine, at least in part, whether the NCF acting to move such control element with the second input is stiffer than NCF resisting such motion. Such a mechanism may have a third input which can determine, in combination with the first input, whether or not the NCF acting to move at least one of the control element(s) with the second input are stiffer than NCF resisting such motion. In some mechanisms, the position(s) of the input(s) determines whether or not motion of the second input can be accommodated without moving the output(s) in order to minimize changes in NCFs.

Because the use of NCFs can allow parts to interact without mechanical connections, mechanisms can often be constructed with relatively few parts. The resulting mechanisms, when fabricated on a microscale, should be able to fit within a volume no greater than 0.001 mm3 (the volume of a cube measuring 100 µm on a side), and some such devices are expected to require an actuation force of no greater than 1 µN. Smaller size mechanisms could be fabricated to fit within the volume of a 10 µm or 1 µm cube, with correspondingly lower activation forces, such as 100 nN or 10 nN. Even smaller devices could be made by nano-scale fabrication techniques, and could fit within the volume of a cube 100 nm one a side, and some nano-scale logic mechanisms could be made as small as a 50 nm cube, 25 nm cube, or even 10 nm cube. For many of the mechanisms discussed herein, components such as the recited first and second parts, inputs, and outputs can comprise carbon nanotubes or structures of diamond, lonsdaleite, or diamondoid materials. For nano-scale mechanisms, actuation forces could be 1 nN or less, and molecular dynamics simulations indicate that some mechanisms such as logic gates employing NCFs to coordinate movement of the component should function with actuation forces below 100 pN, or even less than 10 pN.

BRIEF DESCRIPTION OF THE FIGURES

FIG. 4D illustrates another smooth surface, where differing materials provide an effective edge.

FIGS. 4A to 4F illustrate examples of lock mechanisms where an input acts to impede advancement of a driven element in one position, by requiring such motion to overcome attractive forces between the parts, and allows motion without impedance when in another position.

FIGS. 6A-C illustrate a mechanism suitable for nano-scale fabrication, where van der Waals attraction serves as a NCF that blocks translation of a central element if either of the inputs is angularly displaced. FIGS. 6D-F illustrate a larger scale analogous logic mechanism, where magnets provide the NCF.

FIGS. 7A & 7B illustrate a transmission gate that either accommodates or transmits motion, and FIG. 7C illustrates a 3-input NOR gate that can be formed using such gates. FIGS. 7D to 7F illustrate a NAND gate and an XOR gate. FIGS. 7G to 7I illustrate alternative transmission gate configurations that can be employed, where the plate is pivotably mounted to the input. FIG. 7J illustrates extended feet that can be employed to increase the magnitude of force that can be transmitted by the interaction between a pin and a surface bounded by an edge. FIGS. 7K & 7L illustrate a switch gate that employs two opposed transmission gates, and serves to direct a displacement signal to either of two outputs, depending on the input position.

FIGS. 8A and 8B illustrate two examples of transmission gates providing a similar function to that of the gate shown in FIGS. 7H & 7I, and designed to be well-suited for nano-scale fabrication by molecular assembly. The gates shown in FIGS. 8A & 8B can be fabricated using shaped CNTs that slide within tubes formed from CNTs anchored to diamondoid blocks. FIG. 8C illustrates an alternative transmission gate that provides a mechanical gain in the motion of an output relative to motion of a driven element.

FIGS. 9A to 9D illustrate mechanisms with shaped plates attached to the driven element and the output, and where a connector that engages the plates is positioned by one or more inputs.

FIGS. 11A and 11B illustrate a cam-like linkage where a first part has a plate that forces the motion of a second part when the first part is moved, such motion keeping the mechanism in the lowest energy position of the second part relative to the first part. FIG. 11C illustrates a conventional mechanism employing a pin and slot to provide a similar direction of motion between parts. FIGS. 11D to 11G illustrate a mechanical data storage and reader mechanism. A data ribbon encodes bits, and perpendicular readers read those bits. Bit reading causes movement similar to that of the parts shown in FIGS. 11A & 11B, with the position of the data ribbon after a bit reader is actuated determining the value of the bit associated with that reader. FIG. 11H illustrates a similar mechanism that has two data ribbons to provide two bit values for each reader.

FIG. 13A illustrates a rotational motor that employs a camming scheme to cause a part with a helical thread to rotate in response to translation of a driven part. FIGS. 13B to 13D illustrate two examples of mechanisms to transfer rotary motion from a single input to one of multiple outputs. FIG. 13E illustrates one example of a belt drive that employs corresponding edges on pulleys and a belt to transfer rotational motion from one pulley to the other.

FIGS. 15A-15C illustrate guides that employ NCF to limit free motion between an inner part and an outer part. In FIGS. 15A & 15B, axial motion is limited between the parts while allowing them to rotate freely with respect to each other. FIG. 15C illustrates a guide where rotation is impeded while translation is allowed.

DETAILED DESCRIPTION

Figure 1A:
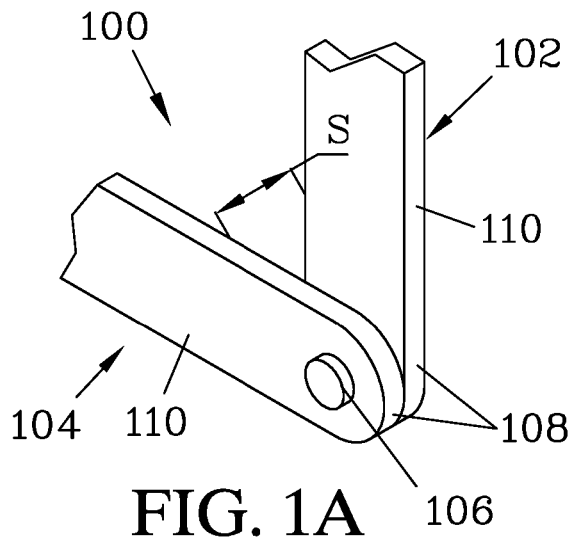
FIGS. 1A and 1B illustrate a prior art hinge, which may be subject to changes in NCFs when the parts move if implemented in nano- or micro-scale mechanisms.
Figure 1B:
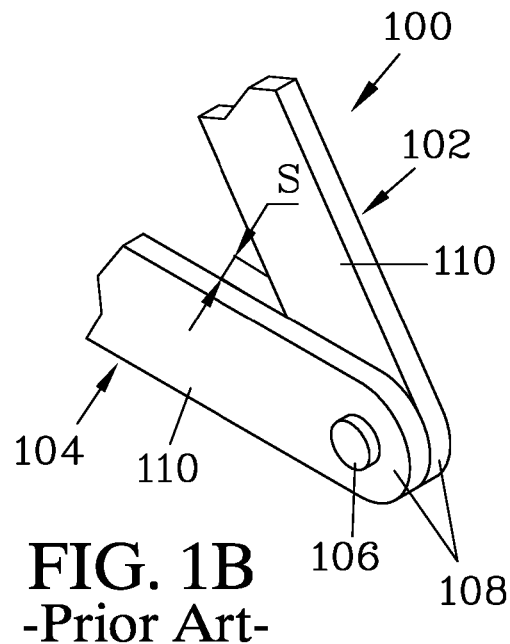

The present application incorporates by reference the disclosure of Applicant's concurrently-filed applications entitled Efficient and Manufacturable Mechanical Computing (application Ser. Nos. 17/802,742 and 18/041,235), in those jurisdictions where such incorporation by reference is appropriate.

Non-bonded or non-contact forces (the terms will be used interchangeably) include forces such as van der Waals (VDW), the London dispersion force, electrostatic forces, electromagnetic forces, and forces produced by the Casimir effect. Such forces are a particular concern in nano-scale and smaller micro-scale mechanisms, where forces such as VDW can create effects not seen in equivalent larger scale mechanisms, and should be taken into consideration to avoid adverse effects such as increased energy requirements to move parts in a desired manner. Similarly, nano-scale and smaller micro-scale mechanisms can take advantage of NCFs to control the interactions of parts using simple structures where the NCF interaction replaces a mechanical structure such as a barrier or linkage that controls the motion of one part relative to another. For mechanical logic devices, NCFs between elements can be employed to cause the elements to interact so as to define the position of an output relative to one or more input positions (including a driven element, if such is employed). While having particular benefit for nano-scale mechanisms, NCFs that operate a larger scales, such as magnetic attraction or electrostatic attraction, can be employed, and may have particular benefit in modeling the actions of nano-scale mechanisms for purposes of education, research, development, and analysis. Similarly, magnetic and/or electrostatic forces may be usable in nano-scale devices; however, in many cases VDW attraction will still need to be taken into account to assure the proper functioning of a mechanism. NCF and VDW as used herein with respect to particular principles and/or examples should be considered as interchangeable in most cases.

It should be noted that "non-contact" does not imply that there is no part-to-part contact. There may or may not be such contact. Rather, "non-contact" refers to the forces used to implement the desired behavior of the mechanism. For example, two parts may be in contact with each other, and slide over each other, but, due to their shape and movement paths, NCFs such as VDW or magnetic fields allow the mechanism to produce the desired action. The forces that allow the mechanism to produce the desired action are still non-contact or non-bonded forces, even though the parts in any particular example may be in contact.

In some mechanisms taught herein, parts that move relative to one another are designed to accommodate the desired motion with significantly reduced or eliminated changes in the non-contact forces (NCFs). Reduced changes are particularly valuable in mechanisms subject to frequent motion, where increasing and decreasing the NCFs between parts can significantly increase the energy required to operate a device, such as a computer system, that employs such mechanisms.

In some cases, reduction of change in NCFs can be accomplished by designing the parts with surfaces configured to be coextensive with the range of expected motion; typically, this assures that the motion of one part does not bring it into close proximity to, or beyond, an effective edge (subject to the discussion herein of why the use of edges is convenient, but not always necessary) of an adjacent part to which it is attracted. For example, if a first part has a large flat surface proximate to a second part, as long as their relative motion does not move the second part past the effective edge of the surface of the first part, there should be no material changes in NCF. In some cases, symmetry about an axis of rotation can be exploited. For example, if two parts which are touching or are in close proximity rotate with respect to one another, as long as the proximate portions of at least one of the parts is symmetric with respect to the axis of rotation, the NCF between the parts will not change significantly as the parts rotate.

Note that the effective edge is typically where the effects of the NCF between the parts would cause a change, whether or not at a physical edge. For example, in the case of small parts subject to VDW, the effective edge may actually be several Angstroms inside the physical edge, since VDW generally starts to taper off as the edge is approached. In many cases where van der Waals attraction is the primary NCF of concern, an edge may be taken to encompass a distance of about 1 nm or less from the physical edge. Since VDW tapers off quickly with increasing distance, moving parts which would cause changes in VDW if the parts were closer should be kept at least about 2-3 nm apart from each other. The particular distance considered significant depends on a particular situation, including how much energy expenditure in the form of work to move parts against VDW attraction is acceptable. In another example, a part may have an edge in a substructure underlying a surface that extends beyond such edge, and the NCF of a part on or near the surface with the underlying edge creates an effective edge on the surface, even if the surface continues beyond such effective edge. Typically, an effective edge is a location on one part where moving another part past such location would require work to overcome the existing degree of NCF between the parts. An edge may also occur between regions of different material, when they differ significantly in their attractive force.

In some cases, one or more spacer elements can be interposed between adjacent parts to provide an extended surface to implement one of the techniques described herein. For example, if two parts need to rotate with respect to each other and they are not symmetric around the axis of rotation, one of more symmetric spacer elements could be interposed between the parts (for example, similar to washers on a shaft, but at the molecular scale). Similarly, for translating elements, a spacer extending along the axis of translation could be employed. In such cases, the effectiveness of the spacer depends on it being of sufficient thickness to isolate the NCFs between the moving parts. In some cases, even a spacer that significantly reduces but does not effectively eliminate changes in NCFs as the parts move may be beneficial.

In some cases, fluid (including gasses and liquids) can be used to offset VDW. For example, if two parts are proximate to each other, in a vacuum they would experience an attractive force between them. But, if a fluid is added to the mechanism, the fluid will be attracted to the parts via VDW also. If the fluid is more strongly attracted to the parts than the parts are to each other, the fluid will be pulled into the inter-part space, and fluid pressure will offset VDW. In some cases, the fluid pressure will exceed the inter-part VDW, and actually push the parts away from each other. (Pitaevskii, L. (2010). "On the problem of van der Waals forces in dielectric media." URL: https://arxiv.org/pdf/1011.5591.pdf) This can give the impression of a negative, or repulsive, NCF, although actually VDW is always attractive.

The techniques discussed above for reducing work required to overcome NCF in parts as they move relative to each other can be combined where appropriate. For example, a mechanism may combine parts with surfaces coextensive with at least the range of motion and/or symmetrical with respect to NCFs, to avoid pushing a part beyond an effective edge, spacers to separate parts, and/or use of a fluid to offset VDW attraction between parts or to even push parts away from each other.

Note that in the foregoing examples, NCF is not absent, or even necessarily reduced. In fact, the parts may be in contact, where NCF is strongest for VDW attraction. Parts that are touching are at the bottom of the VDW energy well. But, as long as their relative motions do not try to lift them out of the VDW energy well, no work is being done against VDW. This lack of change in VDW during the movement of a mechanism is referred to herein as "VDW-neutral", and the same concept is applicable to other NCFs. Drag may still be present, but eliminating work done against NCF can result in a substantial energy savings. In many cases, the objective is to design the parts such that any work required to change the NCF is so small as to be immaterial to the proper operation of the mechanism. Such materiality will depend on the intended purpose of the mechanism, and design criteria such as how much energy loss is acceptable. In many cases, "immateriality" of work required is defined as the degree of work that does not significantly impair the intended operation of the mechanism. As one example of a general guideline, NCF energy requirements to move components that are less than about 50% of the overall energy dissipation of such movement (due to friction, drag, etc.) may be considered "immaterial". In some cases, where energy loss is of particular concern, a "material" change in NCF may be considered to be no more than 20%, no more than 10%, or no more than 5% of the energy dissipation by the movement of the components of the mechanism. In some cases, "immaterial" work may be defined by force, and for nano-scale mechanisms "immaterial" force applied to move a part against NCF may be less than 1 nN, less than 100 pN, or less than 10 pN.

The resistance to motion created by forcing a part into close proximity to or beyond an effective edge of an adjacent part (which requires energy to overcome the NCF between the parts) can be employed to control the movement of one part with respect to another.

In some mechanisms taught herein, parts can be designed such that the position of one part can control or constrain the motion of another part via NCF while not creating changes in the NCF therebetween (note that in other mechanisms, the resulting motion of a part may be determined by the least stiff resistance to change in NCF between the parts). This can be considered another aspect of VDW-neutral design. In contrast to mechanisms where movement does not cause changes in NCF due to, for example, symmetry around an axis of rotation, mechanisms employing control may specifically avoid such VDW-neutral design features. Rather than being VDW-neutral due to part shape, when VDW interactions are used for part control and logic, a part can be forced to move (or can be blocked from moving) to maintain VDW neutrality. So, the design may still operate in a VDW-neutral manner, but the method by which it achieves VDW neutrality may be through motion of one or more parts responsive to one or more other parts (which generally keeps the part at the bottom of an energy well), rather than part shape.

For example, a first part can be formed with an active surface (i.e., a surface subject to NCF attraction) bounded by an effective edge. Then, a second part having an engaging element that is attracted to the active surface has its range of motion limited by the edge of the first part, because moving the engaging element beyond the edge would require overcoming at least some of the VDW force (as noted earlier, the "edge" often refers to the region in close proximity to the actual boundary, where the presence of the edge exerts a significant effect on the VDW between the parts). In this manner, the position of the first part can control the position, or limit the range of motion, of the second part (or vice-versa, as such forces go both ways).

For example, in some cases, an edge of the first part may be positioned to block movement of the second part. In some cases, an edge of the first part may be positioned to cause movement of the second part; effectively the second part is dragged along with the first part through the VDW attraction. In some cases, the edge of the first part may be positioned to limit the free motion of the second part. In some such cases, when force is applied to the second part via another mechanism (e.g., a clock signal or input signal, typically applied via the motion of a "driven element") the second part moves if it is free to move. But, if the first part is positioned to constrain the motion of the second part, and the NCFs that would have to be overcome between the first part and the second part are stiffer than the force applied by, e.g., a clock signal or input signal, then the second part will not move. In this way switches and logic circuits can be created. In many cases, the first part is selectively positionable in either an inactive position (where it does not affect motion of the second part) or an active position (where it does affect the motion of the second part). Similarly, many mechanisms can be selectively placed in an active operational state, where NCF interactions between the parts cause motion of one part responsive to motion of another, or in an inactive operational state, where motion of one element can be accommodated without motion of another part. Such mechanisms can also be considered to determine the constraint of free motion of one or more elements, such constraint determining whether the motion of one element can be accommodated without such motion being conveyed to another part. Where movement of a part is responsive to the movement of a driven element, such driven element could be considered as an input, in addition to any other inputs that are moved previously to configure the mechanism.

Mechanisms using such selective transmission or non-transmission of motion can be arranged to provide logic gates, memory structures, and additional components for mechanical or electro-mechanical computing systems, where one or more output values are defined by one or more input values. Higher-level structures such as adders, shift registers, etc. could be formed from logic gates (in a manner analogous to how electronic logic gates can be combined to form higher-level structures), or can be formed more directly using the paradigms taught herein for obtaining one or more output values based on one or more input values by use of NCF interactions to manage the motion of parts based on the positions of other parts.

In some cases, rather than movement versus no movement, a part moves in any case, but it moves differently depending on NCF interactions with other parts. For example, a mechanism similar to a pan balance can have just a "T" shape, with a rotary joint at the intersection of the two crossbars. If the vertical bar of the "T" is pushed up, and one side of the horizontal crossbar is immobilized, the other side will rise as the vertical bar goes up. The immobilization of one side or the other of such a balance mechanism can be done via NCF interactions. If the left side is held in place via NCF, the right side rises as the "T" is pushed up, and vice versa. This simple mechanism can serve as the basis for devices including mechanical logic and data routing. Examples of logic and computing mechanisms using such a "lock and balance" scheme (but implemented through mechanical links and/or cables, rather than via NCF interactions between parts) are taught in U.S. Pat. Nos. 10,481, 866; 10,664,233; 10,949,166; and U.S. Publication 2021/0149630, all incorporated herein by reference in those jurisdictions where such incorporation is appropriate. In a manner similar to cases of motion vs. no motion as discussed above, such control of motion could be employed to build logic structures such as logic gates, memory cells, adders, shift registers, etc., where one or more output values are defined by one or more input values.

Note that when talking about the strength of VDW between two parts, this refers to magnitude of the NCF (potentially averaged over a distance, as context dictates), regardless of the shape of the NCF curve. Strength is important for calculating work, since work=force×distance. "Stiffness" on the other hand, refers to the change in VDW magnitude over distance. In other words, it is the slope of the NCF curve. A large change in VDW over a short distance gives a stiff force. The same change in VDW over a longer distance requires the same amount of work to overcome but is not as stiff. This is an important distinction because, when two forces oppose each other, it is not the strongest, but rather the stiffest, that prevails. In many mechanisms, the motion of a part to minimize change in NCF between the parts of the mechanism is that motion which results in the least stiff change to NCF.

If a part which started at the bottom of (or at least lower in) an energy well is moved partially up the energy well, there will be a restoring force that acts to pull the part back down the well. This behavior, while often avoided herein to avoid mechanisms doing unnecessary work, can be exploited for use as a spring. For example, if carbon nanotubes are nested, NCF tries to draw the nanotubes to a position of maximum overlap; if one of the nanotubes is pulled to a position of less overlap, NCF attraction creates a restoring force. Such springs can be used to provide biases to parts in mechanisms, to provide tension on flexible parts (such as graphene ribbons and tapes), and similar functions. Nested CNTs provide an example of one way to provide constant force spring. However, other mechanisms where a part is forced to move up an energy well could be employed to provide a spring effect. In many of the mechanisms taught herein, limiting the available motion of one or more parts would result in pushing another part so as to force it against an NCF energy well.

While the designs discussed herein have particular utility for avoiding problems stemming from van der Waals in micro- and nano-scale mechanisms, and VDW is often used as the exemplary force, larger scale mechanisms incorporating the same principles, but employing, for example, electromagnetic or electrostatic forces, can be also be useful.

Larger-scale mechanisms have utility at least for design, training, and educational purposes to facilitate a more complete understanding of how such forces can be advantageously handled in micro- and nano-scale mechanisms. Such larger scale mechanisms employing forces such as electrostatic or magnetic force can be beneficial for studying the effects and use of NCFs using mechanisms that can be readily fabricated using conventional techniques and which can be tested and analyzed without requiring complex viewing equipment. Wherever VDW is recited, it is assumed to also cover other forces such as those already mentioned herein, when such forces would be appropriate for a given mechanism.

The examples presented herein often talk about the edges of a part surface. This is because, didactically, this is a clear way to show the limits of motion for adjacent parts. However, forces can vary even in the middle of a uniform plane, if structure that underlies that plane is not uniform, because NCFs typically propagate through solid material. For example, if a diamondoid cube were made with a hole in the center, and a sheet of graphene the same size as the face of the cube were laid on one face of the cube, that face now appears to be a uniform solid, due to the graphene veneer. But it will not act like a uniform solid to nearby parts. The graphene will have higher NCFs in areas where is overlays diamond, and lower forces where it overlays the hole. The same would be true if the part were monolithic diamond without the graphene. For example, consider the case where the hole in the cube does not extend all the way to the surface, but instead stops one unit cell away from the surface. The surface appears uniform. But, under some parts of the surface there is more diamond, while under other parts of the surface there is a void. The VDW will vary accordingly. Such concepts are easily illustrated with magnetic fields. For example, if a magnet is placed under a piece of paper, wood, plastic, etc., and then a magnetic part is placed on top of the sheet, clearly, at least with a magnet of sufficient strength relative to the thickness of the material, the magnetic part is affected by the magnetic field. In fact, the intervening sheet or layer can even be a ferrous metal if the magnet is sufficiently strong. So, physical edges on the exposed surface of a part are typically not necessary to serve as boundaries. Rather, in many cases what is important is that the forces vary as desired, and while edges are a convenient way to accomplish this, other techniques for managing NCFs to provide the desired function can be developed from the teachings herein.

Note that while attractive NCFs are focused upon herein, the principles clearly extend to repulsive forces, such as could be achieved with electromagnetic or electrostatic forces and mimicked with appropriate combinations of gasses or liquids for mechanisms small enough to be subject to significant VDW. The ability of VDW to result in repulsive forces between parts when something other than vacuum separates the parts has been established. For review see: Pitaevskii, L. (2010). "On the problem of van der Waals forces in dielectric media." (URL: https://arxiv.org/pdf/1011.5591.pdf).

FIGS. 1A-1D illustrate one example of how parts can be configured to avoid significant changes in NCF as the parts move. In this case, a prior art hinge 100 shown in FIGS. 1A and 1B has a first part 102 and a second part 104 that are pivotably connected together at a pivot joint 106. Each part (102, 104) has a base portion 108 surrounding the pivot joint 106 and a distal portion 110 spaced apart from the pivot joint 106. Such parts (102, 104) could be components of a mechanical link logic mechanism, such as taught in U.S. Pat. No. 10,481,866 and related patents/applications for providing low-energy computational capability. As the parts (102, 104) pivot with respect to each other, the separation S between the distal portions 110 varies. If the parts (102, 104) are sufficiently small, van der Waals attraction has sufficient magnitude that it can create resistance to movement of the parts (102, 104), such as to pull the distal portions 110 together to return the hinge 100 from the position shown in FIG. 1A to the position shown in FIG. 1B. The energy that must be expended to overcome such resistance when moving the parts (102, 104) relative to each other may obviate some of the advantage of using links and pivot joints to provide computational capability with reduced energy consumption.

Figure 1C:
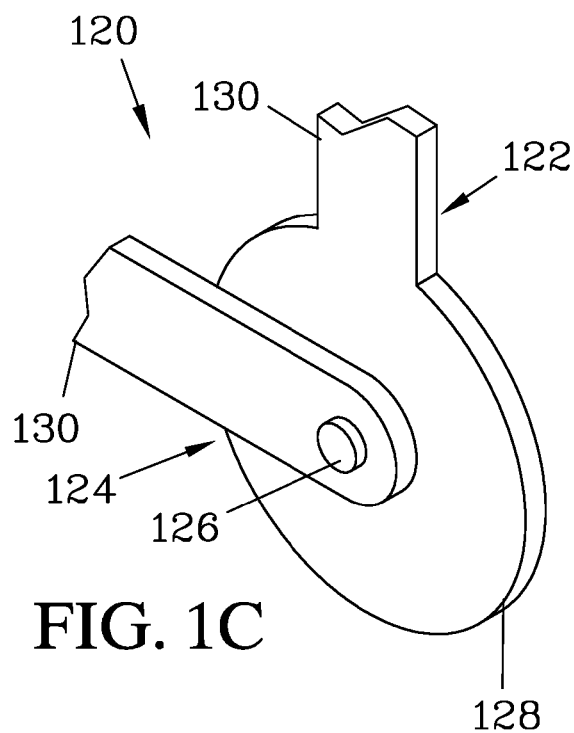
FIGS. 1C and 1D illustrate a hinge which employs a circular extension pad, giving the hinge rotational symmetry near the joint and thereby avoiding significant changes in VDW as the parts move.
Figure 1D:
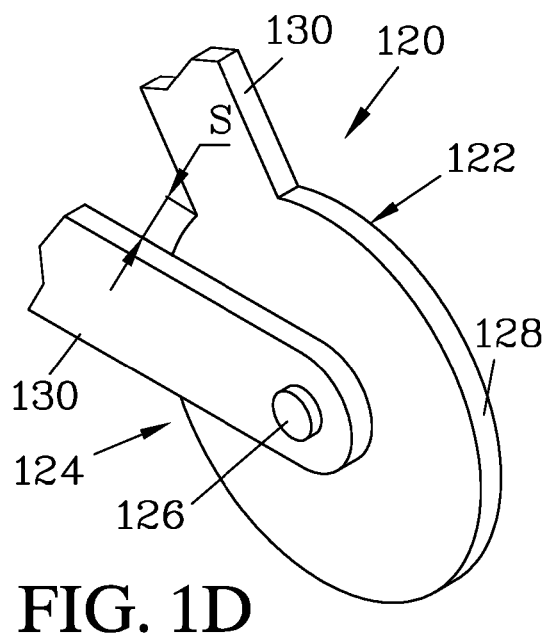

To significantly reduce such changes in NCF, FIGS. 1C and 1D illustrate a hinge 120 that again has a first part 122 and a second part 124 pivotably connected at a pivot joint 126. However, in the hinge 120, a base portion 128 of the part 122 is formed as an extended circular pad 128, which results in distal portions 130 of the parts (122, 124) being spaced far enough away from the pivot joint 126 that the change in van der Waals is reduced to an amount that is immaterial to device operation. Even when the parts are pivoted to a minimum angle with respect each other, as shown in FIG. 1D, the minimum separation S between the distal regions 130 is sufficiently large that VDW attraction is insignificant. The pad 128 provides a symmetrical surface for the part 124 in the vicinity of the pivot joint 126, so, any changes in distance are effectively displaced away from the pivot joint 126, to a location where the separation is great enough that NCF attraction is greatly reduced.

Figure 1E:
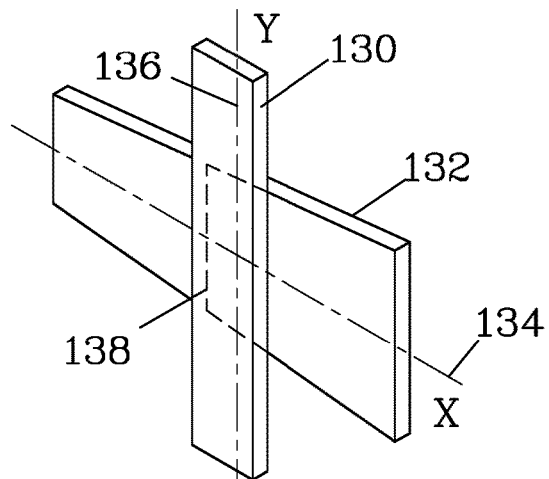
FIGS. 1E to 1J illustrate sliding objects that show situations where translation may result in changes in attractive force and situations where translation does not result in such changes.

FIGS. 1E-1J illustrate examples of parts that can move relative to one another without creating changes in NCF. In FIG. 1E, a first part 130 translates with respect to a second part 132. The first part 130 shown is rectangular, and thus has a continuous profile along either an X-axis 134 or a Y-axis 136. However, the second part 132 is trapezoidal. If the first part 130 moves along the Y-axis 136, its region 138 that overlaps the second part 132 (being either in contact with or in close proximity to the second part 132) does not change shape (as this direction of motion is along an axis of the first part 130 along which it has a constant profile), and the force therebetween the parts (130, 132) does not change (so long as the first part 130 does not move so far that its ends come into close proximity with the second part 132). However, if the first part 130 is moved along the X-axis 134, then the overlapping region 138 does change because the motion is along an axis in which the second part 132 does not have a constant profile. The overlapping region becomes smaller as the first part 130 moves in the −X direction back and to the left, and becoming larger as it moves in the +X direction forward and to the right. In this case, the NCF between the parts (130, 132) changes as the overlapping region 138 changes, and so work must be done to overcome the changing forces. Although sometimes the work done would be negative, this does not solve the problem of wasted energy in, for example, a reciprocating system, unless the parts are coupled to a system that stores and returns the changes in potential energy. Such a system is certainly feasible, such as with a counterbalance (including a counterforce or spring), but increases the complexity of the mechanism.

Figure 1F:
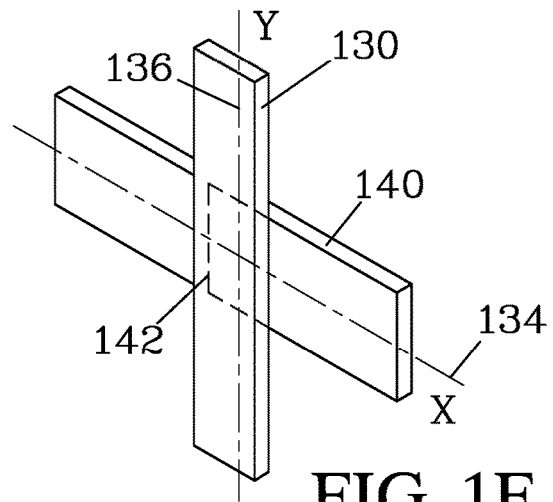
Figure 1G:
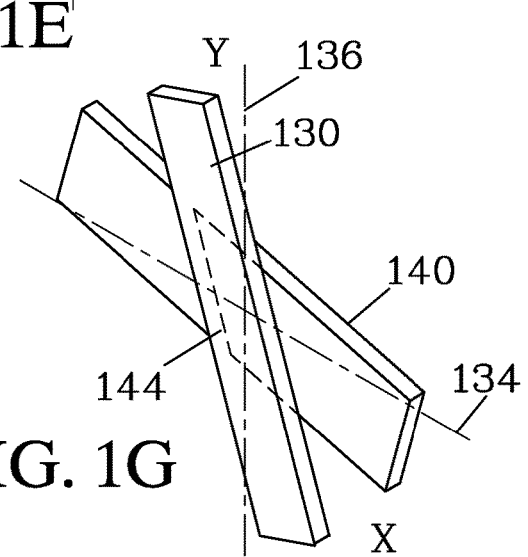

In contrast, FIGS. 1F and 1G illustrate cases where a second part 140 is employed that is also rectangular in profile. In FIG. 1F, the parts (130, 140) are arranged orthogonally, and movement along either the X-axis 134 or the Y-axis 136 simply moves one part (130, 140) relative to the other on an axis along which it has a constant profile, so no change in an overlapping region 142 results. FIG. 1G illustrates a similar case, but where the parts (130, 140) are inclined with respect to each other and to the axes (134, 136). However, even though movement along the axes (134, 136) is not aligned with the parts (130, 140), the change in profile of the parts (130, 140) only changes in position, not in magnitude, and an overlapping region 144 again remains constant as the parts are move, and again NCF remains constant as the parts translate along the axis (134, 136).

Figure 1H:
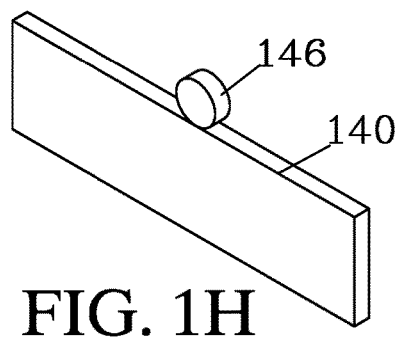

FIG. 1H illustrates a case where a first part 146 moves along the second part 140 with a rolling motion, to illustrate that in addition to translation, rotation which causes translation (and this could be with or without translational slippage), can also be done without material changes in force, assuming that the rolling part is symmetric around its axis of rotation.

Figure 1I:
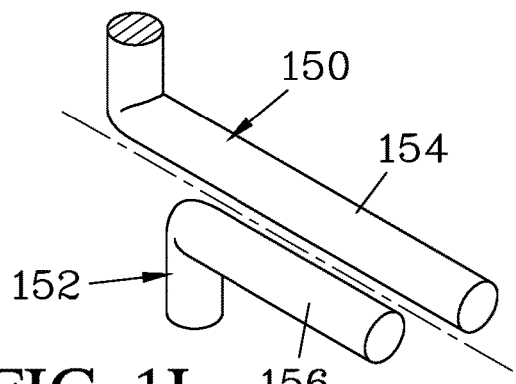
Figure 1J:
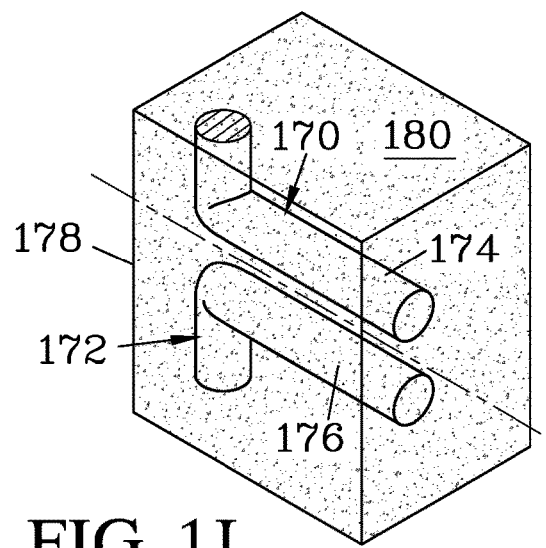

FIG. 1I schematically illustrates a more practical application, a first part 150 and a second part 152 that have legs (154, 156) that extend parallel to each other; such parallel parts could be used as inputs or outputs to a mechanism. The first part leg 154 is significantly longer than the second part leg 156, some moving the parts translationally relative to each other in the direction of the legs (154, 156) does not materially change the NCF if the distance traversed is short enough that the second part leg 156 does not approach an end of the first part leg 154. FIG. 1J illustrates a different approach, where parts 170 and 172 have legs (174, 176) that are equal in length, and motion of either part (170, 172) relative to the other moves the legs (174, 176) to a position of decreased overlap. In a vacuum (as an example—similar effects may occur in many fluid environments), such decreased overlap would require moving the parts (170, 172) against NCF attraction that draws them to a position of maximum overlap. In this case, however, that parts (170, 172) reside in a sealed environment 178 filled with a fluid 180 that has a greater attraction to the parts (170, 172) than the parts (170, 172) have to each other, and fluid pressure between the legs (174, 176) offsets the change of overlap. It should be noted that, while the fluid 170 reduces changes in NCF resulting from change in overlap of the legs (174, 176), it may due so at the expense of friction/drag that results from moving the parts (170, 172) within the fluid. However, the use of a fluid may provide other benefits, such as facilitating heat transfer from the mechanism compared to operating the mechanism in a vacuum.

Figure 2A:
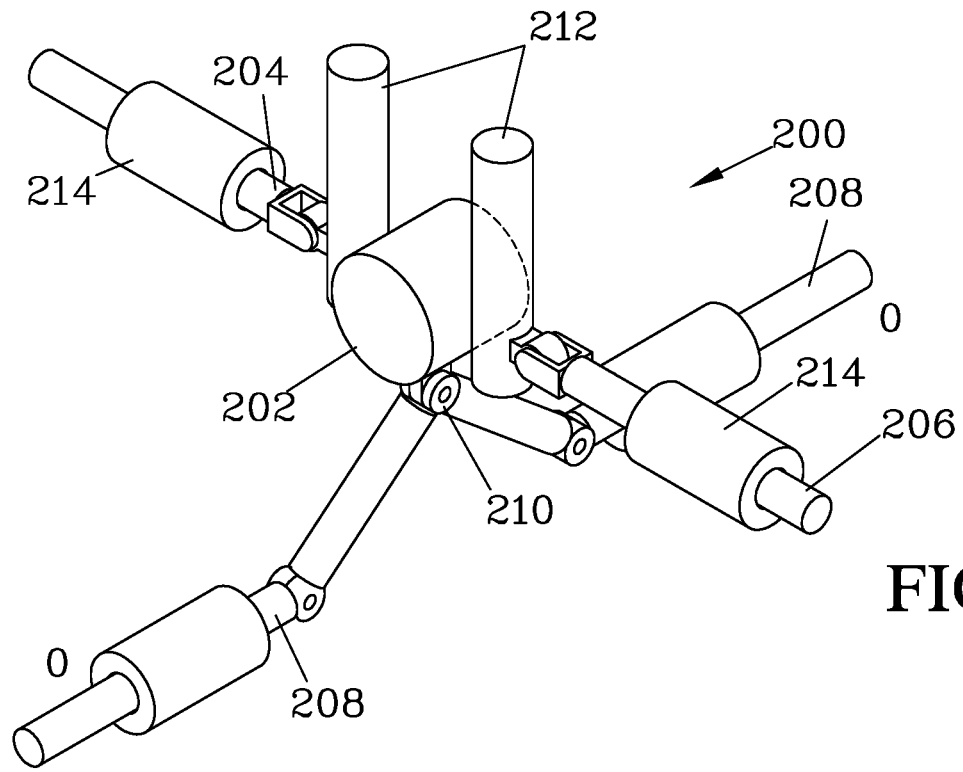
FIGS. 2A and 2B illustrate a mechanism where track elements serve to provide continuous surfaces for engaging a force-transmitting element, avoiding the requirement of overcoming NCFs as the element is moved into or out of alignment with remaining elements.
Figure 2B:
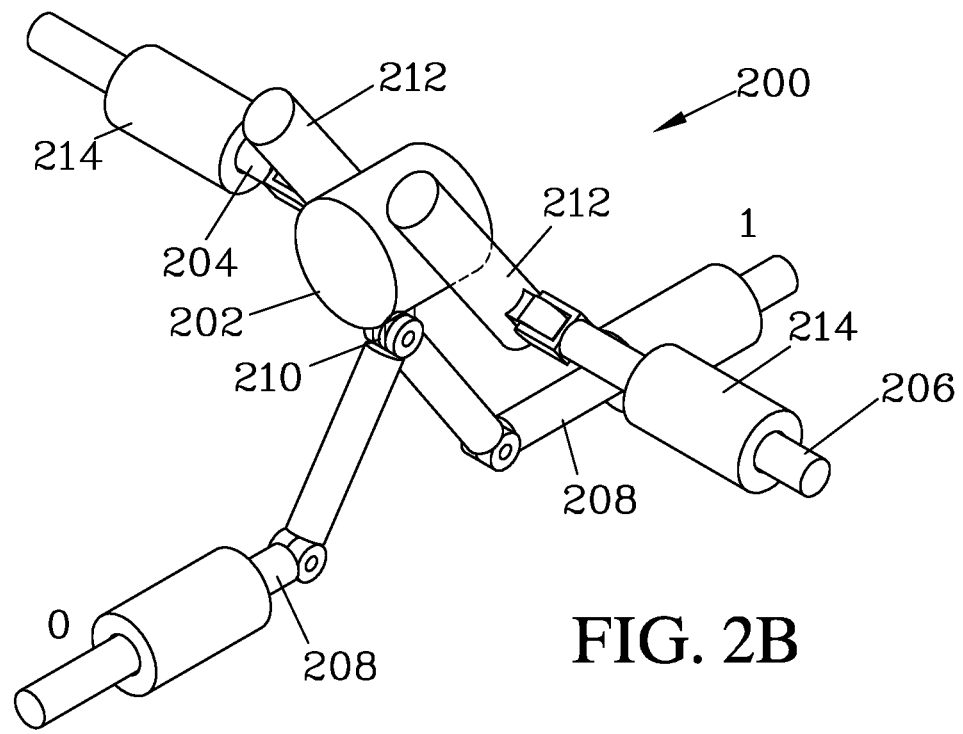

FIGS. 2A and 2B show a mechanism 200 that illustrates one example of the use of extended contact surfaces to avoid requiring material changes in NCF as parts of a mechanism move relative to each other. The mechanism 200 can provide a NOR logic function, while avoiding the need to overcome NCFs in order to displace a force-transmitting element 202 away from a position where it is interposed between a driven element 204 and an output 206 (as shown in FIG. 2A for input values (0, 0)), so as to transmit motion from the driven element 204 to the output 206. The force-transmitting element 202 can be displaced to a number of positions where it is not interposed to transmit motion of the driven element 204 (as shown in FIG. 2B for input values (0, 1); these can be considered motion-accommodating positions, as motion of the driven element 204 can be accommodated without moving the output 206). The position of the force-transmitting element 202 is determined by two inputs 208, each of which acts to move one side of a hinge 210 to which the force-transmitting element 202 is mounted. To avoid changes in NCFs as the force-transmitting element 202 is moved into or out of its motion-transmitting position, the driven element 204 and the output 206 are provided with track elements 212. Rotation of the driven element 204 and the output 206 within guides 214 allows the track elements 212 to extend along the path that the movable object 202 moves when one or both of the inputs 208 is displaced, regardless of which input(s) 208 is moved. Since the track elements 212 extend along the path of motion of the force-transmitting element 202, the NCF between the force-transmitting element 202 and the track elements 212 remains constant. This avoids having to overcome NCF forces to pull the force-transmitting element 202 away from the driven element 204 and the output 206.

Figure 3A:
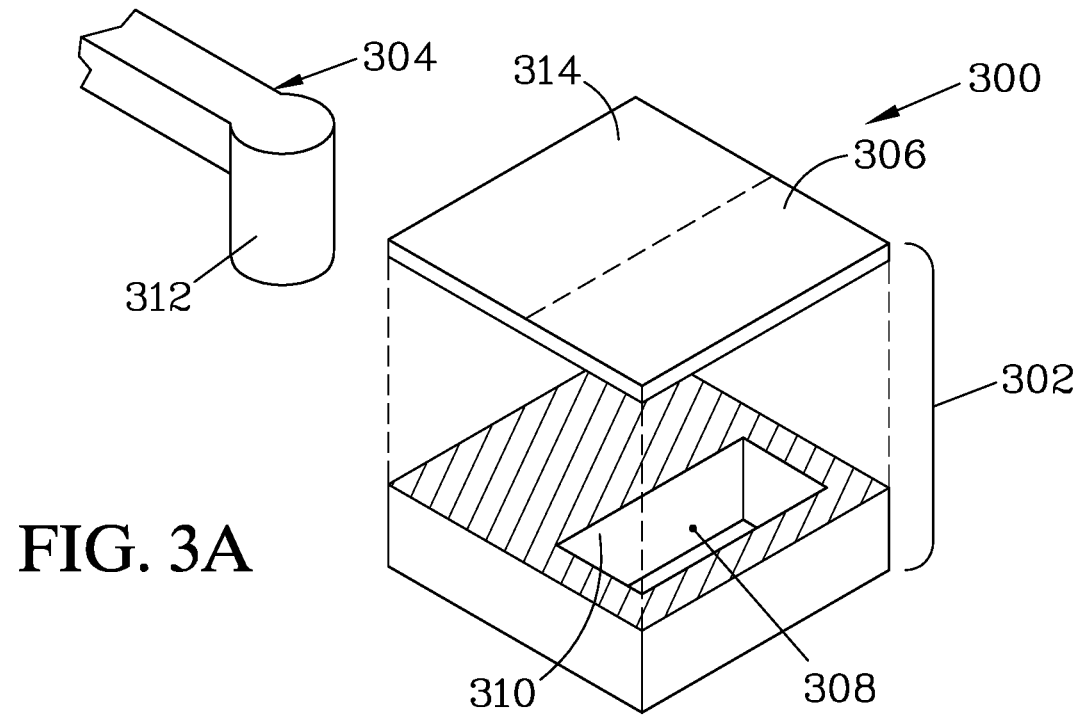
FIGS. 3A to 3C illustrate examples of a smooth surface that, due to discontinuities in the underlying structure, results in changes in NCF as a part is moved across the surface, providing an effective edge.
Figure 3B:
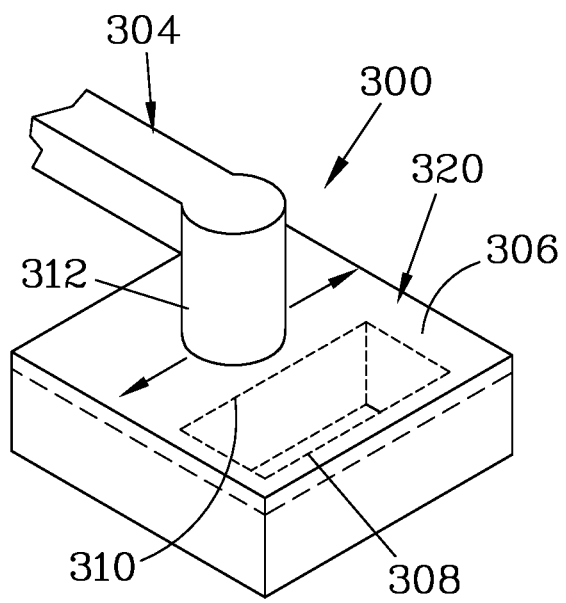
Figure 3C:
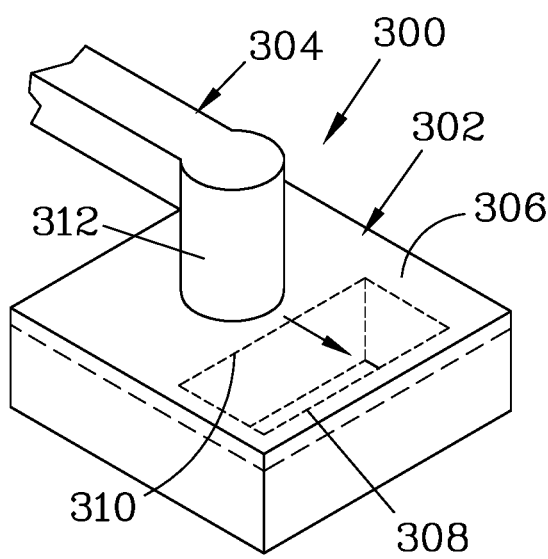

While the drawings of the present disclosure show physical edges of elements for illustrative purposes, NCFs may respond to effective edges of a surface rather than an actual edge, if there is underlying structure that provides an effective edge. For example, FIGS. 3A-3C illustrate a linkage 300 where a first part 302 and a second part 304 interact, and where the first part 302 is formed with a continuous surface 306, but has a discontinuity 308 located slightly below the surface 306, as shown in the partially-exploded view of FIG. 3A. The discontinuity 308 bounded by an edge 310 that results in a reduced NCF compared to the surrounding regions of the first part 302, and provides an effective edge, even though the overlying surface 306 is continuous. The second part 304 has a pin 312 that serves as an engaging element, and which can be moved parallel to the edge 310 of the discontinuity 308, as shown in FIG. 3B, without changing the NCFs, but movement against the edge 310, as shown in FIG. 3C, would require overcoming some of the NCF, and thus may be blocked if the stiffness of such resistance is greater than the motive force trying to push the pin 312 against or beyond the edge 310. FIGS. 3B & 3C illustrate that, when discussing the effect of edges on motion, the position of the edge relative to the direction of the motion determines the effect of the edge.

Figure 3D:
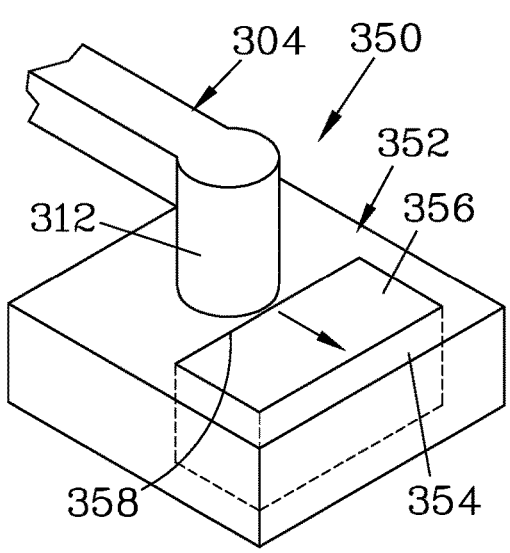

FIG. 3D illustrates a linkage 350 that employs one alternative approach for providing an effective edge; the linkage 350 has a first part 352 made up of a first material 354 with an inset region of a second material 356. These materials (354, 356) are selected to have a significantly different atomic polarizability, and thus a different degree of VDW attraction. For example, the first material 354 could be a block of silicon (atomic polarizability of 37.3±7), and the second material 356 could be a block of carbon (diamond or lonsdaleite) (atomic polarizability of 11.3±2). The second material 356 has a significantly lower atomic polarizability, and exerts a much weaker VDW attraction on the pin 312, and thus pushing the pin 312 across an effective edge 358 formed by the boundary between the materials (354, 356) would require moving it to a position of reduced attraction, and thus requires moving the pin 312 up an energy well.

In some situations, it is beneficial to employ a first part that can be positioned relative to a second part such that it can accommodate motion of the second part without significant changes in NCF when in one position, but blocks or redirects such motion when in a different position. Such mechanisms can be considered to place a constraint on the available free motion of the mechanism, typically responsive to one or more inputs, and where such constraint determines whether motion of an element can be accommodated without causing an effect (such as requiring overcoming an NCF energy well, and thus potentially blocking motion, or conveying motion to one or more additional elements). One application of such conditional movements is in providing locks for mechanical computing applications, where the first part is positioned to either block or not block the movement of a second part. Such locks are found in rod logic as taught by Drexler and cable logic as taught in U.S. Pat. Nos. 10,481,866; 10,664,233; 10,949,166; and U.S. Publication 2021/0149630; however, such locks may require significant energy to overcome VDW attraction to pull the blocking elements apart when implemented in nano-scale applications.

Figure 4A:
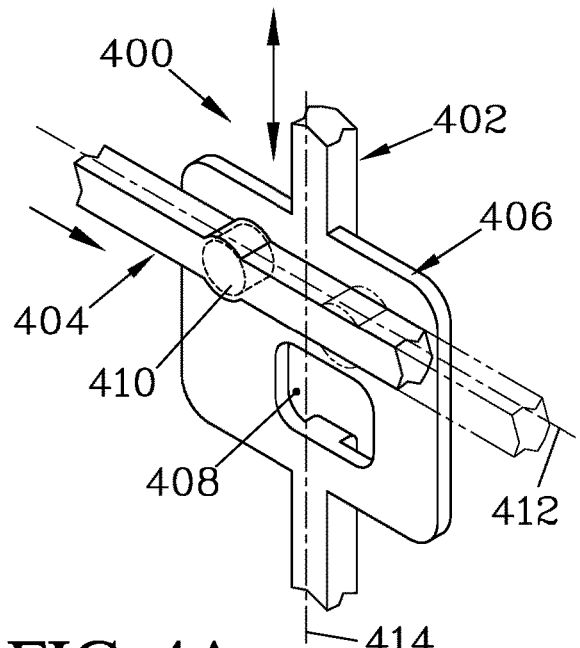
Figure 4B:
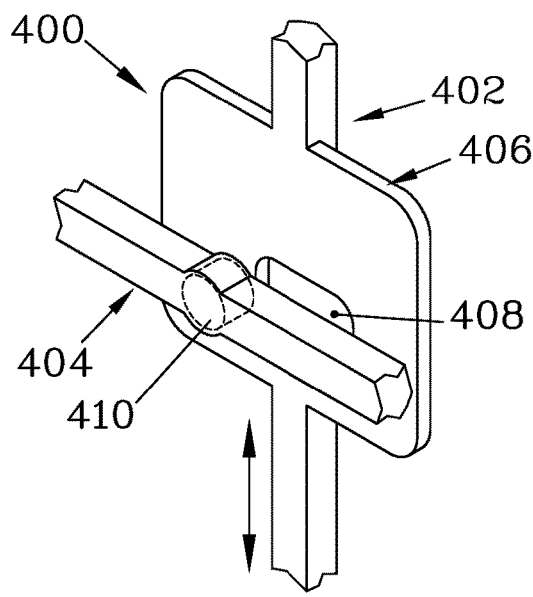

FIGS. 4A and 4B illustrate one example of a mechanism 400 that acts as an NCF lock that retains the elements in contact, reducing wear and energy dissipation, since elements do not need to be pulled apart to unblock the motion. The mechanism 400 shown operates between a first part 402 and a second part 404. The first part 402 is provided with a plate 406 having a cutout 408 (providing an active surface with an effective edge), while the second part 404 is provided with an attractive element 410 that serves as an engaging element (it should be appreciated that the positions of the plate and attractive element could be reversed, with the plate on the second part and the attractive element on the first part). For larger-scale devices, the plate 406 can be formed of a ferromagnetic material and the attractive element 410 can be provided by a magnet. For a molecular-scale lock, the plate 406 and the attractive element 410 could function via magnetism, electrostatic force, VDW, or an any other appropriate NCF as discussed herein. Depending on the relative forces, the attractive element 410 could be in contact with the plate 406 or could merely be closely spaced to it. When the first part 402 is in an unlocked position, as shown in FIG. 4A, it positions the plate 406 relative to the second part 404 to place the attractive element 410 alongside a portion of the plate 406 that does not have the cutout 408. At such position, moving the second part 404 (such as in response to a mechanical clock signal) simply moves the attractive element 410 along the plate, and the NCF therebetween remains constant, so the only resistance to movement of the second part 404 results from friction (in the case where the plate 406 and the attractive element 410 are in contact). This can be considered an "inactive position" of the first part 402 or an "inactive operational state" or "motion-accommodating configuration" of the mechanism 400. In contrast, when the first part 402 is in its locked position (as shown in FIG. 4B), it positions the plate 406 such that movement of the second part 404 would move the attractive element 410 adjacent to the edge formed by the cutout 408. Since there is no attraction to the cutout 408, such movement of the second part 404 would require work to overcome the NCF between the attractive element 410 and the plate 406 to move the attractive element into contact with and past the edge, and thus the first part 402 in this position creates a resistive force against movement of the second part 404. If the driving force applied to the second part 404 is less stiff than the resistive force, the second part 404 is effectively blocked from moving. This can be considered an "active position" of the first part 402 or an "active operational state" or "motion-blocking configuration" of the mechanism 400. The plate 406 can be considered a control element that determines the allowable motion of the second part 404, based on the position of the first part 402 (which could be considered a data input). It should be noted that the function of the parts (402, 404) could be reversed; moving the second part 404 rightward when the first part 402 is in its lowered position shown in FIG. 4A would place the attractive element 410 in a position where it would then block upwards motion of the first part 402, as such movement would move the cutout 408 against the attractive element 404. It is also noteworthy that the cutout 408 has an edge that is perpendicular to the path of travel of the driven element 404 (represented by X axis 412). When the first part 402 is raised, as shown in FIG. 4B, force applied in attempting to move the driven element 404 is directed perpendicular to the edge of the cutout 408, and does not create any vertical component of force that would act to move the first part 402 (which translates along Y-axis 414). In contrast, if the edge of the cutout 408 were inclined, such inclination would tend to act as a ramp or cam to generate a vertical force on the first part 402 (examples of such ramp or camming action resulting from inclined edges are discussed below with regard to FIGS. 11A-12F).

Figure 4C:
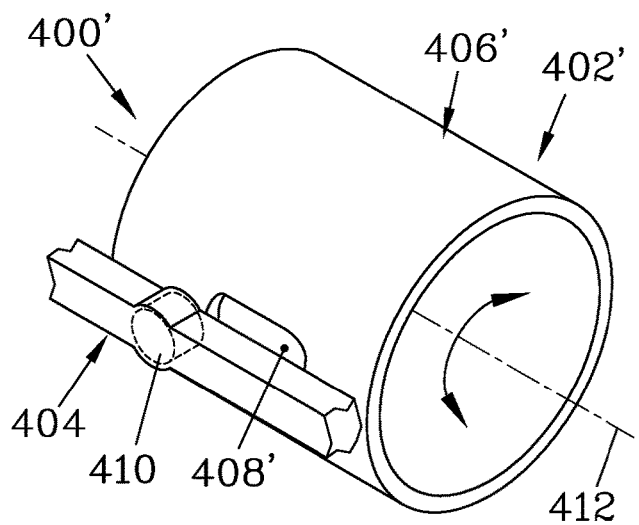

While the lock mechanism 400 employs a planar plate 402, alternative configurations could be employed. One particularly useful shape is to employ cylindrical elements, for example, for nano-scale mechanisms where CNTs, diamond rods, or similar cylindrical elements can be employed. In many cases, mechanisms having planar elements could be modified to employ one or more analogous elements that are rolled about an axis to form cylinders, and mechanisms with cylindrical elements could be modified by flattening one or more cylindrical elements to provide planar elements. Other shapes, such as spherical, prism-shaped, and other variations could also be employed to suit a particular use. As one example of such modification, FIG. 4C illustrates a mechanism 400' that is functionally similar to the mechanism 400, but where a first part 402' is formed with a cylinder 406' having a cutout 408'. The function is essentially similar to that of the mechanism 400, except that the first part 402' rotates about the X-axis 412, rather than translating, to move the cutout 408' relative to the second part 404. FIG. 4D illustrates a mechanism 400", where a first part 402" again has a cylinder 406" with a cutout 408"; however, in this case the cylinder 406" is symmetrical about the Y-axis 414 rather than the X-axis 412, and movement of the first part 402" is rotational about the Y-axis 414 (note that the cylinder could be made larger in diameter than illustrated, to reduce the effect of changing distance between the attractive element 410 and the cylinder 406" as the second part 404 is moved). In this case, force applied to move the second part 404 is applied tangentially to the cylinder 406", and thus acts in the same direction as the rotational movement of the first part 402". In this case, there must be some force applied to the first part 402" to enable it to function as an effective block to motion of the second part 404, and additional structure to limit the motion of the first part 402" and/or the second part 404 may be required to avoid such force acting to move the second part 404 backwards. Such "backwards" forces can accumulate in systems where multiple mechanisms are employed, and thus it is frequently desirable to design mechanisms so as to avoid such forces and/or to block their propagation across multiple mechanisms. Positioning blocking elements such that their available movement is perpendicular to the motion that they are blocking is one common approach to avoiding such forces.

FIG. 4E illustrates a lock mechanism 430 that operates in a similar manner to the lock mechanism 400, but where a first part 432 rotates rather than translates to change to position of a plate 434 mounted thereon, and may again be subject to backwards force on the second part 404. The plate 434 has a cutout 436 positioned to be either not in the path of movement (as shown in phantom lines) or in the path of movement (as shown) of the attractive element 410. However, because the direction of motion of the second part 404 is tangential relative to the rotation of the first part 432, some reaction force applied to the first part 432 is required to block motion of the second part 404, and such force may result in a backwards force applied to the second part 404. One approach to preventing such backwards force in the particular type of mechanism shown is to rearrange the components so that the motion of the second part 404 is no longer tangential. FIG. 4F illustrates a mechanism 430' where a first part 432' having a plate 434' is positioned relative to the second part 404 such that movement of the second part 404 is directed through an axis 438 about which the first part 430' rotates. A cutout 436' is configured such that force applied to the first part 432' by the attractive element 410 does not create any off-center forces that would act to generate torques on the first part 432'.

Figure 4G:
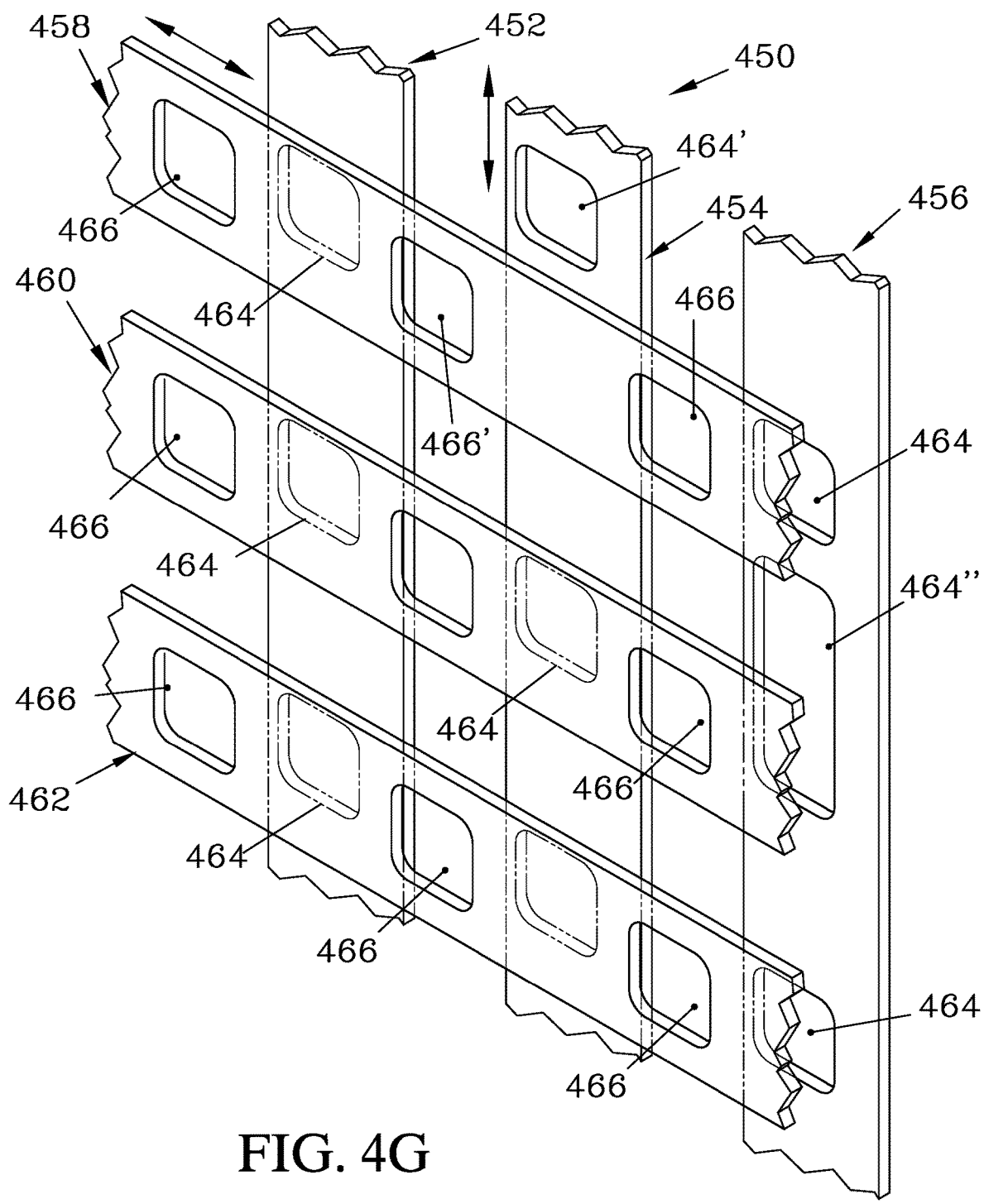
FIG. 4G shows this principal employed in a mechanism using two series of movable tapes.

FIG. 4G shows one example of a more complex structure using the selective blocking function of the locks shown above, a tape mechanism 450. Such a mechanism could be used for logic, memory, and similar applications, functioning similarly to rod logic as taught by Drexler. The tape mechanism 450 has a series of vertical tapes 452, 454, &

456, and a series of horizontal tapes 458, 460, & 462. The vertical tapes (452, 454, 456) are each provided with vertical tape gaps 464, while the of horizontal tapes (458, 460, 462) are provided with horizontal tape gaps 466. For a nanoscale mechanism, the tapes could be formed from graphene.

FIG. 4G shows the vertical tapes (452, 454, 456) in their non-displaced positions, from which one or more could be displaced downwards (the orientation of which series of tapes serves to block the other and the direction in which they are displaced depends on the particular application; the orientation shown is arbitrarily selected for purposes of illustration). When not displaced, the vertical tapes (452, 454, 456) are positioned with their gaps 464 aligned alongside the horizontal tape gaps 466 of the horizontal tapes 460 & 462. Movement of either of the horizontal tapes 460 or 462 acts to move its gaps 466 only over a small thickness of the vertical tapes (452, 454, 456) before the gaps (464, 466) in the tapes are aligned, at which point further motion of the horizontal tape (460, 462) would be blocked by the remaining thickness of the vertical tapes (452, 454, 456). In the particular configuration shown, movement of topmost horizontal tape 458 is blocked when the vertical tape 454 is not displaced, since vertical tape 454 has an offset vertical tape gap 464' that is only aligned alongside the corresponding gap 466' if the tape 454 is displaced downwards. Note that, if the tape 454 were so displaced, its remaining gaps 464 would no longer be aligned with the gaps 466 in the tapes 460 & 462, and thus tape 454 would block movement of those tapes in such case, as moving the gaps 466 over the solid portion of the vertical tape 454 would require overcoming a significant VDW energy barrier. In this manner, the gaps in the vertical and/or horizontal tapes can be configured to provide a desired selection of blocking for different combinations of displacement of particular vertical tapes. Vertical tape 456 shows an alternative gap 464", which is enlarged such that it will not block the horizontal tape 460 in either the displaced or non-displaced position of the vertical tape 456.

Figure 5A:
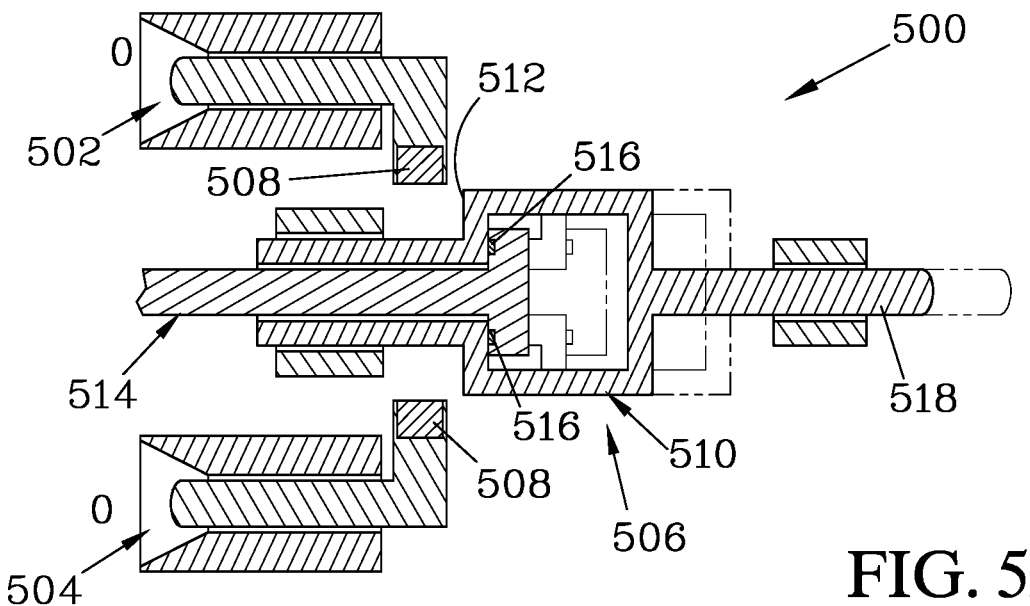
FIGS. 5A to 5D illustrate mechanisms where the impedance of edges serves to selectively retrain an output from moving responsive to a driven element; when two inputs are provided, as shown in these examples, a NOR logic function is provided.
Figure 5B:
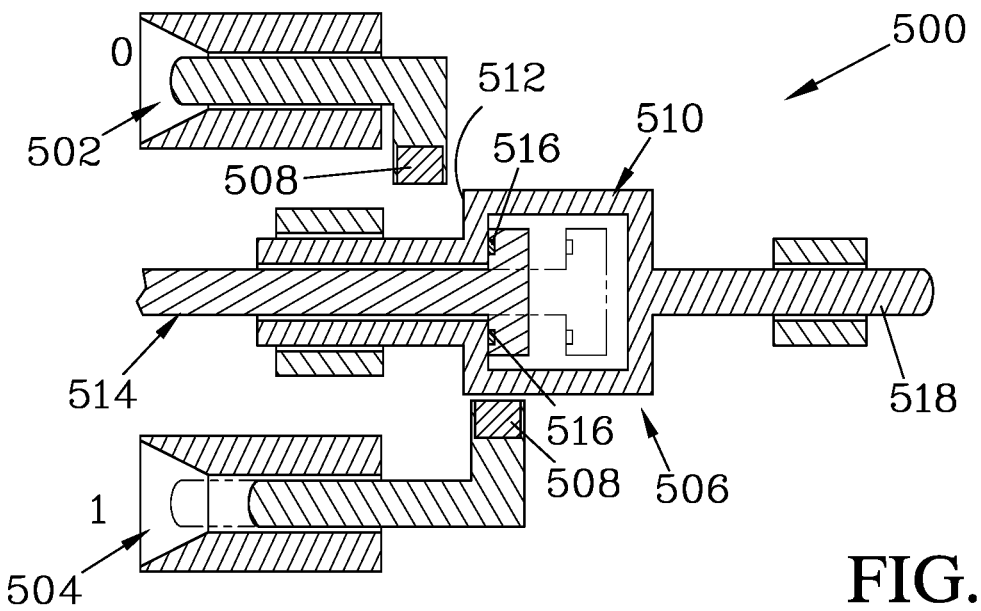
Figure 5C:
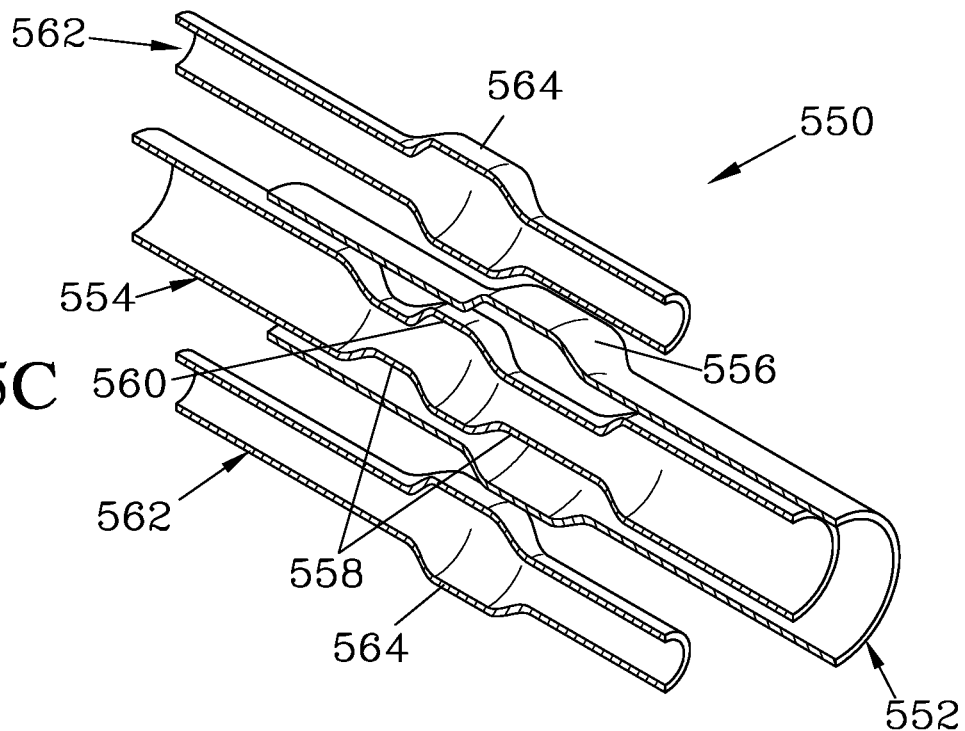
Figure 5D:
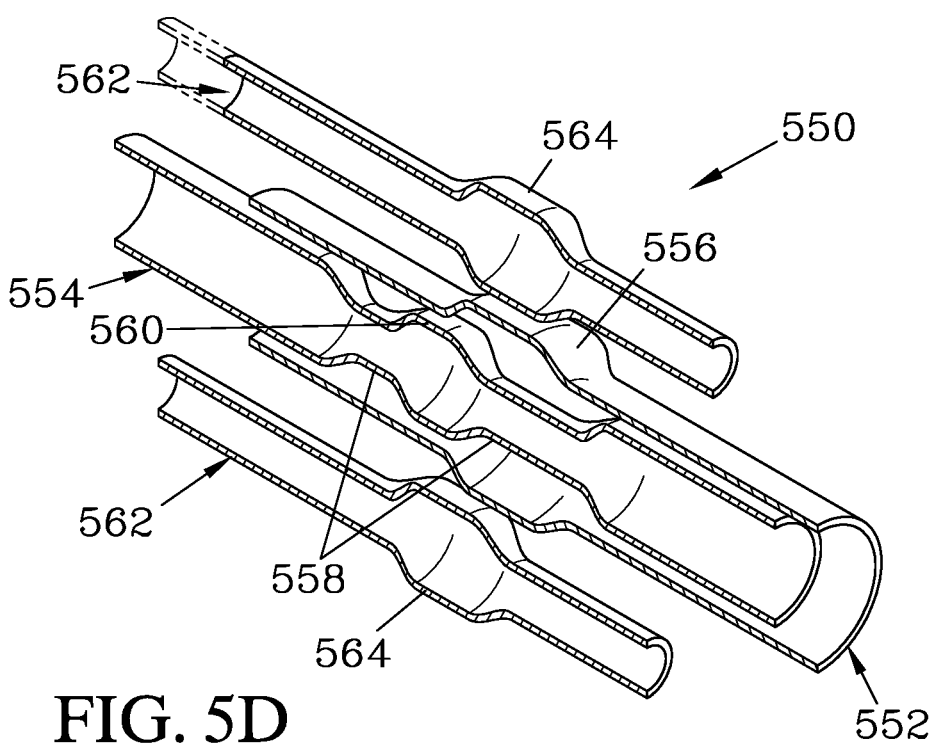

FIGS. 5A and 5B are cross sections that illustrate a NOR gate mechanism 500 that provides one example of a logic mechanism that uses the effect of selectively positing an edge to impede or not impede the relative motion of an element attracted to a surface bounded by the edge. The gate 500 has inputs 502 and 504 that interact with a connection element 506 via NCFs. In the gate 500 illustrated, the attractive force is magnetic; however, for a molecular-scale gate, van der Waals, or any other suitable non-bonded force, could be employed, and for some scales, electrostatic force could be employed (FIGS. 5C & 5D show a nano-scale gate where VDW attraction is employed). The inputs (502, 504) are each provided with a magnet 508 (serving as an engaging element), and the connection element 506 is formed from a magnetically-attractive material such as ferromagnetic metal, having a protrusion 510 (providing an active surface) bounded by an edge 512. When each of the inputs (502, 504) is retracted (typically representing 0), its magnet 508 is located at a distance from the protrusion 510 (as shown in FIG. 5A) such that the NCFs therebetween are immaterial, allowing the protrusion 510 to move relative to the magnet 508 in a direction further away (this can be considered an inactive position for that input). A driven element 514 slides within the connection element 506, and is provided with one or more magnets 516 positioned to be attracted to an interior surface of the protrusion 510 (or other structure on the connection element 506). Unless the connection element 506 encounters resistance to movement, the attraction of the magnet 516 to the connection element 506 causes the connection element 506 to be moved with the driven element 514 (as shown in phantom lines in FIG. 5A) when the driven element 514 is displaced, such as by a mechanical clock signal. An output 518 is attached to the connection element 506, and typically is considered to encode an output value of 0 when undisplaced, and a value of 1 when displaced.

When either or both of the inputs (502, 504) is advanced to an extended ("active") position (typically representing an input value of 1), its magnet 508 is positioned alongside the protrusion 510 and proximate to the edge 512 (as shown in FIG. 5B for the input 504). This position creates an impedance to movement of the connection element 506, as such motion would require overcoming the attractive force between the magnet 508 and the protrusion 510 in order to move the magnet 508 relative to the edge 512 (although, in this case, it would be the edge 512 moving, while the magnet 508 remains in place). To provide the desired logic function, the relative strengths of the magnets 508 and 516 are selected such that the attractive force of either of the magnets 508, when positioned alongside the protrusion 510, is stronger than the collective attraction of the magnets 516 to the connection element 506. When the strengths are so selected, the connection element 506 only moves with the driven element 514 if neither of the inputs (502, 504) is extended (i.e., both inputs are in their inactive positions). If one or both of the inputs (502, 504) is extended (i.e., in its active position), such extension places one of the magnets 508 alongside the protrusion 510, and the greater attractive force restrains the connection element 506 from moving with the driven element 514 (i.e., the impedance to motion is greater than the force attempting to move the connection element 506; the force resisting motion is stiffer than the force compelling motion); these can be considered motion-accommodating positions of the inputs (502, 504), as they determine whether the driven element 514 can be moved without causing motion of the output 518). The connection element 506 can be considered a control element that selectively transmits motion of the driven element 514 (which can be considered another input) to the output 518, based on the positions of the two inputs (502, 504). If the output 518 is fixed to the connection element 506, the gate 500 requires only four moving parts. While the mechanism 500 is configured to provide a 2-input NOR logic function, a similar mechanism could be formed with a single input, to serve as a lock, or with additional inputs (such as radially arranged) to provide a multi-input NOR gate. If the relative strengths of the magnets (508, 516) were selected such that motion of the connection element were only prevented if both inputs (502, 504) were displaced, the response of the output 518 would be a NAND function.

FIGS. 5C and 5D illustrate one example of a molecular-scale NOR gate mechanism 550 that operates similarly to the gate mechanism 500, employing attractive NCF to selectively restrain the motion of an output 552 responsive to a driven element 554; however, in this example, the NCF is provided by van der Waals attraction between the components. In the particular example illustrated, the output 552 is formed from a combination of 15-15 and 20-20 carbon nanotubes, forming a generally tubular shape (15-15 CNTs) with an output enlargement 556 (20-20 CNT), while the driven element 554 is formed from a combination of 5-5 and 10-10 carbon nanotubes, having a generally cylindrical shape (10-10 CNTs) with two driven element constrictions 558 (5-5 CNTs) that bracket and define a driven element enlargement 560. The junctions between the sizes in both components (552, 554) can be formed by inserting pentagons and heptagons into the otherwise hexagonal arrangement of carbon atoms, in the manner known in the art for altering the structures of carbon nanotubes. The VDW attraction of the driven element enlargement 560 to the output 552 creates an effective edge at the output enlargement 556, as movement of the driven element enlargement 560 into the output enlargement 556 requires overcoming the attractive force between the driven element enlargement and the output 552, since the output enlargement 556 is spaced further away from the driven element enlargement 560, and exerts less attractive force. If no resistance to motion of the output 552 is provided, then the output 552 moves with the driven element 554 when it is displaced (such movement typically indicating an output value of 1, and no motion indicating an output value of 0), to avoid the work required to overcome the VDW attraction between the driven element enlargement 560 and the output 552.

Two inputs 562 are provided, which are formed of 5-5 and 10-10 carbon nanotubes similar to the driven element 554. Each input 562 is formed with an input enlargement 564 (10-10 CNTs), and moving either of the inputs 562 (such displacement typically indicating an input value of 1) acts to place the input enlargement 564 of that input 562 alongside the output enlargement 556 (as shown in FIG. 5D for the upper input 562). The enlargements (556, 560, 564) can be configured such that, when one or both of the inputs 562 is positioned with its input enlargement 564 directly opposite the output enlargement 556, the attractive force therebetween creates a stiffer resistance to change than the attractive force between the driven element enlargement 560 and the output 552, such that the greater resistance acts to restrain the output 552 in place (output value 0) when the driven element 554 is moved. When not so restrained, the attraction between the driven element 554 and the output 552 causes the output 552 to move with the driven element 554 when displaced (output value 1). It might be noted that the effect of edge restraint in this example is effective even though there are no distinct edges on any of the elements; the enlargements (556, 560, 564) all provide active surfaces with effective edges, as well as also serving as engaging elements interacting with such active surfaces, depending on the selected frame of reference for defining such features. While a single enlargements are employed in this example, multiple enlargements on the elements with matched spacing could be employed to provide more than one stable position of the driven element relative to the output. While two inputs are employed in this example, a similar device employing a single input could provide a lock function similar to that of the mechanisms (400, 400', 400", 430, 430') shown in FIGS. 4A-4F, or multiple inputs could be employed (such as in a radial arrangement about the output).

Figure 6A:
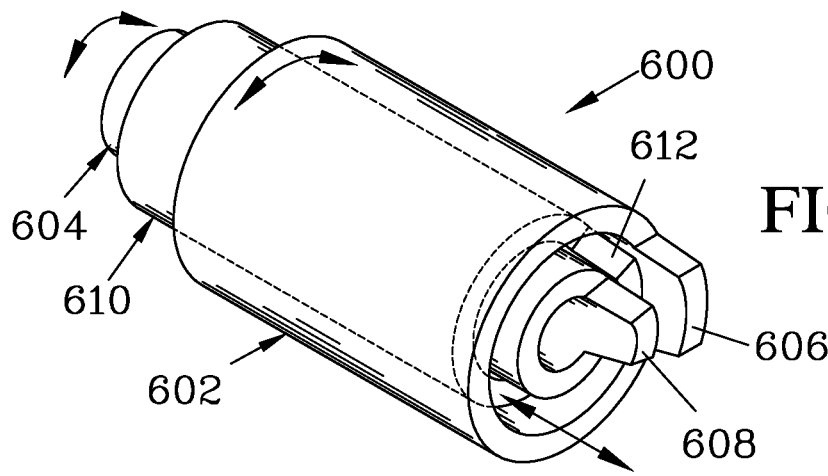
FIGS. 6A-6F illustrate two variations of a mechanism that employs concentric rotating elements to selectively impede or allow translation based on two inputs.
Figure 6B:
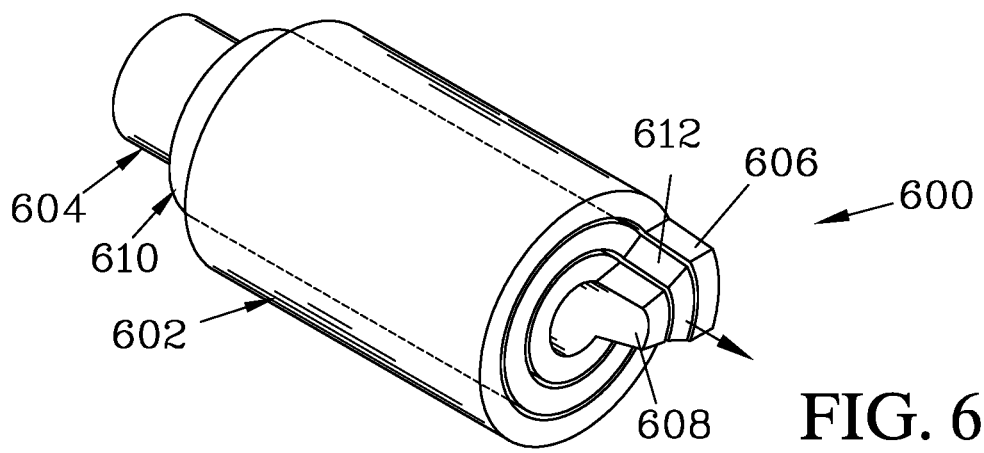
Figure 6C:
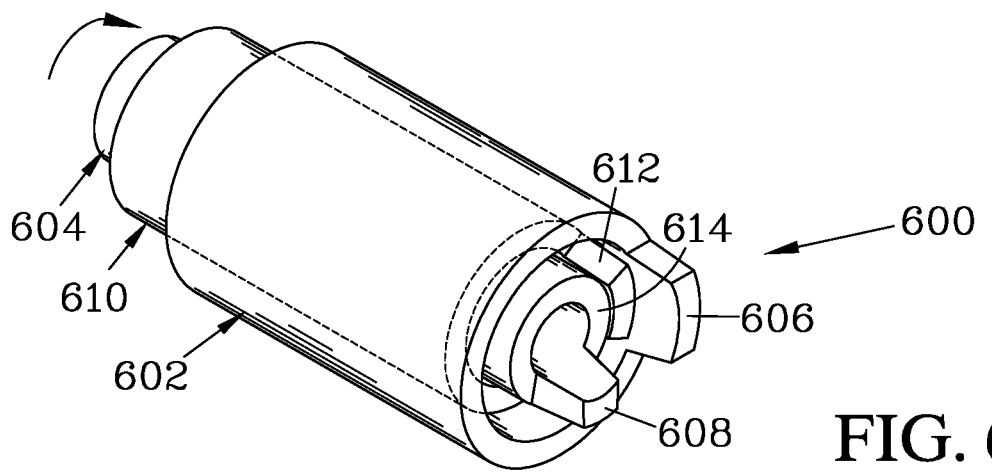

FIGS. 6A-6F show mechanisms where edges can be positioned to either accommodate motion of a driven element or impede such motion, based on alignment or misalignment of the edges with elements attracted thereto. In the examples illustrated, two inputs are provided, each either accommodating or impeding motion of the driven element. FIGS. 6A-C illustrate a logic mechanism 600 with inputs 602 and 604 that are cylindrical, and are positioned by rotation rather than by translation. Each input (602, 604) has an extending input tab 606, 608. A cylindrical driven element 610 having a driven tab 612 is positioned between the inputs (602, 604), each of which is rotatable with respect to the driven element 610. The inputs (602, 604) and the driven element could be formed from carbon nanotubes. The inputs (602, 604) can be angularly positioned such that the input tabs (606, 608) are aligned with the driven tab 612 of the driven element 610, as shown in FIGS. 6A & 6B; this could be designated as an undisplaced or inactive position of each of the inputs (602, 604), representing input values (0, 0). When so positioned, translational displacement of the driven element 610 merely slides the driven tab 612 along the input tabs (606, 608) without encountering any edges, and no change in attractive force need be overcome, allowing the driven element 610 to be freely displaced from an initial position, shown in FIG. 6A, to a displaced position, shown in FIG. 6B. The inputs can be considered as active surfaces, and the driven tab 612 can be considered as an engaging element that interacts with each of such active surfaces. An output could be attached to the driven element 610.

FIG. 6C shows the mechanism 600 when the input 604 has been rotated to misalign its input tab 608 with the driven tab 612, corresponding to input values (0, 1); in this position, translational motion of the driven element 610 would require overcoming the attractive force to push the driven tab 612 beyond an edge 614 of the input 604, and the attractive force resists translational motion of the driven element 610. This can be considered an active position of input tab 608. If the motive force on the driven element 610 is less stiff than this resistance to movement, the driven element 610 is blocked from displacement. A similar blocking effect occurs if the input 602 is displaced to misalign its input tab 606 with the driven tab 612. The driven element 610 only displaces if both inputs (602, 604) are undisplaced. If the undisplaced and displaced positions of the elements (602, 604, 610) are assigned the respective output values of 0 and 1, the response of the driven element 610 when force is applied provides a NOR logic function of the inputs (602, 604); such response could be encoded by an output either attached to or moved by the driven element 610 when displaced. Alternatively, the mechanism 600 could be connected to other elements such that outputs are translatably moved by the inputs (602, 604) if they are displaced by the driven element 610; in such case, the input tabs (606, 608) are each either alignable with the driven tab 612 (thus in an inactive operational state where displacement of the driven element 610 is not transmitted to the output associated with that input tab), or misaligned therewith (thus in an active operational state where displacement of the driven element 610 causes the output associated with the misaligned tab to also be displaced). In effect, the outlines of each of the input tabs (606, 608) provides a similar function to the cylinder 406" and cutout 408" in the lock mechanism 400" shown in FIG. 4C, serving to either accommodate or not accommodate movement of the driven element 610 (which is analogous to the second part 404).

Figure 6D:
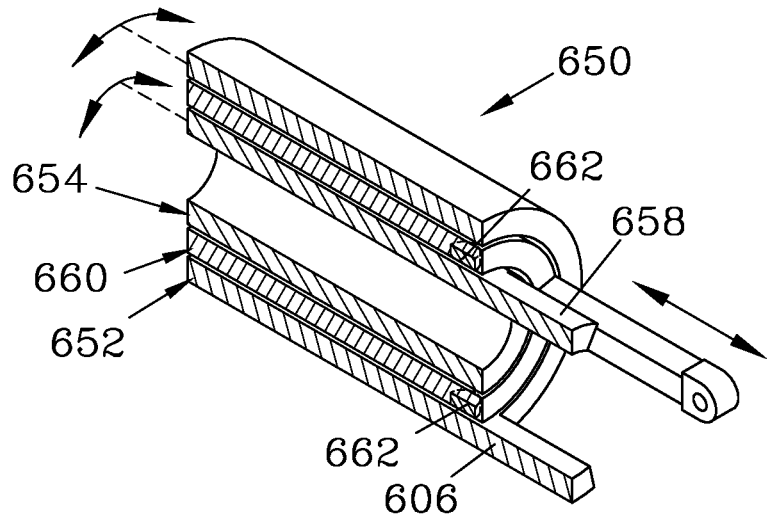
Figure 6E:
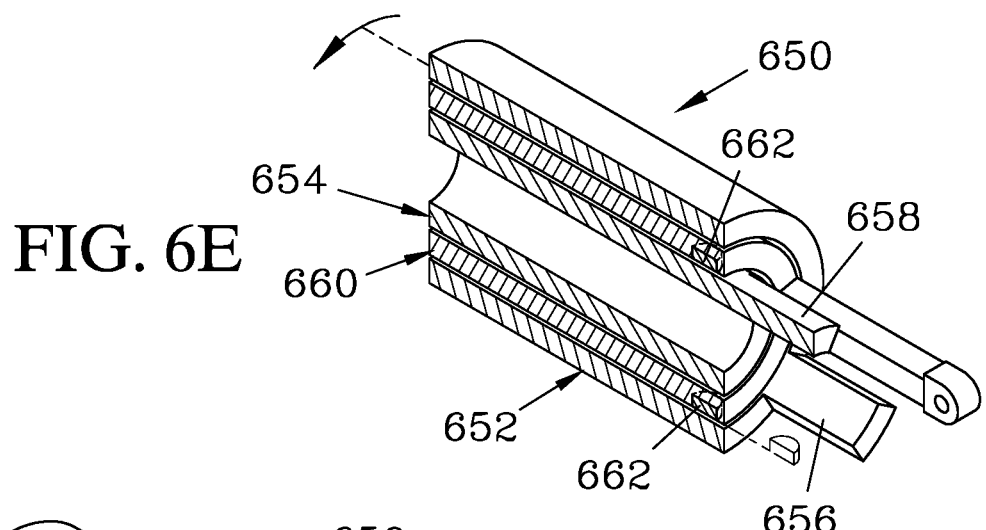
Figure 6F:
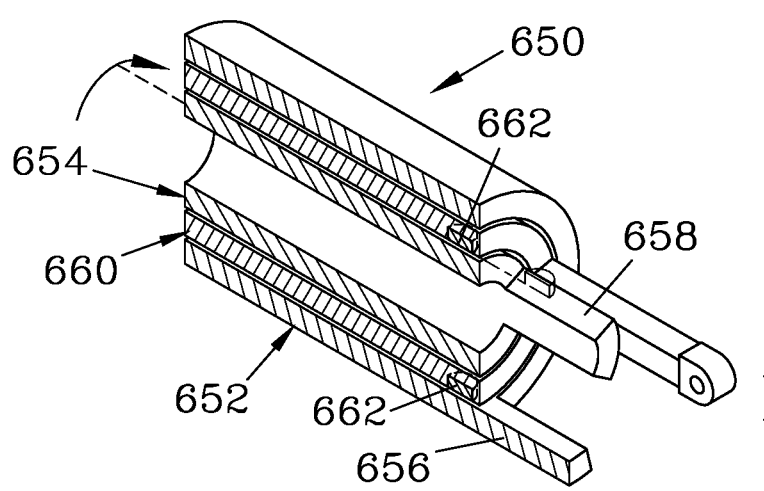

FIGS. 6D-F illustrate a logic mechanism 650 which operates similarly to that shown in FIGS. 6A-C, but which employs magnets and ferromagnetic materials to provide NCFs between the components to provide the selective blocking function in a larger-scale mechanism. The mechanism 650 again has two inputs 652 and 654, each having an extending tab (656, 658) with the angular positions of the tabs (656, 658) being determined by rotation relative to a driven element 660 that resides concentrically between the inputs (652, 654), and which can be translatably displaced with respect thereto. The driven element 660 in this case has a pair of attractive elements 662, each positioned so as to be aligned with one of the tabs (656, 658) when the tabs (656, 658) are in undisplaced positions, as shown in FIG. 6D. In this example, the attractive elements 662 are provided by magnets, and the inputs (652, 654) are formed of a ferromagnetic material. When both inputs (652, 654) are positioned such that the tabs (656, 658) are each aligned with one of the attractive elements 662, as shown in FIG. 6D, displacement of the driven element 660 merely slides the attractive elements 662 along the tabs (656, 658), and no change in attractive force need be overcome. FIGS. 6E and 6F respectively show the case where one of the inputs (652 in FIG. 6E and 654 in FIG. 6F) has been rotated to misalign its tab (656, 658) with the associated attractive element 662, such that translational motion of the driven element 660 would require overcoming the attractive force to push the attractive element 662 beyond the end of one of the inputs (652, 654) and thus the attractive force resists translational motion of the driven element 660.

Figure 7A:
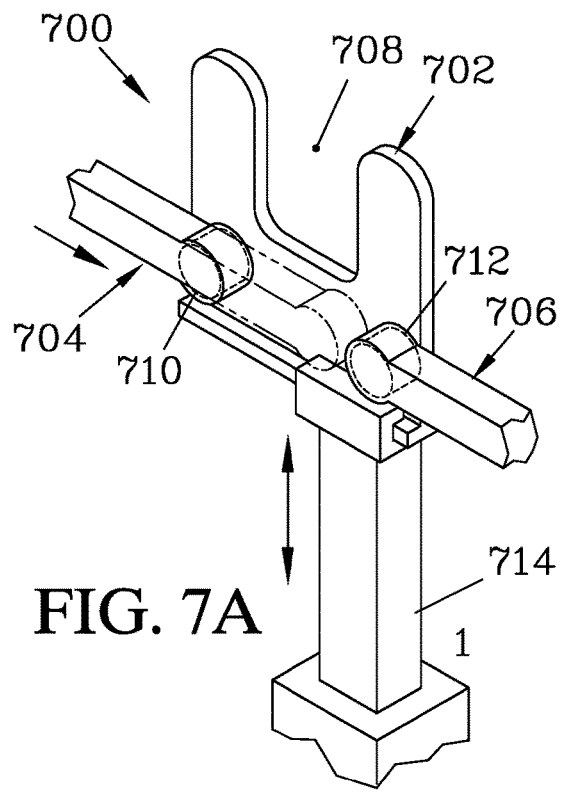
FIGS. 7A-7L illustrate mechanisms where each input determines the position of a control element (formed as a shaped plate) that can either accommodate the motion of a driven element or be forced to move therewith, and which moves an output when it is moved with the driven element.
Figure 7B:
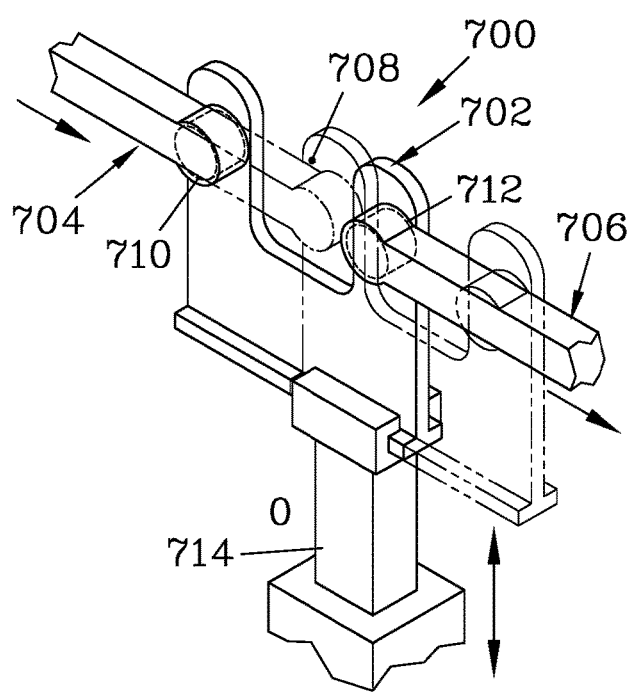

FIGS. 7A and 7B illustrate a transmission gate mechanism 700 where a plate 702 is employed to either transmit or not transmit motion from a driven element 704 to an output 706. The plate 702 has a cutout 708 (thus the plate 702 provides an active surface bounded by effective edges defined by the cutout 708), and the driven element 704 has a driven attractive element 710 that is attracted to the plate 702. The output 706 also has an output attractive element 712 (the attractive elements 710 and 712 thus serving as engaging elements that interact with the active surface provided by the plate 702). Again, the attractive elements (710, 712) could be provided by magnets, when the plate 702 is formed of a ferromagnetic material, or could be other materials in a nano-scale structure where van der Waals attraction is effective (examples are shown in FIGS. 7H & 7I, 8A, and 8B). The plate 702 is translatably mounted to an input 714 that moves perpendicular to the direction of translation, and the position of the input 714 determines whether the cutout 708 is or is not positioned in the path of the driven element 704 (or, more precisely, the driven attractive element 710) when displaced. When the cutout 708 is positioned so as not to intercept the path of the driven element 704 (as shown in FIG. 7A for input value 1), then the driven element 704 can simply extend without any effect, since the NCF between the driven attractive element 710 and the plate 702 does not change as the driven attractive element 710 moves across the plate 702 (thus, the plate 702 can be considered in an inactive position, and the mechanism 700 in an inactive operational state or a motion-accommodating state). When the cutout 708 is positioned to intercept the path of the driven element 704 (as shown in FIG. 7B for input value 0, which can be considered an active position of the plate 702 and an active operational state or motion-transmitting state of the mechanism 700), the NCF causes the driven element 704 to move the plate 702 with it. The cutout 708 is also positioned such that attraction between the output attractive element 712 and the plate 702 serves to move the output 706, since remaining in position would force the output attractive element 712 to overcome the NCF to move over the cutout 708. In this manner, the position of the input 714 controls whether or not the displacement of the driven element 704 is or is not transmitted to the output 706. The plate 702 can be considered as a control element, that selectively transmits motion of the driven element 704 (which could be considered a second input) to the output 706, based on the position of the (first) input 714. It is notable that the action of the plate 702 in either freely accommodating or not accommodating the motion of the driven element 704 is essentially similar to that of the plate 406 of the lock 400 (and similar to the input tabs (606, 608) of the mechanism 600, which could be redesigned to provide a similar function to the gate 700), but since the plate 702 here is movable with respect to the input 714, the motion of the driven element is conveyed to the output 706 rather than being blocked when the plate 702 is in its active position.

Figure 7C:
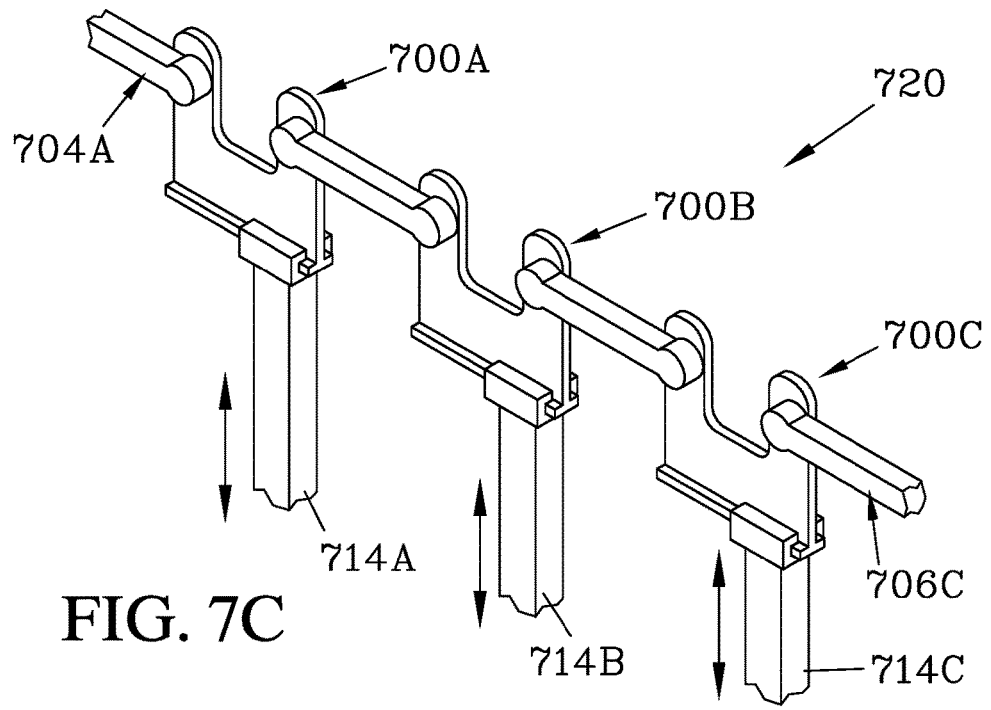

FIG. 7C illustrates a 3-input NOR gate 720 that employs three transmission gates 700A-C connected in series, each with an input 714A-C. As shown in FIG. 7C, all inputs 714A-C are undisplaced (input value 0), and thus a path exists to transmit motion from the driven element 704A to the output 706C. If any of the inputs 714A-C is extended (input value 1), it places its gate (700A-C) in a motion-accommodating state (similar to that shown in FIG. 7A), resulting in a break in the chain of transmission from driven element 704A to output 706C.

Figure 7D:
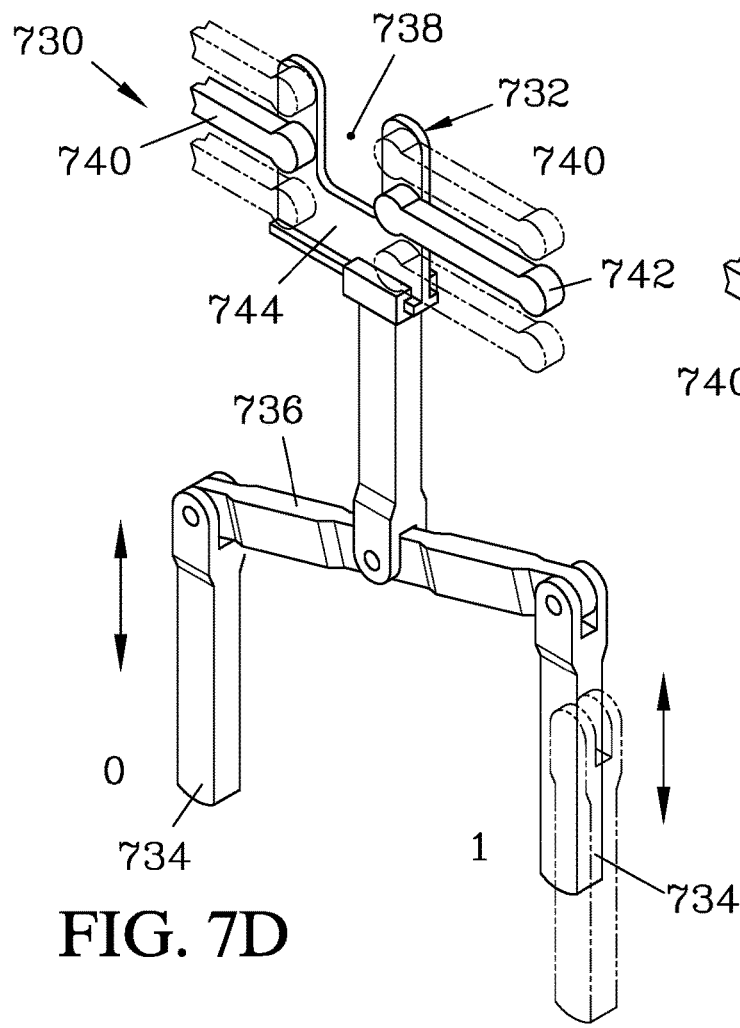
Figure 7E:
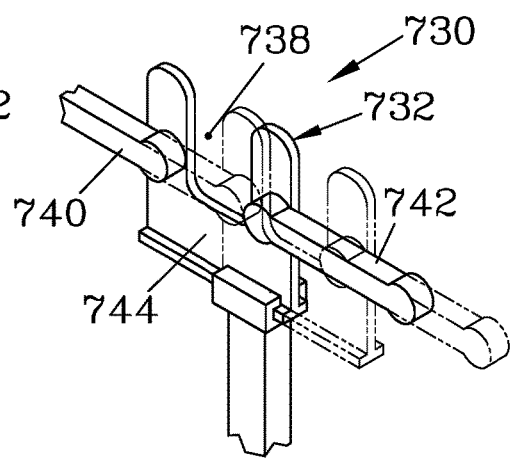

FIGS. 7D & 7E illustrate a NAND gate mechanism 730, which has many features in common with the gate mechanism 700, but which employs a different plate 732, and where the plate 732 is positioned by the combined action of two inputs 734, which are connected to a balance 736. The plate 732 can be positioned at three heights, depending on whether neither, one, or both of the inputs 734 is displaced. The plate 732 has a cutout 738 that is positioned to be interposed between a driven element 740 and an output 742 when the plate 732 is in either a lower position (when the input values are (0,0)) or a middle position as shown (when the input values are either (0, 1) as shown, or (1, 0)). For illustrative purposes, the positions of the driven element 740 and the output 742 are shown relative to the plate 732 in three positions in FIG. 7D, even though it is the plate 732 that moves vertically, while the driven element 740 and the output 742 remain at a constant height. It is only when both input values are 1 that the plate 732 is raised to its upper position, where the cutout 738 is no longer positioned in the path of the driven element 740. Instead, in this upper position the motion of the driven element 740 can be accommodated by a clear path 744 on the plate 732, and the plate 732 does not convey the movement of the driven element 740 to the output 742. The resulting output value responsive to movement of the driven element 740 is 1 for input values (0, 0), (0, 1), and (1, 0), and 0 for input values (1, 1). The plate 732 can be considered to have two active or motion-transmitting positions, and one inactive or motion-accommodating position. When in an active position (such as the middle position shown in FIG. 7E), the plate 732 could be considered as a "first part", which acts to force motion of the output 742 (acting as a "second part") to avoid moving the output 742 into the cutout 738 (and thus changing the NCF attraction) when the plate 732 moves.

Figure 7F:
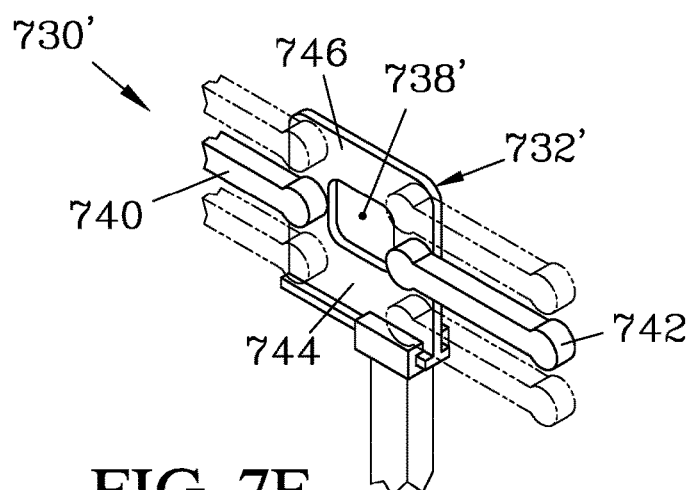

FIG. 7F illustrates an XOR gate mechanism 730' which is similar to the mechanism 730, but which employs a different plate 732'; otherwise, the above remarks apply to the mechanism 730' as well. The plate 732' has a smaller cutout 738', which results in not only the clear path 744, but a second clear path 746 that can accommodate the movement of the driven element 740 when the plate 732' is in its upper position, corresponding to input positions (1, 1). The resulting output value responsive to movement of the driven element 740 is 1 for input values (0, 1), and (1, 0), where the plate 732' is in its middle position (as shown), and 0 for either input values (0, 0), where the plate 732' is in its lower position, or (1, 1), where the plate 732' is in its upper position. In this case, the plate 732' has one active position and two inactive positions.

Figure 7G:
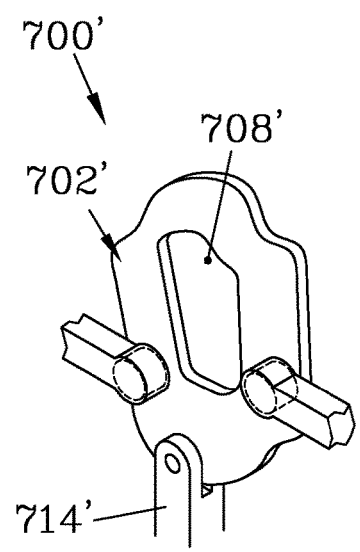

FIG. 7G shows one example of an alternative transmission gate 700', which differs in the configuration of the plate 702', which is configured with a cutout 708' and is shaped to provide more reliable operation when the plate 702' is pivotably mounted to an input 714', rather than translatably mounted thereto.

Figure 7H:
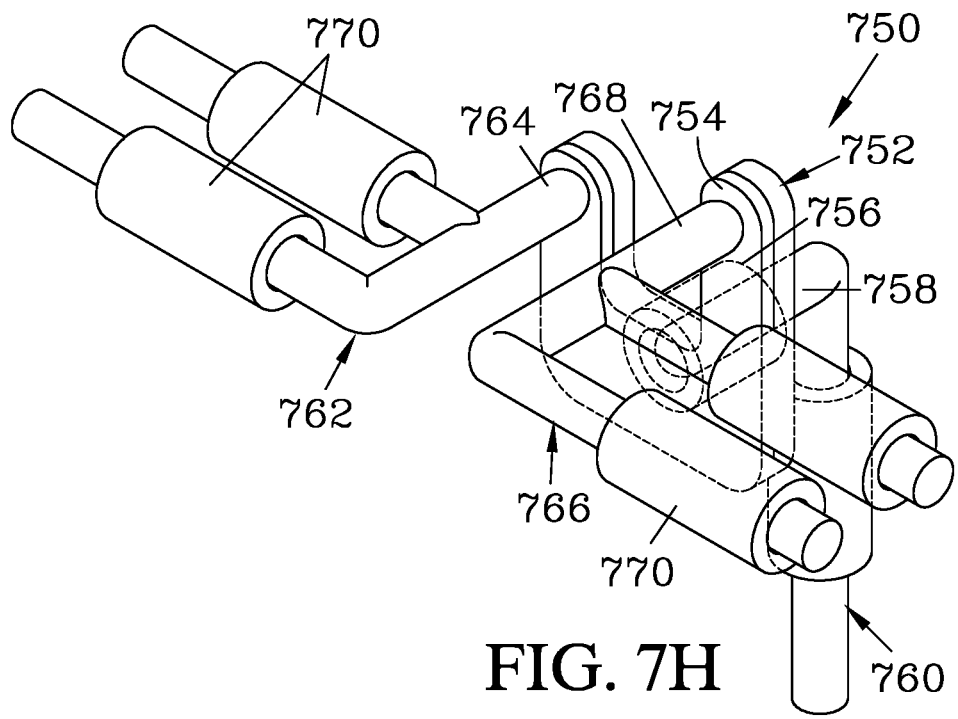
Figure 7I:
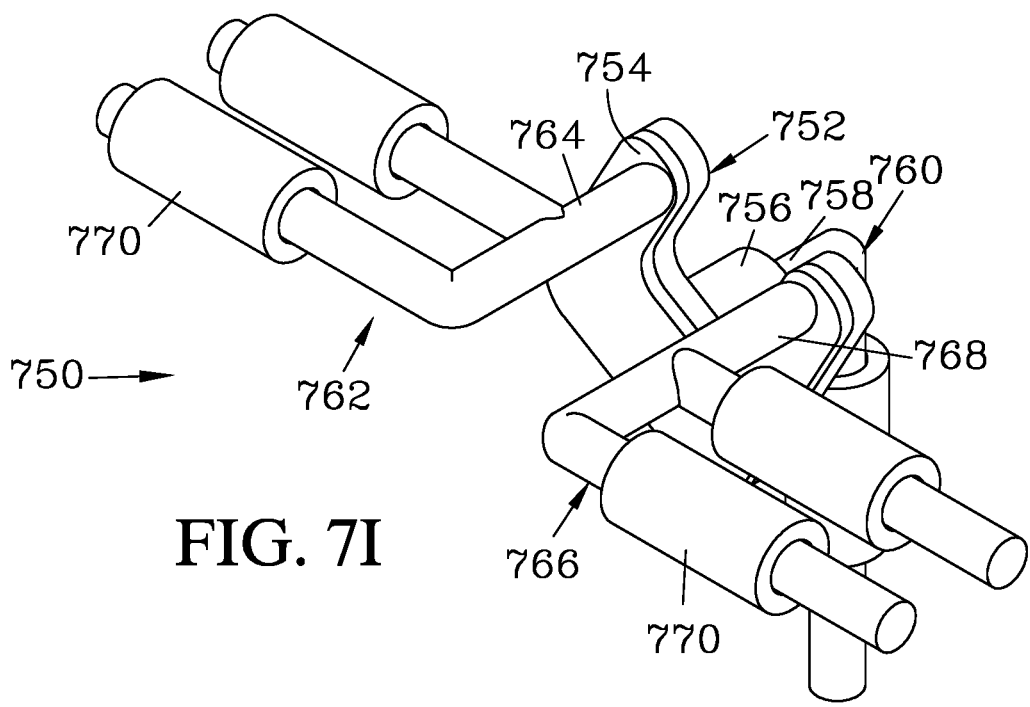

FIGS. 7H & 7I illustrate another example, a transmission gate 750 that is well-suited for nano-scale fabrication, having a shaped plate 752 that can be formed of a diamondoid material and can have a graphene surface 754 thereon to reduce friction, and which has a cylindrical socket 756 (on the opposite side from the graphene surface 754 in this example) that is engaged by an input pin 758 on an input 760 that can be formed from a CNT (as can the socket 756). A driven element 762 having a driven pin 764 and an output 766 having an output pin 768 engage the plate 752, and can be formed from CNTs that engage the plate 752 via van der Waals force (the pins 764 and 768 serve as engaging elements that interact with the active surface provided by the plate 752 and graphene sheet 754). Note that the pins (764, 768) extend so as to separate the remainder of the driven element 762 and the output 766 from the plate 752 a sufficient distance that VDW forces between the plate 752 and these portions of the driven element 762 and the output 766 are small enough to be ignored. For many applications, the graphene surface 754 can be provided by a single-atom thick layer of graphene applied over the shaped plate 752, and held onto the shaped plate 752 by van der Waals attraction. In cases where the gate 750 is to be operated at high speeds and/or high temperatures, it may be desirable to bond the graphene surface 754 to the plate 752; however, leaving the graphene sheet unbonded allows it to shift slightly, allowing the pins (764, 768) to slip around energy wells, rather than being directed over them. The driven element 762 and the output 766 can be directed by guide sleeves 770. To reduce the energy required to move the pins (764, 768) relative to the sleeves 770, the components (762, 766, 770) can be configured such that any non-symmetrical portions (such as the pins (764, 768) do not come within about 2-3 nm of the sleeves 770. Similar spacing should reduce energy requirements in similar mechanisms where guide sleeves are employed; however, such additional spacing does increase the size of the resulting mechanism.

In many of the exemplary mechanisms discussed herein, one element interacts with another at a point of interaction such as the end of an extending pin (acting as an engaging element) that contacts or is in close proximity to an active surface with one or more effective edges (as discussed elsewhere herein, such an effective edge can be provided by structure that is recessed below the exposed surface). The use of an extending pin can allow the remainder of the part to be sufficiently separated away from the active surface to effectively limit NCF interactions with the surface to only the interactions with the pin. In a molecular-scale mechanism, where the NCF is primarily van der Waals attraction, the shape of the end of the pin (typically formed from a carbon nanotube) can be adjusted to suit the desired application. In many molecular-scale mechanisms, round-capped 5-5 or 10-0 CNTs can be employed as pins, interacting with a surface of Lonsdaleite or graphene. Such a rounded end can serve to reduce friction in cases where the pin is in contact with the surface, such contact typically helping to stabilize the pin. Round-capped 5-5 and 10-10 CNTs terminate in a pentagonal ring of carbon atoms, with such pentagonal arrangement serving to prevent these atoms from aligning with the hexagonal array of carbon atoms in the underlying surface of Lonsdaleite or graphene.

Figure 7J:
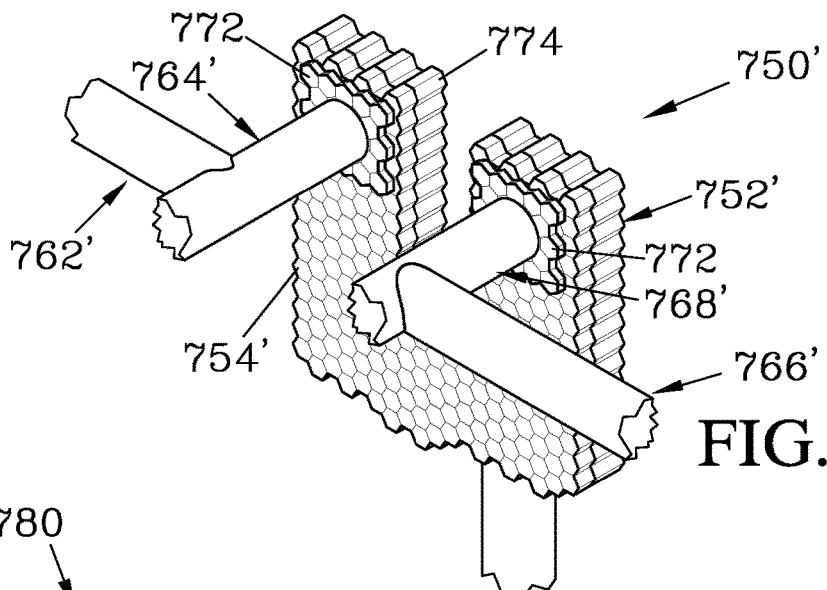

In some cases, it is desirable to provide an extended surface or "foot" on the pin to increase the attractive force between the pin and the surface, and increasing the amount of force available to move elements of the resulting mechanism. FIG. 7J illustrates a portion of a gate 750' where a plate 752' is engaged by pins (764', 768') that each have an extended foot 772, which increases the NCF between the pin (764', 768') and the shaped plate 752'. When the pins (764', 768') are formed by modified CNTs, each foot 772 can be formed by a graphene extension attached to the CNT. The plate 752' can have a plate body 774 formed of a diamondoid material having a hexagonal arrangement of atoms, such as lonsdaleite, with a surface covering 754' of graphene to reduce friction. When the foot 772 is in contact with the plate 752', the hexagonal lattice of the foot 772 can be configured such that its hexagonal array of carbon atoms is rotated about 90 degrees to the hexagonal arrangement of the underlying surface 754', to avoid a situation where the carbon atoms align and cause binding.

Figure 7K:
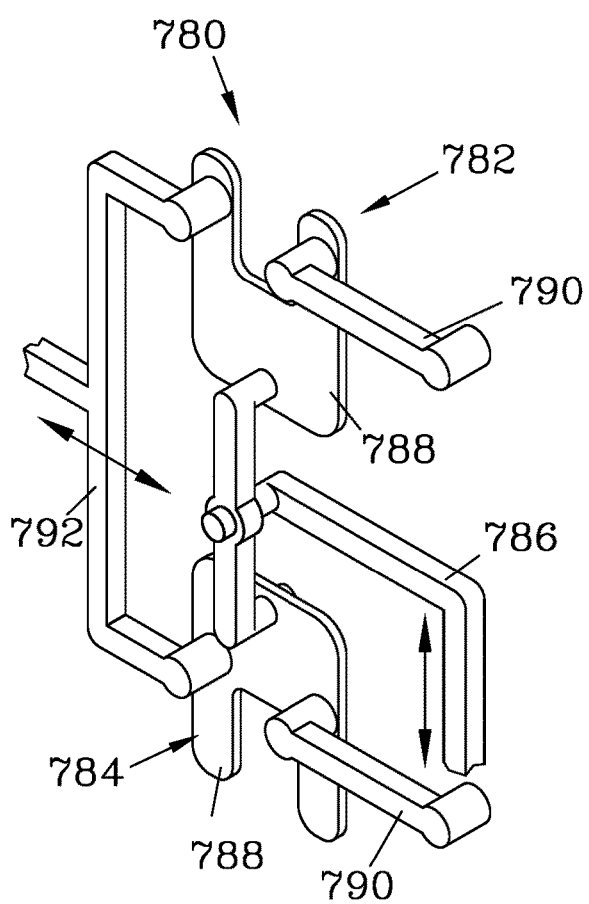
Figure 7L:
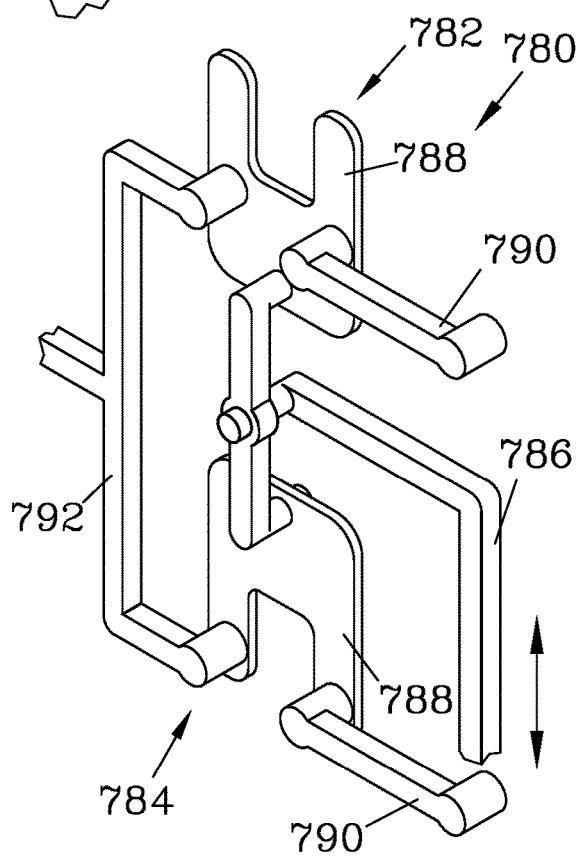

FIGS. 7K and 7L illustrate one example of a switch gate 780 that employs a pair of transmission gates 782 and 784, each of which operates in a similar manner to the transmission gates 700' and 750. The gates (782, 784) are positioned opposite each other, and are both moved by an input 786. Each gate (782, 784) has a shaped plate 788 and an output 790. Both gates (782, 784) are engaged by a driven element 792. Depending on the position of the input 786, one of the gates (782, 784) will have its plate 788 positioned to allow the driven element 792 to move across the plate without any change in NCFs, while the other is positioned such that motion of the driven element 792 brings it against an edge, and causes the plate 788 to move, such motion in turn being conveyed through the associated output 790. FIG. 7K shows the switch gate 780 when the input 786 is positioned such that the plate 788 of the transmission gate 782 is positioned to convey the motion of the driven element 792 to its output 790 to avoid changes in NCF, while the plate 788 of the transmission gate 784 is positioned to accommodate motion of the driven element 792 without any changes in NCF. FIG. 7L shows the alternative position of the input 786, where the transmission gate 782 is now positioned to accommodate motion of the driven element 792, and the transmission gate 784 is positioned to convey the motion to its output 790. Since the position of the input 786 determines which path motion is directed along, the basic scheme of the switch gate 780 can be employed to form logic mechanisms that employ a lock-and-balance scheme to provide an output value based on a number of input values. Examples of how such lock-and-balance logic mechanisms (for logic mechanisms using alternative elements) can be combined to form higher-level computing structures are taught in U.S. Pat. Nos. 10,481, 866; 10,664,233; 10,949,166; and U.S. Publication 2021/0149630.

Figure 8A:
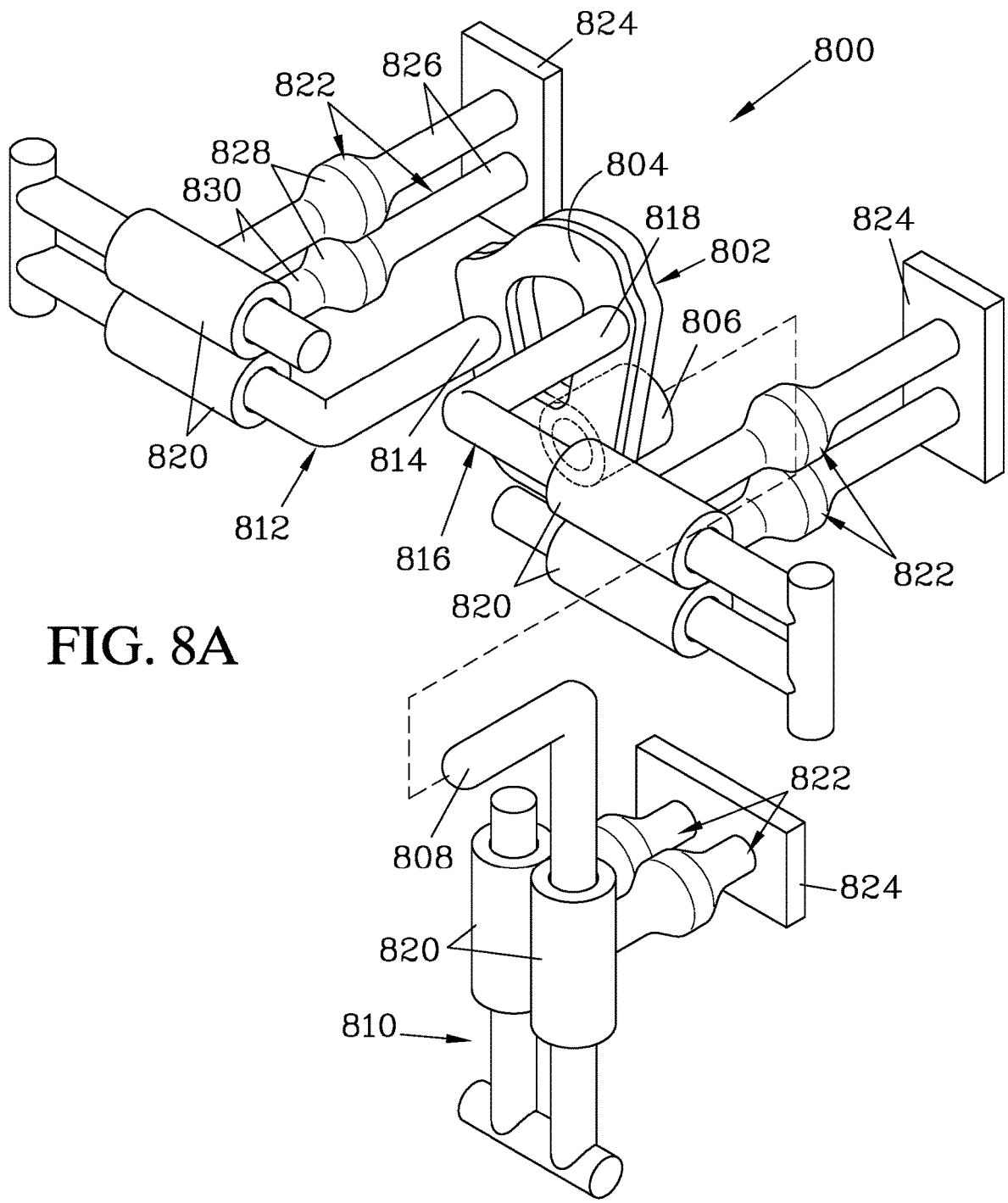

Many of the mechanisms taught herein are well suited to nanoscale fabrication, including molecular fabrication using mechanosynthesis techniques such as taught in U.S. Pat. Nos. 8,171,568; 8,276,211; 9,676,677; 10,067,160; 10,072,031; 10,138,172; 10,197,597; 10,308,514; 10,309,985; 10,822,229; and 10,822,230, all incorporated herein by reference in those jurisdictions where such incorporation is appropriate. FIGS. 8A and 8B show two examples of mechanisms suitable for such fabrication. As one example, FIG. 8A illustrates a transmission gate 800 that functions similarly to the gate 750 shown in FIGS. 7H & 7I, having a shaped plate 802 that can have a graphene surface 804 to reduce friction, and which has a cylindrical socket 806 that is engaged by an input pin 808 on an input 810 that can be formed from a CNT. A driven element 812 having a driven pin 814 and an output 816 having an output pin 818 both engage the plate 802, and can also be formed from CNTs such that the pins (814, 818) engage the plate 802 via van der Waals attraction. Molecular modeling indicates that a gate such as illustrated could be fabricated to fit within a 30 nm cube.

The input 810, the driven element 812, and the output 816 are all slidably mounted in guide sleeves 820. If these sliding elements (810, 812, and 816) are formed from 10-0 CNTs, the sleeves 820 can be formed from 18-0 CNTs. The sleeves 820 in turn are mounted on supports 822 that are affixed to anchors 824 (which could be parts of a single rigid structure). The anchors 824 can be surfaces of a diamondoid material such as lonsdaleite. As labelled for the support of the driven element 812, the supports 822 can be bonded to the anchors 824 by employing base sections 826 formed of 9-0 CNTs, which provide an arrangement of carbon atoms that closely matches the hexagonal arrangement of the lonsdalite. The supports 822 each have a transition section 828 formed by a short section of 18-0 CNT, and a sleeve-mounting section 830 formed by a section of 10-0 CNT; the 10-0 CNT forms a stable T-branch with the 18-0 CNT that serves as the sleeve 820, and both the 10-0 and 9-0 CNTs can be transitioned into the 18-0 CNT of the transition section 828. Additionally, the 18-0 size of the transition sections 828 matches the size of the 18-0 CNTs of the sleeves 820, so that placing the sleeves 820 of each pair in contact with each other also results in the transition sections 828 being in contact with each other, serving to stabilize the spacing of the supports 822.

FIG. 8B illustrates an alternative transmission gate 840 that is also suitable for molecular-scale fabrication. The gate 840 again has a shaped plate 842 with a graphene surface 844 and a cylindrical socket 846, and an input 848 with an input pin 850 that engages the socket 846. The gate 840 also has a driven element 852 with a driven pin 854 and an output 856 with an output pin 858, where the driven pin 854 and the output pin 858 engage the graphene surface 844 of the plate 842. To provide a simpler, more compact mechanism than the gate 800, the gate 840 mounts each of the sliding elements (848, 852, and 856) in a single guide sleeve 860, mounted to an anchor 862 by a support 864, and is stabilized by a guide pin 866 that engages a track 868 formed on the anchor 862. The track 868 may have a graphene surface 870 for slidably engaging the guide pin 866. In combination with the limit on motion resulting from the elements (848, 852, and 856) sliding within the associated guide sleeve 860, the track 868 can be formed narrow enough to serve to direct the guide pin 866 in a manner similar to that of the guides (1404, 1432) discussed below and shown in FIGS. 14A-14C.

FIG. 8C illustrates a transmission gate 880 which operates similarly to the gates (750, 800, 840) discussed above, but which provides a mechanical gain in the displacement of an output 882 relative to the motion of a driven element 884 when a plate 886 is placed in an active position by an input 888. The position where the driven element 884 engages the plate 886 can be adjusted, and the difference in distance from the location where the plate 886 pivotably engages the input 888 results in a difference in displacement of the driven element 884 and the output 882 when the plate 886 is positioned such that an edge 890 is positioned in the path of the driven element 884; if the output 882 is twice as far from the input 888 as the driven element 884, it will be displaced roughly twice the amount that the driven element 884 is. The input 888 can also place the plate 886 in a position where a continuous path 892 is aligned with the path of motion of the driven element 884, allowing the plate 886 to accommodate the motion of the driven element 884 without it passing beyond any edges, in a manner similar to that described for the gates (750, 800, 840) discussed above; in such position, motion of the driven element 884 can be accommodated without having to overcome a non-contact force energy barrier, and therefore without transmitting motion to the output 882.

Figure 9A:
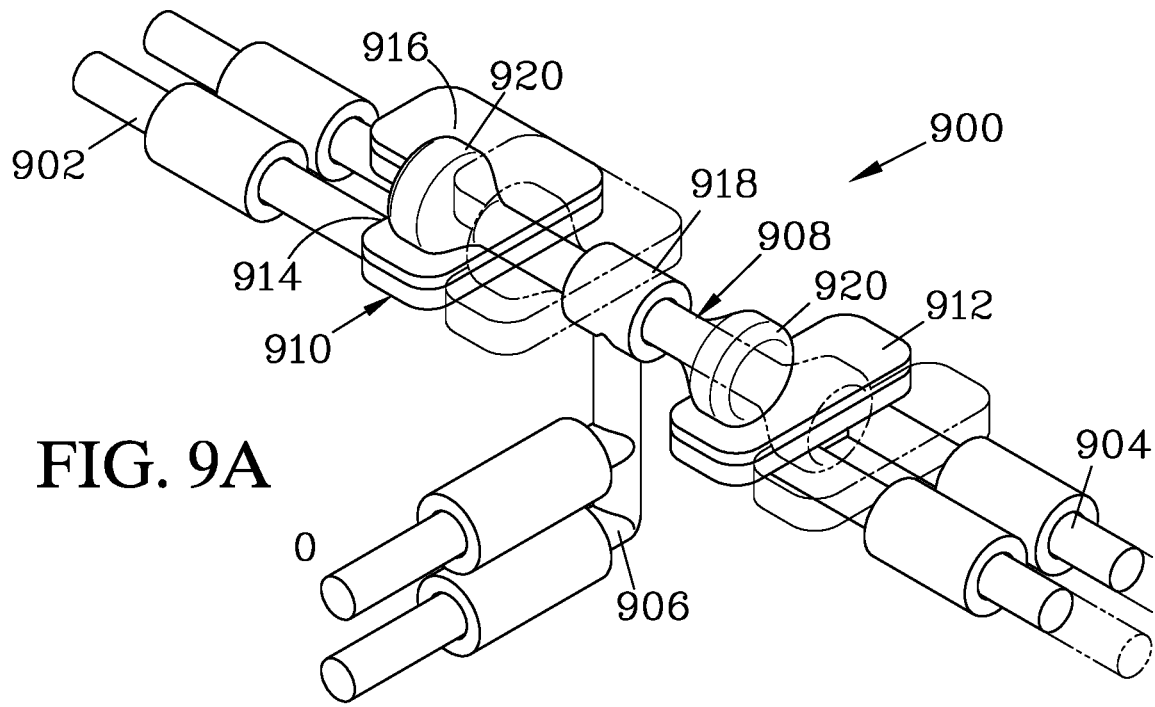
Figure 9B:
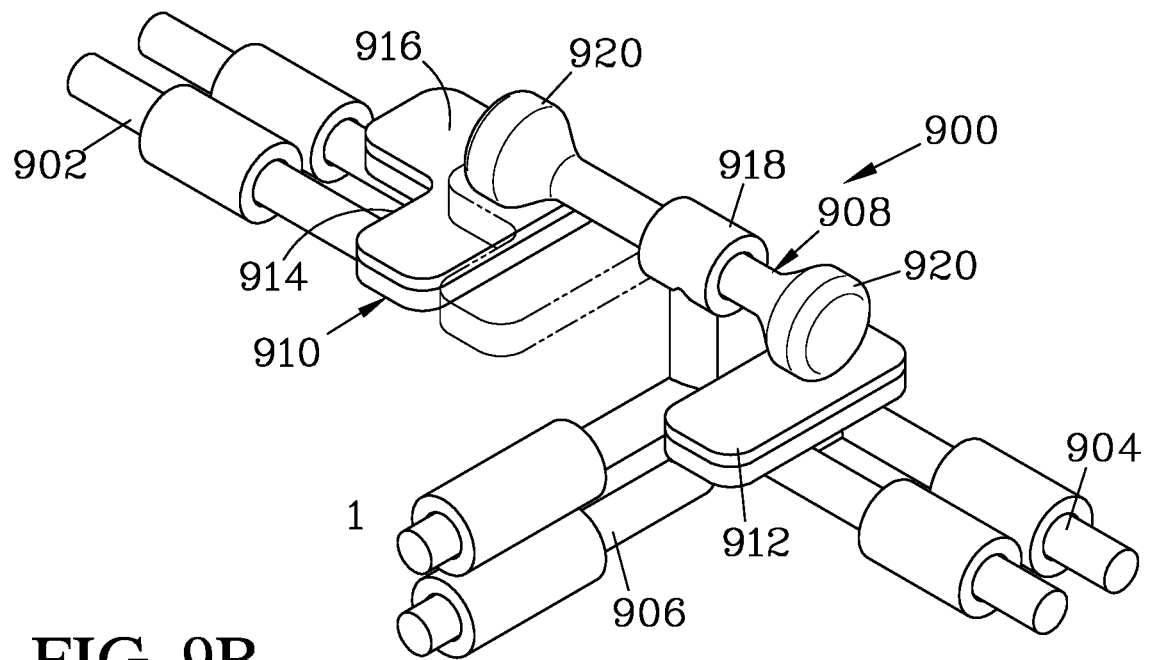

FIGS. 9A and 9B illustrate a mechanism 900 that uses a similar principle of accommodating or transmitting motion from a driven element 902 to an output 904 that is similar to that of the mechanisms (700, 750, 800, 840) described above. The mechanism 900 has an input 906 that controls the position of a connector 908, which is engaged via non-contact forces (NCFs) with a driven plate 910 and an output plate 912, either or both of which can be shaped to provide the desired logic response to the position of the input 906. Whether or not movement of the driven element 902 is transmitted to the output 904 is determined by the position of the connector 908 and the configuration of the plates (910, 912). In the mechanism 900, the driven plate 910 is L-shaped, having an edge 914 and a path region 916. When the connector 908 is in its undisplaced position (with respect to a direction perpendicular to the motion paths of the driven element 902 and the output 904) as shown in FIG. 9A (typically encoding input value 0), displacement of the driven plate 910 acts to move the connector 908 in the direction of the connector 908. The connector 908, which is slidably engaged with the input 906 via a connector sleeve 918, moves with the driven plate 910 to avoid having to overcome the NCF barrier to move beyond the edge 914. Similarly, NCF forces between the connector 908 and the output plate 912 act to move the output plate with the connector 908 (as shown in phantom lines); motion of the driven element 902 is transmitted to the output 904. The connector 908 is formed with enlarged ends 920 for engaging the plates (910, 912).

When the connector 908 is displaced by displacement of the input 906, as shown in FIG. 9B (typically encoding output value 1), it is aligned with the path region 916 of the driven plate 910, and the motion of the driven plate 910 can be accommodated by the path region 916 simply moving past the connector 908, with no change in NCFs; since the connector 908 does not move, motion is not transmitted to the output plate 904.

If the input is configured to position the connector at multiple positions, the driven plate and/or the output plate can be configured to provide an appropriate response to each such position. FIG. 9C illustrates one possible mechanism 930 that provides a NAND logic function performed on two inputs 932 that are connected to a balance 934, which in turn positions a connector link 936 and a connector 938, based on the combined positions of the inputs 932. A driven plate 940 has an edge 942 and a path region 944, and the mechanism 930 is configured such that the connector 938 is aligned with the path region 944 only when both inputs 932 are displaced. When neither or only one of the inputs 932 is displaced, such as shown in FIG. 9C for input values (1, 0), the edge 942 is positioned to force motion of the connector 938 when the driven plate 938 is displaced, also displacing an output plate 946. When both inputs 932 are displaced, the connector 938 is positioned in alignment with the path region 944, which accommodates motion of the driven plate 938 relative to the connector 938. In this case, the connector 938 is not forced to move, so the output plate 946 also does not move. The response of the mechanism to the input values is determined by the configurations of the driven plates and/or the output plates, which can be configured to provide alternative responses. As one example, a plate with two path regions bracketing an edge could provide an XOR logic function (similar to the XOR gate 730' shown in FIG. 7F), or a plate with a shorter edge and wider path region (such that the connector is aligned with the path region if one or both inputs is displaced) could provide a NOR logic function.

FIG. 9D shows a mechanism 950 that is functionally similar to the mechanism 900, but where an output plate 952 is partially superimposed over the driven plate 910, with an enlarged end 954 of a connector 956 positioned between the plates (910, 952). Superimposing the plates (910, 952) reduces the overall volume of the mechanism 950 compared to the mechanism 900.

The effect of using edges to constrain movement of elements (by selectively creating impedance to undesired motion) by managing NCFs can be combined with other motion-limiting structures to provide greater flexibility in designing mechanisms. As one example, FIGS. 10A-10D show a mechanism 1000 that employs NCFs and edges to selectively constrain motion of pivotably-connected links that form a hinge. Such constraint is based on the position of an input 1002, serving to determine the position of an output 1004 when a driven element 1006 is moved (in this example, providing the function of a transmission gate). The driven element 1006 is aligned with the output 1004 and connected thereto by a hinge 1008. The hinge 1008 has extending pins 1010 and 1012 (here formed integrally with the output 1004), which interact with a shaped plate 1014 via NCFs (although the pins 1010 and 1012 may be in contact with the plate 1014). The pins 1010 and 1012 serve as engaging elements that interact with active surface provided by the plate 1014. The plate 1014 is positioned by the input 1002, and as illustrated moves between a first position (shown in FIGS. 10A & 10B) and a second position (shown in FIGS. 10C & 10D). The shaped plate 1014 can be considered as a control element or a constraint structure that determines the allowable motion of the hinge 1008 (via pins 1010 & 1012) to determine whether displacement of the driven element 1006 can be accommodated without forcing motion of the output 1004.

Figure 10A:
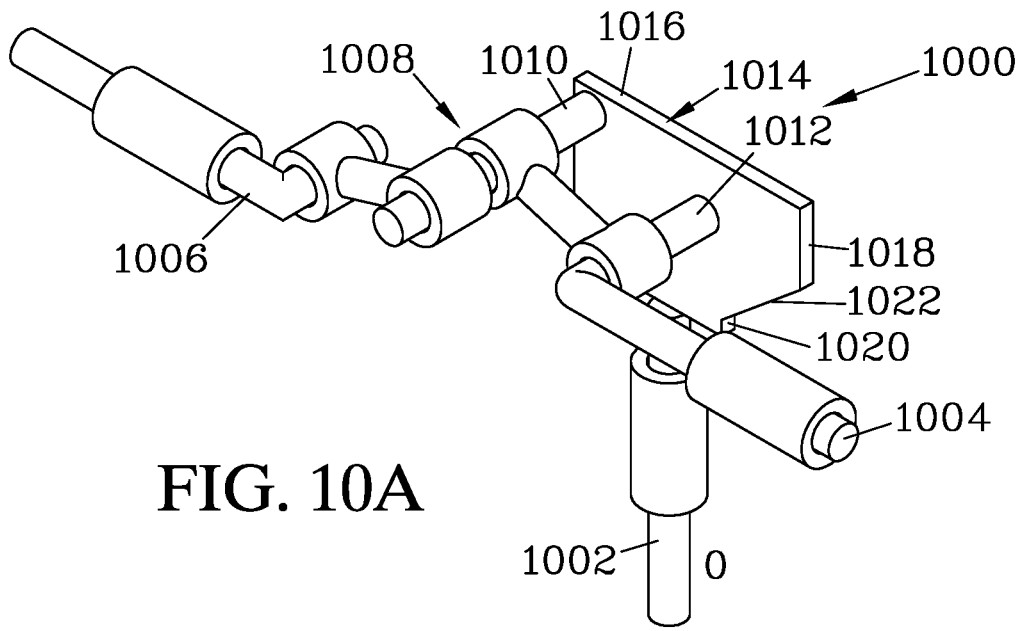
FIGS. 10A to 10D illustrate a transmission gate that employs a hinge in combination with a shaped plate engaged by pins via NCFs, where edges of the plate can constrain the action of the hinge.
Figure 10B:
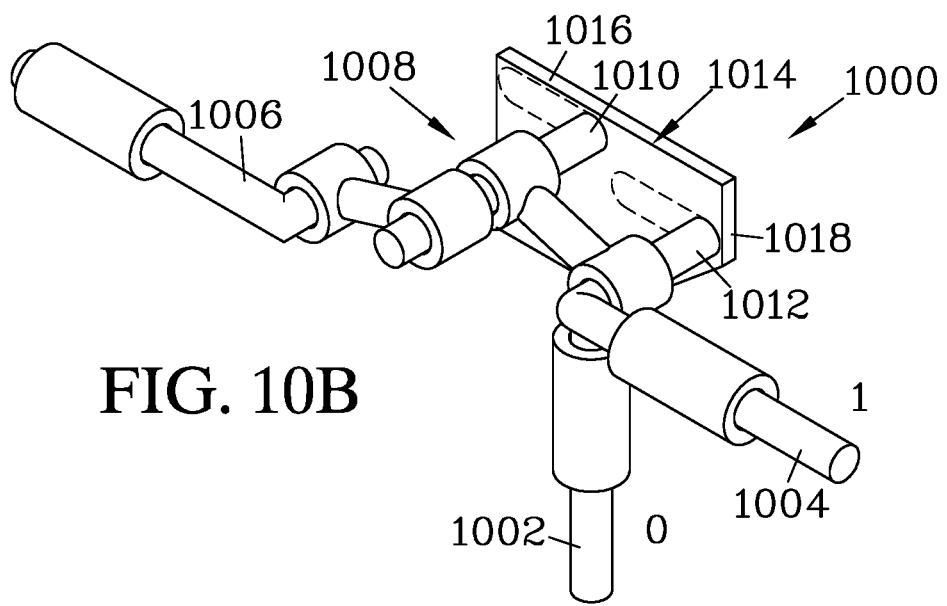

When the plate 1014 is in its first position (FIGS. 10A & 10B), bending of the hinge 1008 is blocked by the proximity of the pin 1010 to a plate first edge 1016. When the driven element 1006 is displaced, the proximity of the pin 1010 to the plate first edge 1016 constrains the motion of the pin 1010, preventing it from moving to bend the hinge further (upward motion in the orientation shown). The displacement of the driven element 1006 is accommodated by translating the entire hinge 1008, which also moves the output 1004 (as shown in FIG. 10B); the plate first edge 1016 can be considered to constrain available motion to a direction along which the output 1004 is movable. The plate 1014 is configured with a plate second edge 1018 positioned relative to the pin 1012 to accommodate its movement with the remainder of the hinge 1008. This position of the plate 1014 can be considered to place the mechanism 1000 in an active operational state or motion-transmitting state, where the output 1004 moves responsive to motion of the driven element 1006.

Figure 10C:
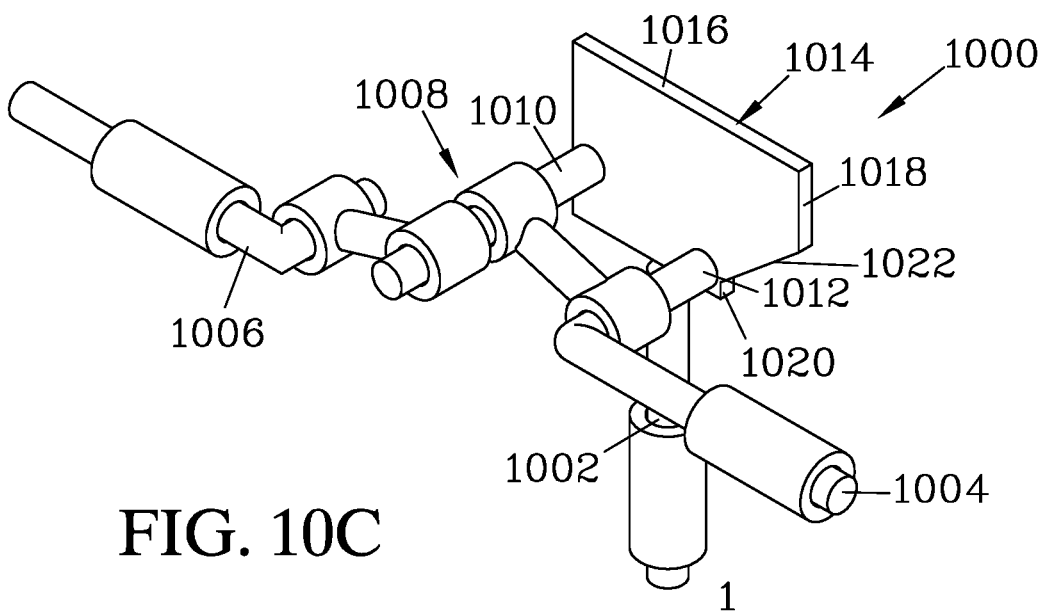
Figure 10D:
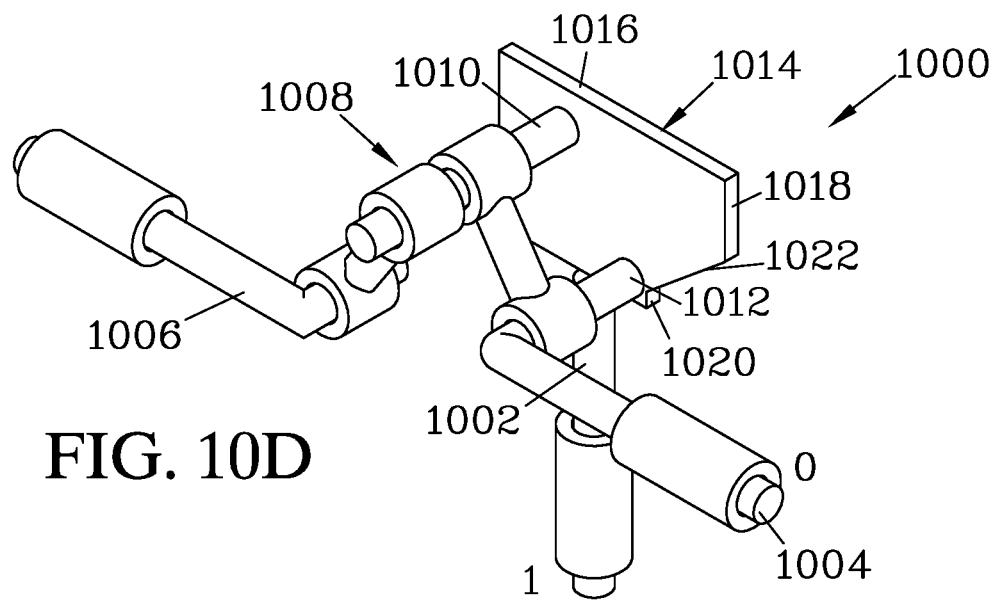

When the plate 1014 is in its second position (FIGS. 10C & 10D), the plate first edge 1016 is positioned away from the pin 1010 (as shown in FIG. 10C), while a plate third edge 1020 is positioned to constrain movement of the pin 1012 to prevent the hinge 1008 from simply translating, and hence blocking movement of the output 1004. In this case, displacement of the driven element 1006 is accommodated by the hinge 1008 bending, moving the pin 1010 closer to the plate first edge 1016 (as shown in FIG. 10D); the plate third edge 1020 can be considered to constrain the available motion to a direction that is not aligned with the direction of motion available to the output 1004. This position of the plate 1014 can be considered to place the mechanism 1000 in an inactive operational state or a motion-accommodating state, where the driven element 1006 can move relative to the output 1004 without any change in NCF; it is notable that the plate 1014 interacts with the pins (1010, 1012) in both positions. The hinge 1008 and the plate 1014 can also be considered as control elements, where the hinge 1008 selectively transmits motion of the driven element 1006 (which could be considered a second input) to the output 1004, dependent on the configuration of the mechanism 1000 set by the position of input 1002.

The plate 1014 can optionally include a plate ramp edge 1022 adjacent to the plate third edge 1020 (and, in the plate 1014 shown, extending to the plate second edge 1018). The plate ramp edge 1022 acts on the pin 1012 to move the output 1004 to its non-displaced position (if not already in such position, as in FIG. 10B) when the input 1002 moves the plate 1014 to its second position, as such movement of the pin 1012 serves to avoid overcoming the attraction of NCFs between the pin 1012 and the plate 1014 that would result from moving the pin 1012 over the plate ramp edge 1022. This motion is similar to other mechanisms discussed herein (and shown in FIGS. 11A-12F) where NCFs allow the movement of a first element, having an edge, to force the movement of another element. The mechanism 1000 could be fabricated from diamondoid material for the plate 1014 (possibly covered with graphene to reduce friction), with the remaining elements formed from modified CNTs.

As noted with regard to the plate ramp edge 1022, one part can be configured with an effective edge that is inclined to the direction of movement of another part, and thus serves as a cam to essentially redirect or force motion. In a typical case, where attractive NCFs are employed, motion of a first part forces a second part to move as the motion of the first part causes an attractive portion or element to move towards an edge, and the resulting motion of the second part is required so as to prevent the attractive portion or element from contacting or passing over the edge.

Figure 11A:
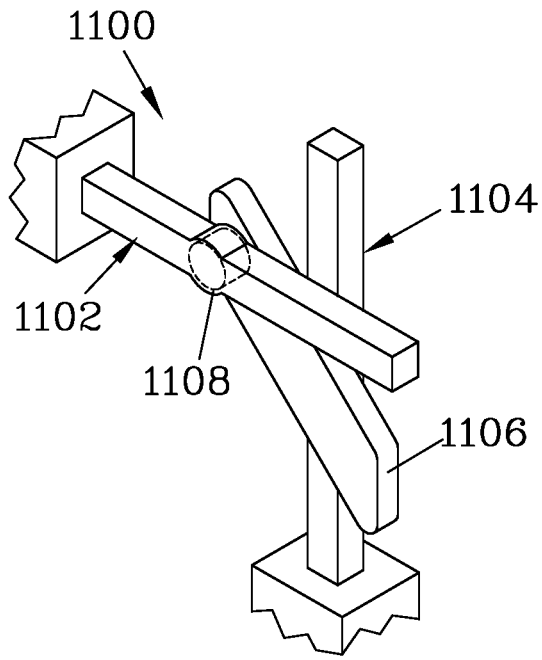
FIGS. 11A to 11H illustrate examples of mechanisms where motion of one part forces motion of another part to avoid overcoming NCF energy barriers.
Figure 11B:
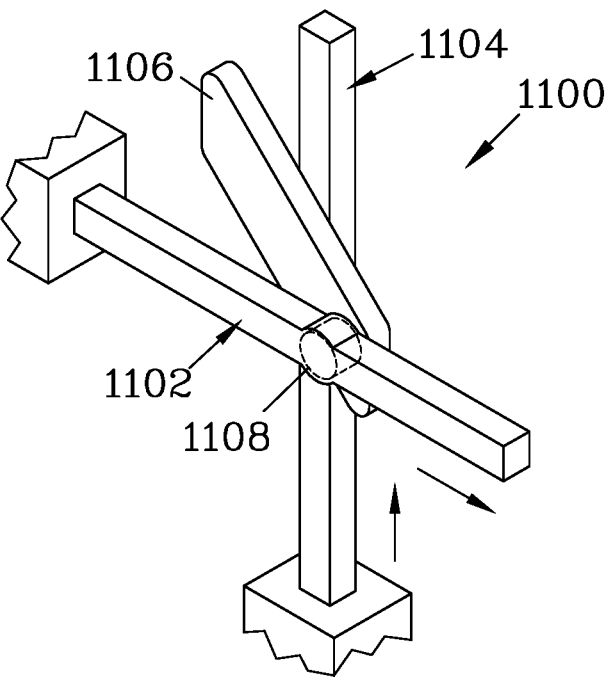
Figure 11C:
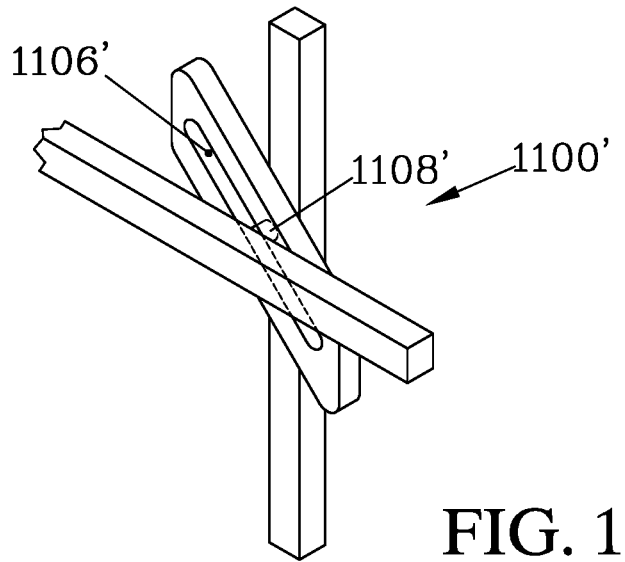

FIGS. 11A-11B illustrate a movable linkage mechanism 1100 that relies on NCF to cause movement of a responding part 1102 responsive to movement of a driven part 1104. In the linkage 1100, the driven part 1104 has a shaped plate 1106 affixed thereto (providing an active surface), and the responding part 1102 has an attractive element 1108 incorporated therein (serving as an engaging element). In a nano-scale structure, the attractive element could be simply an enlarged region or extending pin on the responding part 1102, where van der Waals attraction is sufficient to provide the NCF. For a larger-scale structure, as illustrated, the attractive element 1108 can be a magnet and the shaped plate 1106 can be formed of a ferromagnetic material to provide the attractive force. The responding part 1102 and the driven part 1104 in this mechanism are limited to translational motion (in FIGS. 11A and 11B, the responding part 1102 is limited to horizontal movement and the driven part 1104 is limited to vertical movement, by guides or similar means for limiting motion; in this case, the plate 1106 is shaped to extend diagonally). When the driven part 1104 is translated (vertically), corresponding (horizontal) motion of the responding part 1102 is required to avoid a change in the attractive force between the parts (1102, 1104); if the responding part 1102 did not move, the movement of the driven part 1104 would move the plate 1106 away from the attractive element 1108 (essentially moving the attractive element 1108 beyond the edge of the plate 1106), which would require overcoming the attractive force that draws the attractive element 1108 and the plate 1106 together. To avoid the energy required to overcome the attractive force, the movement of the plate 1106 draws the attractive element 1108 along the plate 1106, and causes movement of the responding part 1102. The attractive force between the plate 1106 and the attractive element 1108 allows the shape of the plate 1106 to guide the movement of the attractive element 1108, providing an effect similar to that which would be provided by a pin 1108' guided in a diagonal slot 1106', as illustrated in FIG. 11C for a conventional movable linkage 1100'. It should be appreciated that the function of the parts could be reversed, with the attractive element provided on the driven part and the plate provided on the responding part.

Figures 11D, 11E:
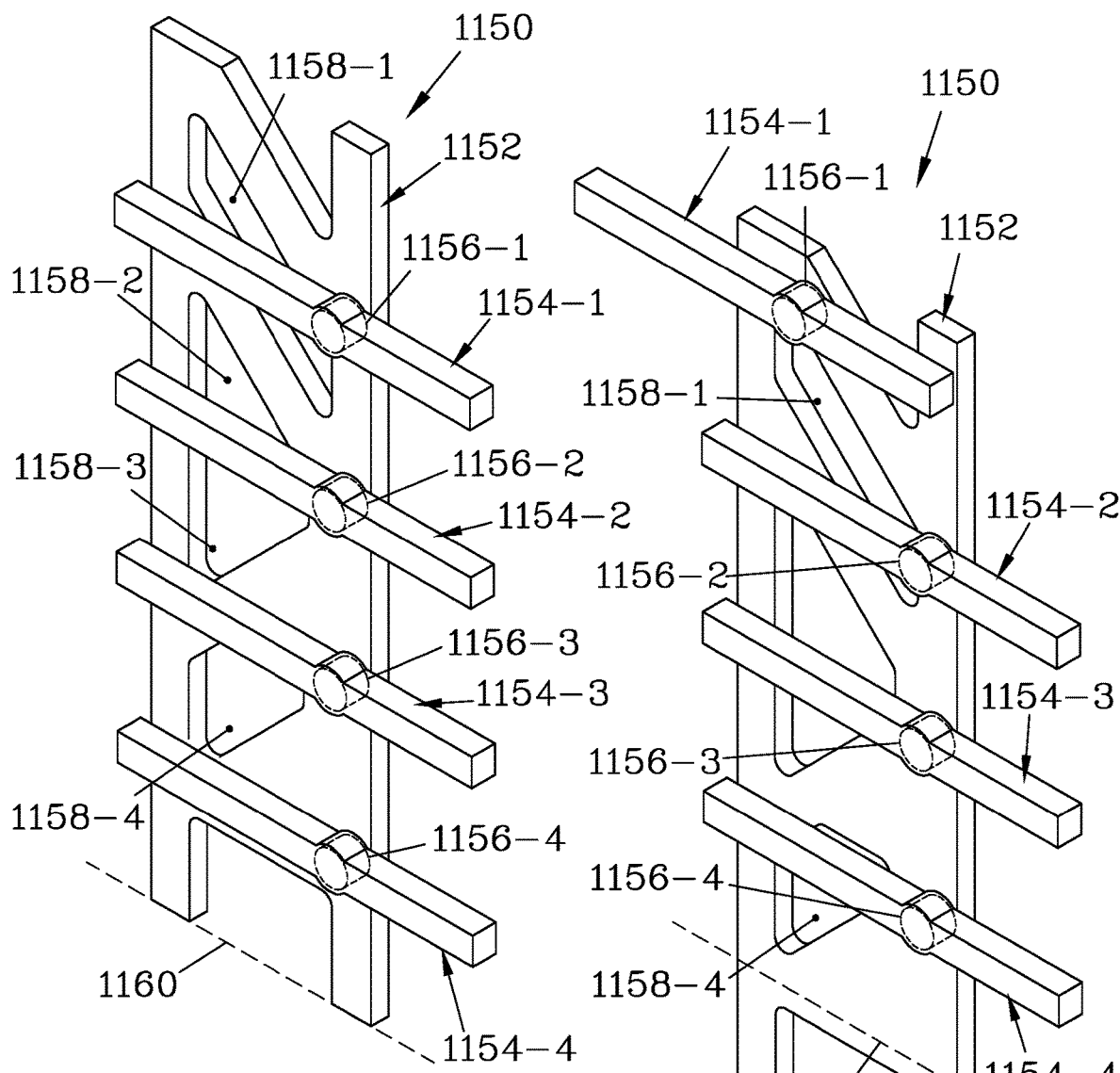
Figure 11F:
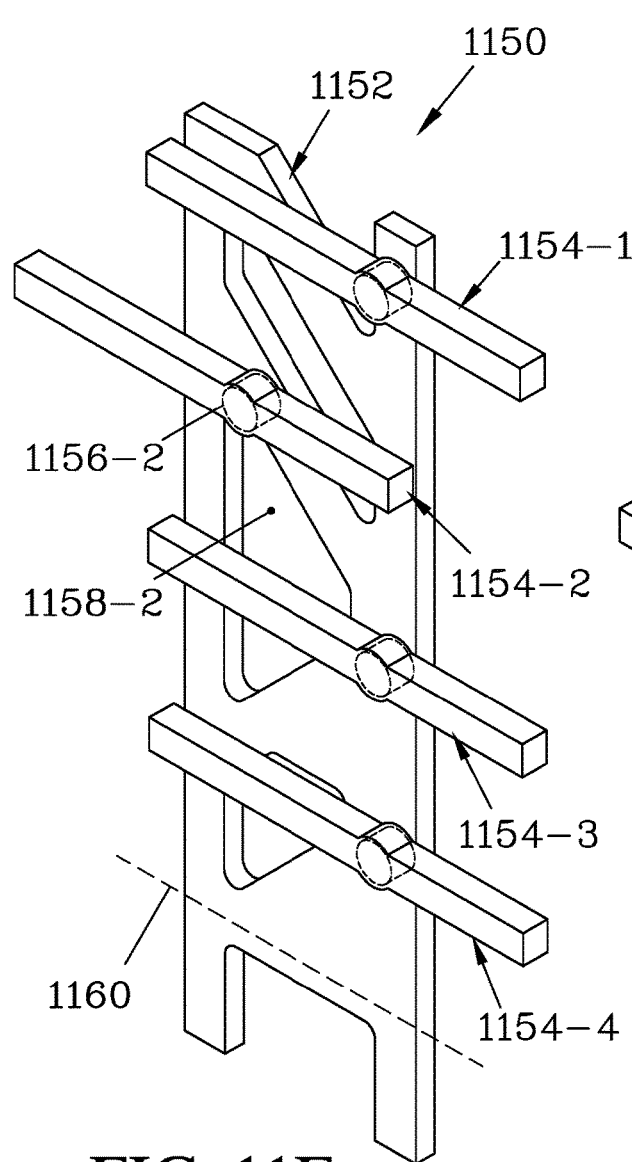
Figure 11G:
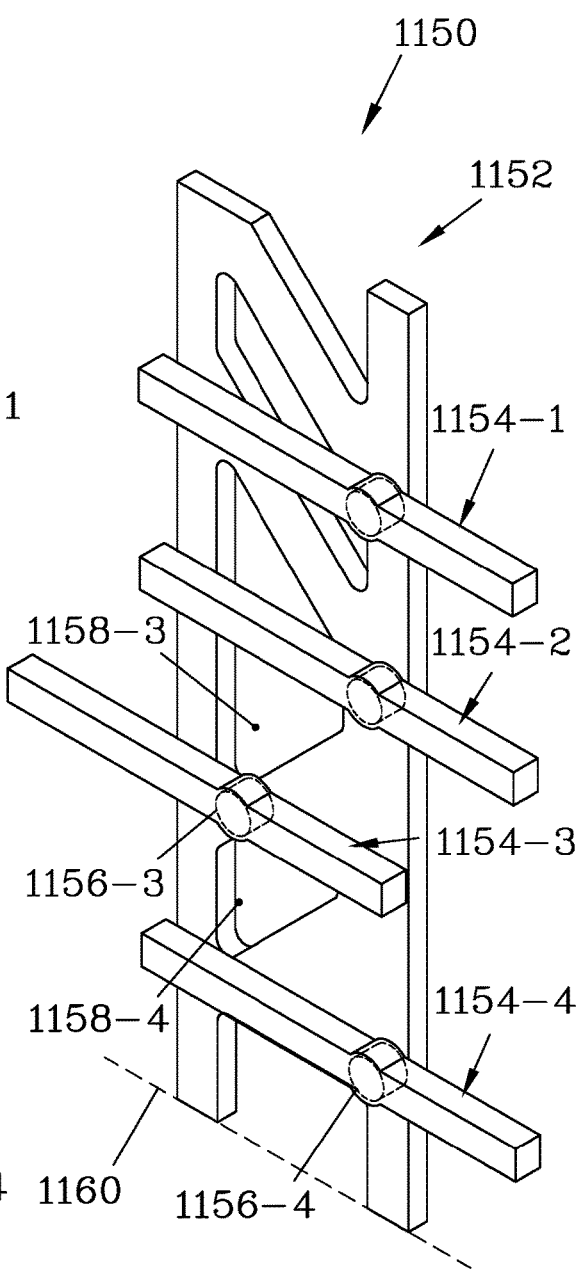

FIGS. 11D-11G illustrate one example of an extension of the basic motion-forcing principal employed in the linkage mechanism 1100 shown in FIGS. 11A & 11B. A data reader mechanism 1150 employs a data ribbon 1152 and a series of bit readers 1154, each of which has an attractive element 1156 that is attracted to the data ribbon 1152 (and serves as an engaging element). The data ribbon 1152 in turn is formed with a corresponding series of cutouts 1158 that serve to encode bits and which are configured such that the position of the data ribbon 1152 after movement of one of the bit readers 1154 indicates the encoded bit (serving as a series of active surfaces that interact with the engaging elements provided by the attractive elements 1156). Each bit encoded on the data ribbon 1152 can be read by moving the corresponding bit reader 1154. The shape of the cutout 1158 for that bit is designed to position the data ribbon 1152 in either an undisplaced position relative to a reference line 1160 (indicating a 0 value for that bit in the illustrated example, as shown in FIG. 11G), or in a lowered position (indicating a 1 value for that bit, as shown in FIGS. 11E & 11F). The data ribbon 1152 illustrated has cutouts 1158 that encode the values (1, 1, 0, 0). If the data ribbon 1152 is already in the correct position encoded by the bit, then it can remain in position when the corresponding bit reader 1154 is displaced. If the data ribbon 1152 is not in the correct position, then the interaction of the bit reader 1154 and the corresponding cutout 1158 acts to move the data ribbon 1152 to the correct position for the encoded bit (either at the reference line 1160 for a value of 0, or extended beyond the reference line 1160 for a value of 1), in a manner similar to that of the plate and attractive element shown in FIGS. 11A & 11B, but with the driven and responding parts reversed (and with the driven elements being displaced to the left).

By sequentially moving the bit readers 1154, the bits encoded by the cutouts 1158 can be read, as shown in FIGS. 11E-11G, which respectively show the resulting positions and output values of the data ribbon 1152 as the first three of the bit readers 1154 are individually moved in sequence to read the associated bits. FIG. 11E shows the displacement of the data ribbon 1152 responsive to movement of the first of the bit readers 1154-1. When the bit reader 1154-1 is moved to the left, it forces the data ribbon 1152 to move downwards to prevent the attractive element 1156-1 from moving beyond the edge formed by the cutout 1158-1. It should be noted that the cutouts 1158 are configured such that the data ribbon 1152 has an unobstructed vertical region that allows it to move vertically with respect to the remaining attractive elements (1156-2, 1156-3, and 1156-4) without any of the unmoved attractive elements (1156-2, 1156-3, and 1156-4) encountering an edge as the data ribbon 1152 moves vertically downward. The cutout 1158-1 could be configured to return the data ribbon 1152 to its initial position when the bit reader 1154-1 is returned to its initial position, or the data ribbon 1152 could be returned by independent means such as tension springs. Alternatively, the data ribbon 1152 could simply remain in place as the bit reader 1154-1 is returned, and either left in place or moved upwards back to its upper position on the reference line 1160 when the next bit reader 1154-2 is moved (as shown in FIG. 11F). In the event that the cutout 1158 for a particular bit is designed to provide a 0-value output, as is the case for the cutout 1158-3 shown in FIG. 11G, movement of the corresponding bit reader 1154-3 either moves the data ribbon 1152 to its upward position, if it was in its lower position prior to reading the third bit, or leaves it in place if it is already in its upper position. Where cutouts are adjacent, as shown for cutouts 1158-2 and 1158-3, they may be merged into a single cutout, so long as the edges of the cutouts (1158-2, 1158-3) are configured to position the data ribbon 1152 appropriately in response to movement of the associated bit reader (1154-2, 1154-3). The cutout 1158-4 is designed similarly to the cutout 1158-3, and serves to position the data ribbon 1152 to the same upward position when the fourth bit reader 1154-4 is moved. While a 4-bit data ribbon is shown for purposes of illustration, any number of bits could be encoded in such manner. Similarly, while the example illustrated employs an upper position to indicate a value of 0 and lower position to indicate a value of 1, alternative directions and assigned values could be employed. In some cases, parts moving in one direction may interact with parts moving in a different direction, and thus the values assigned to a particular direction will depend on the particular part; for example, a part in which a lower position indicates an output value of 1 may interact with another part where a left position indicates a value of 1. Additionally, a data ribbon could be designed to move in either direction from a neutral position, to encode output values of −1, 0, or +1.

Figure 11H:
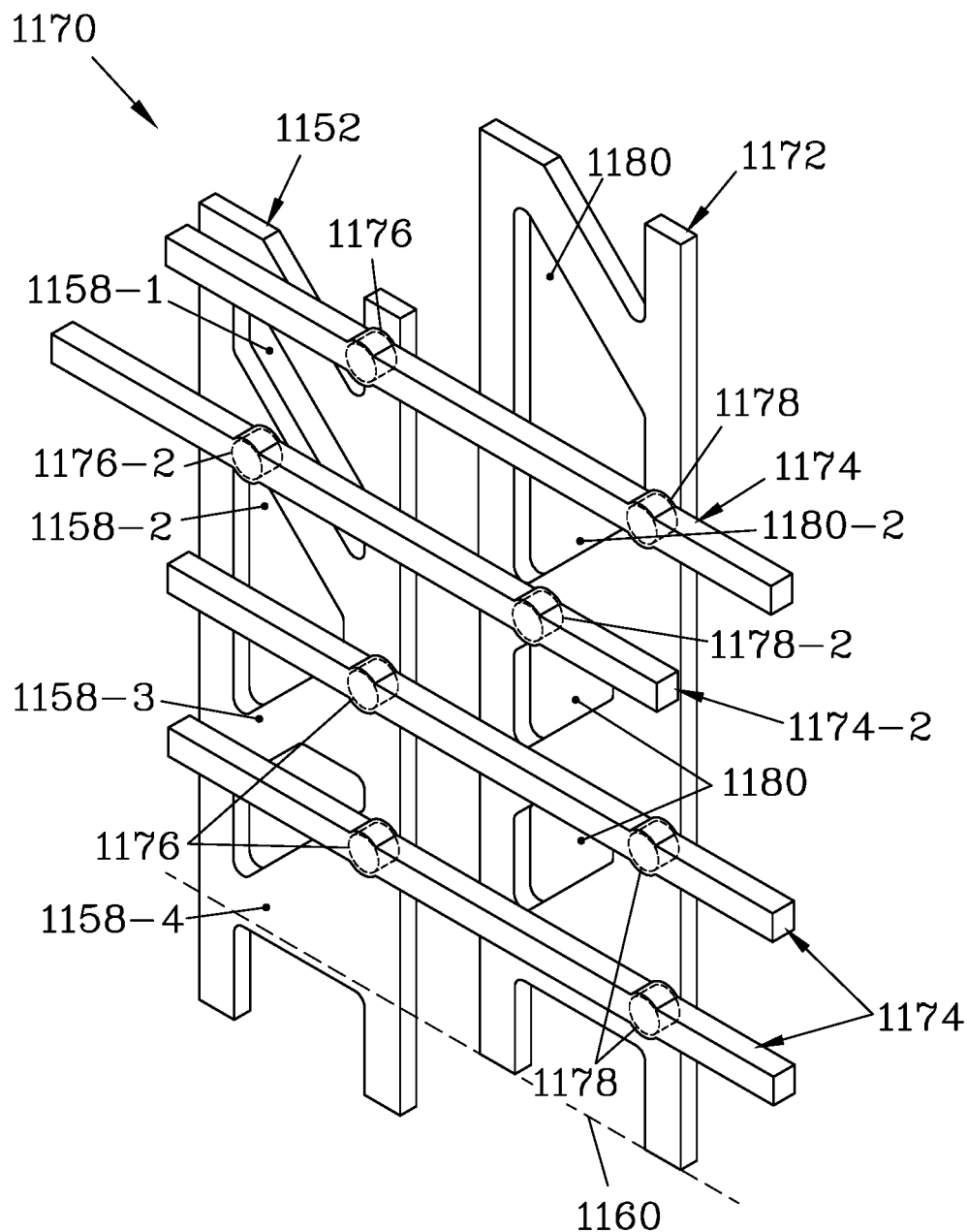

FIG. 11H illustrate an example of a data reader mechanism 1170 which employs the data ribbon 1152 as well as a second data ribbon 1172, to allow multiple bits to be read at one time. While two data ribbons (1152, 1172) are shown, any number could be employed. The data reader 1170 again has a series of bit readers 1174, but in this case, each bit reader 1174 has a pair of attractive elements 1176 and 1178, one for each data ribbon (1152, 1172). The attractive elements 1176 are configured to position the data ribbon 1152 by interacting with the cutouts 1158 on the data ribbon 1152, while the attractive elements 1178 are configured to positioned to interact with cutouts 1180 provided on the second data ribbon 1172 to position the second data ribbon 1172. In this case, the cutouts (1158 and 1180) in each row correspond to bits, and the columns correspond to four bytes (the number of bytes being defined by the number of bit readers 1174), each byte consisting of two bits of information, one for each data ribbon (1152, 1172). FIG. 11H illustrates the data reader 1170 when the second bit reader 1174-2 has been moved, to read the second byte as defined by the cutouts 1158-2 and 1180-2. In this case, the cutout 1158-2 is configured to interact with attractive element 1176-2 to position the data ribbon 1152 in a lower position, indicating an output value of 1 (as shown earlier in FIG. 11F), while the cutout 1180-2 is configured to act on attractive element 1178-2 to position the data ribbon 1172 in an upper position (if not already residing there), indicating an output value of 0. The data ribbons (1152, 1172) record the values of (1, 0) for the second byte of memory.

FIGS. 12A-F illustrate one example of a latch mechanism 1200 that acts to store values between clock phases. The latch mechanism 1200 has an input 1202 and an output 1204, which are connected by a copy element 1206. As shown, the input 1202 has an input pin 1208 that interacts with the copy element 1206 via NCFs, while the output 1204 is pivotably engaged with the copy element 1206. The copy element 1206 in turn has a copy pin 1210 (here shown formed integrally with the output 1204) that engages a lock plate 1212 via NCFs (such as van der Waals attraction in a nano-scale mechanism, or ferro-magnetism in a larger-scale mechanism). The lock plate 1212 is U-shaped, and is moved between a lock position (shown in FIGS. 12A and 12C) and an unlock position (shown in FIGS. 12B and 12D) by a lock actuator 1214. When the lock plate 1212 is in its lock position, its edges constrain the movement of the copy pin 1210 and act to block translation of the copy element 1206 in the direction of motion of the input 1202 and the output 1204, regardless of whether the output 1204 is in its 0-value position (shown in FIGS. 12A and 12B) or in its 1-value position (shown in FIGS. 12C and 12D). It should be noted that the mechanism 1200 could be employed without the lock plate 1212 to provide a connection between parts that can be either floating or non-floating.

When the lock plate 1212 is in the unlock position, the copy element 1206 and the output 1204 connected thereto are free to translate between the 0-value and 1-value positions of the output 1204 without the copy pin 1210 encountering an edge of the lock plate 1212. At such time, the copy element 1206 can be pivoted relative to the output 1204 by a copy actuator 1216, moving the copy element 1206 between a (lowered) free position (shown in FIGS. 12A and 12C) and a (raised) copy position (shown in FIGS. 12B and 12D). The copy element 1206 has a copy plate 1218 that is triangular, with edges 1220 and 1222 that interact with the input pin 1208 to move the copy element 1206 and the output 1204 to a position determined by the position of the input 1202 as the copy element 1206 pivots to its copy position (the copy plate 1218 provides an active surface with effective edges 1220 and 1222, and interacts with input pin 1208 acting as an engaging element, while the copy actuator 1216 could be considered as a driven element or as a second input). If the input 1202 is in its 0-value position, the edge 1220 acts to move the copy element 1206 and the output 1204 as the copy element 1206 is pivoted, to place the output 1204 in its 0-value position (if not already in that position). Similarly, if the input 1202 is in its 1-value position, the edge 1222 acts to move the copy element 1206 and the output 1204 to place the output 1204 in its 1-value position as the copy element 1206 is pivoted (if not already in that position). The copy element 1206 could be considered as a control element that selectively transmits motion of the copy actuator 1216 to the output 1204, based partly on the position of input 1202 (as well as on the current position of output 1204). The relative positions of the input 1202 and the output 1204 could be considered to place the mechanism 1200 in an inactive operational state or motion-accommodating state (when input 1202 matches the current position of output 1204, and motion of copy actuator 1216 can be accommodated without causing movement of output 1204) or in an active operational state or motion-transmitting state (when input 1202 does not match the current position of output 1204, and motion of copy actuator 1216 is transmitted to output 1204 to avoid the changes of NCF that would result from moving input pin 1208 against one of the edges 1220 or 1222).

Once the output 1204 has been moved (if necessary) to the correct position to reflect the value of the input 1202, the lock plate 1212 can be returned to its lock position, preventing further translation of the copy pin 1210 and effectively locking the output 1204 in its current position. The copy element 1206 can then be pivoted back to its free position by retracting the copy actuator 1216, at which time the input 1202 is free to move between its 0-value and 1-value positions, while its previous value is stored by the locked position of the output 1204. The mechanism 1200 could be formed on a molecular scale using CNTs for elements such as the input 1202, output 1204, lock actuator 1214, and copy actuator 1216, and diamond, lonsdaleite, or diamondoid structures for planar elements such as the lock plate 1212 and the copy plate 1218.

Figure 12A:
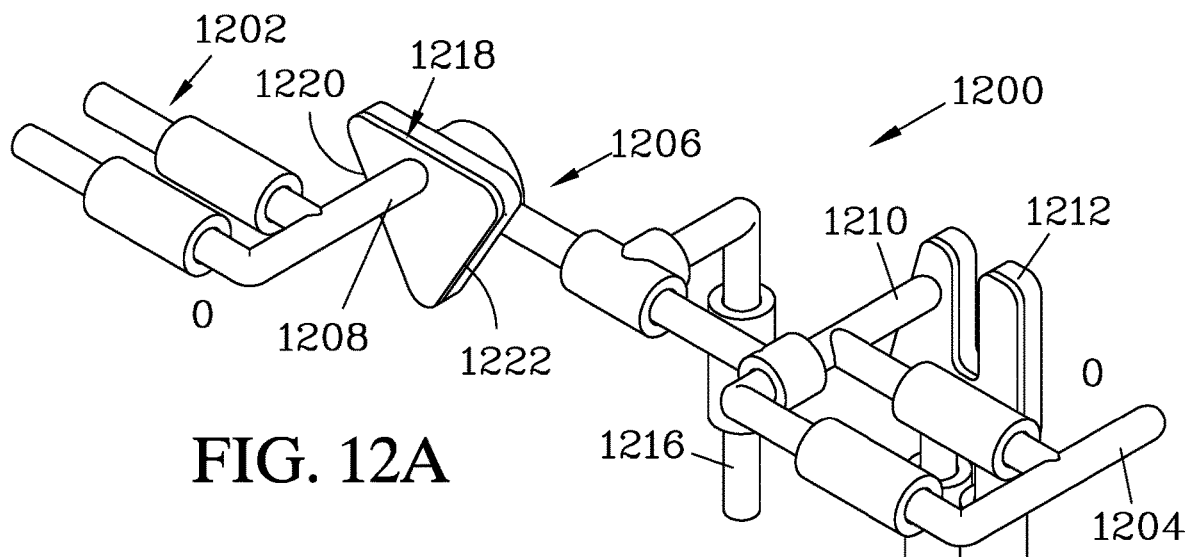
FIGS. 12A-12D illustrate a mechanical latch that can be employed to store values; the latch employs a copy element with a shaped plate that moves it to a position representing the value of an input, after which the copy element can be locked into position to retain the value while the input is reset.
Figure 12B:
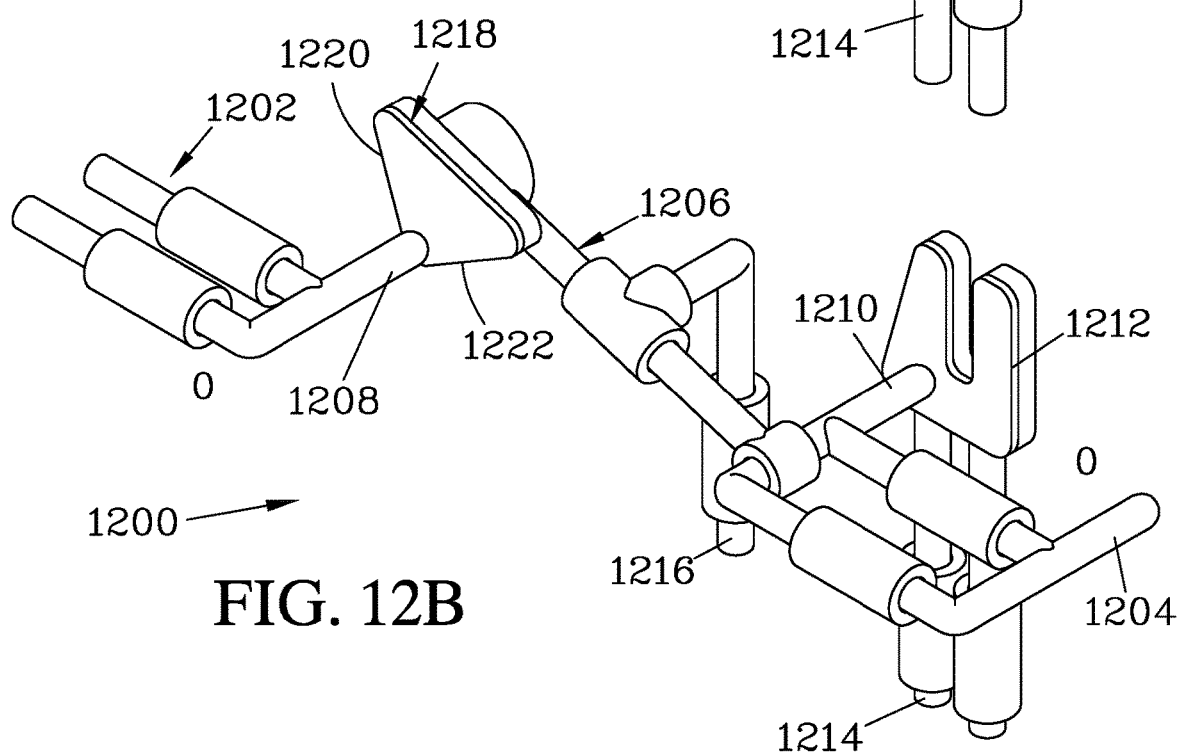
Figure 12C:
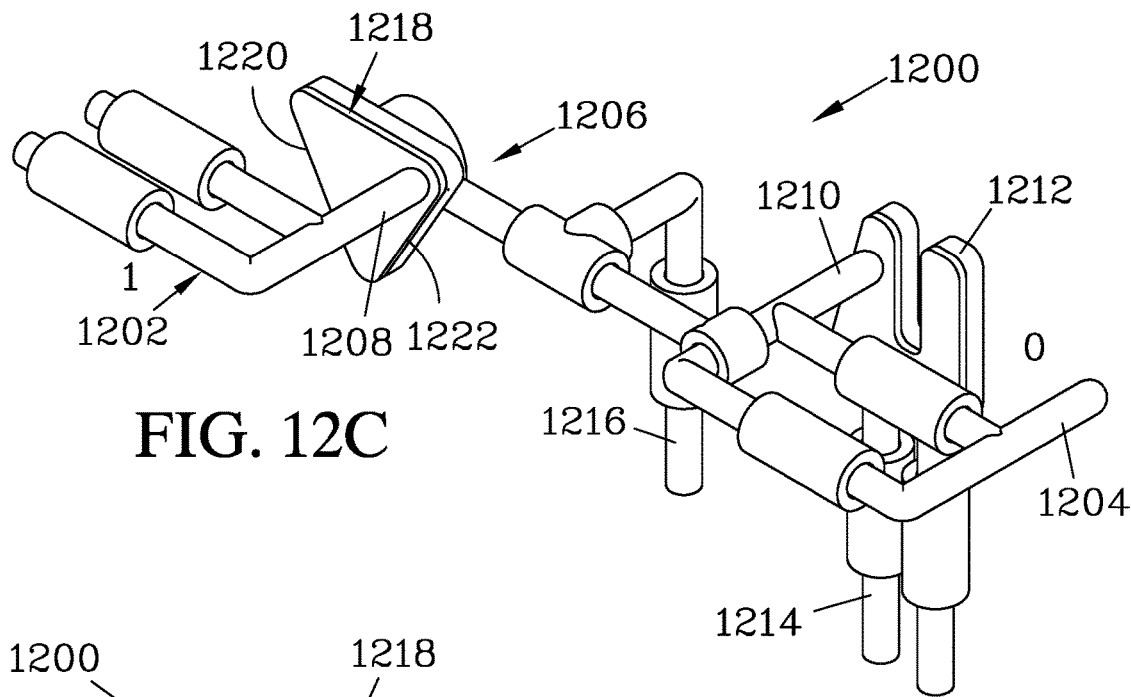
Figure 12D:
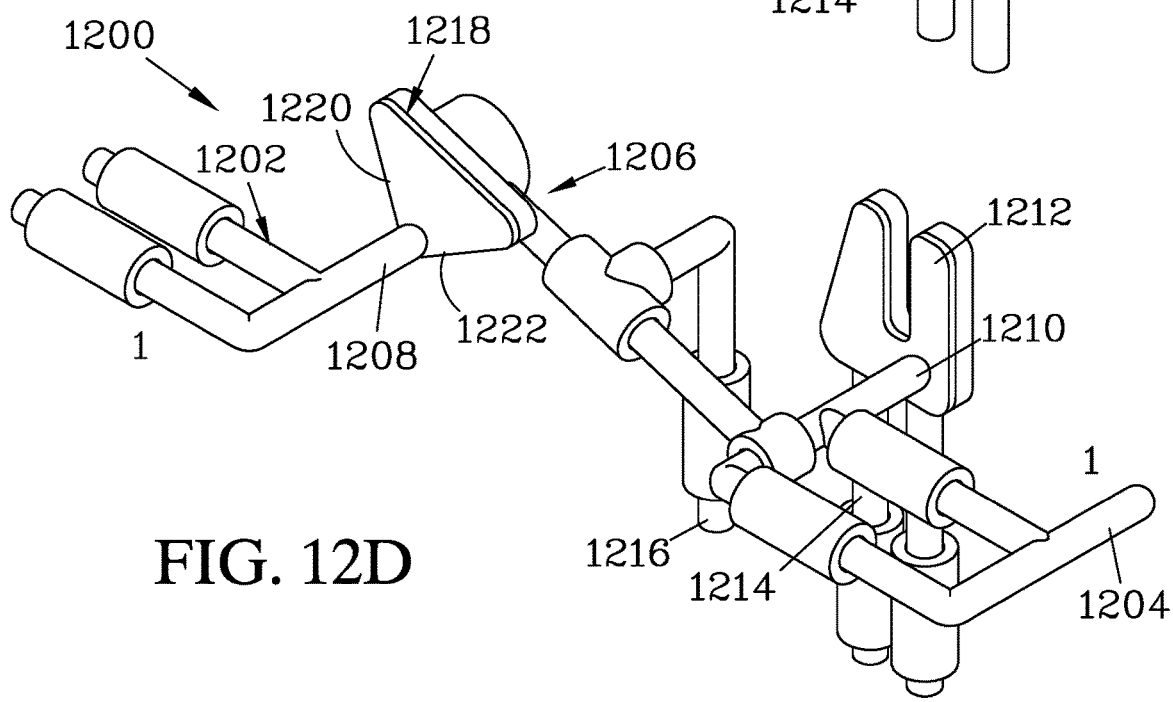
Figure 12E:
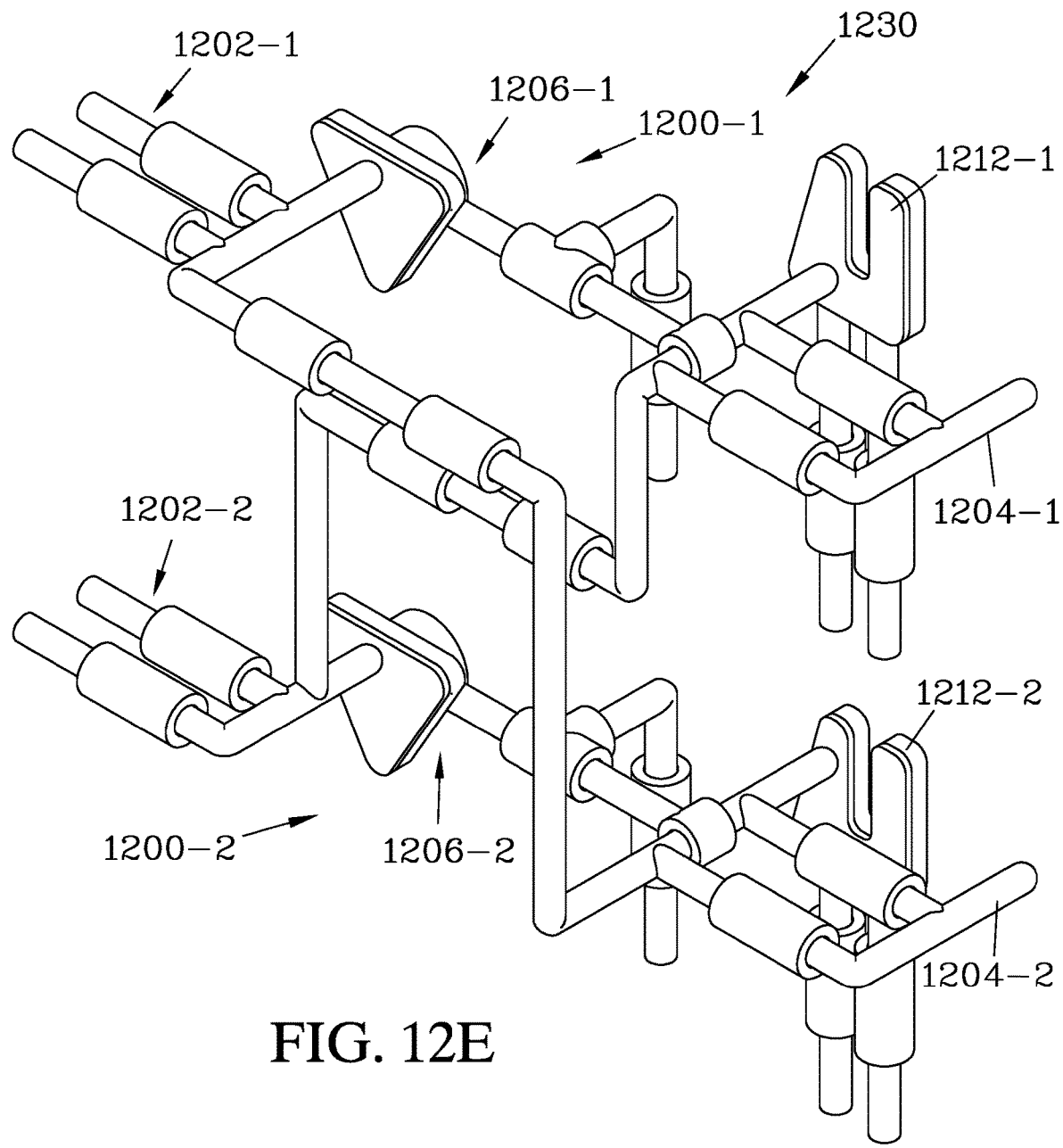
FIG. 12E illustrates two latches connected together to form a flip flop.

One use of such latches 1200 is to chain two latches 1200 to provide a D-type flip flop 1230, as shown in FIG. 12E, where the output 1204 of each latch 1200 defines the input 1202 of the other, and the lock plates 1212 are moved sequentially. To avoid binding, the lock plate 1212 for each latch 1200 is moved to its unlock position, allowing its associated input 1202 to move freely, before the copy actuator 1216 of the other latch 1200 is activated to pivot the copy element 1206, which acts to set the associated output 1204 and the now-free input 1202 of the non-associated latch 1200.

In sequence, the lock plate 1212-1 of the first latch 1200-1 is placed in its unlock position (as shown in FIG. 12E), and the first copy element 1206-1 is pivoted to its copy position to set the first output 1204-1. Once set, the first lock plate 1212-1 is moved to its lock position, setting the output 1204-1 (which also sets the input 1202-2), and the first copy element 1206-1 is returned to its free position, allowing movement of the first input 1202-1. The second lock plate 1212-2 is then moved to its unlock position, and the second copy element 1206-2 is moved to its copy position, which acts to place the second output 1204-2 (which also defines the first input 1202-1) into the position defined by the second input 1202-2 (defined by the first output 1204-1).

Figure 12F:
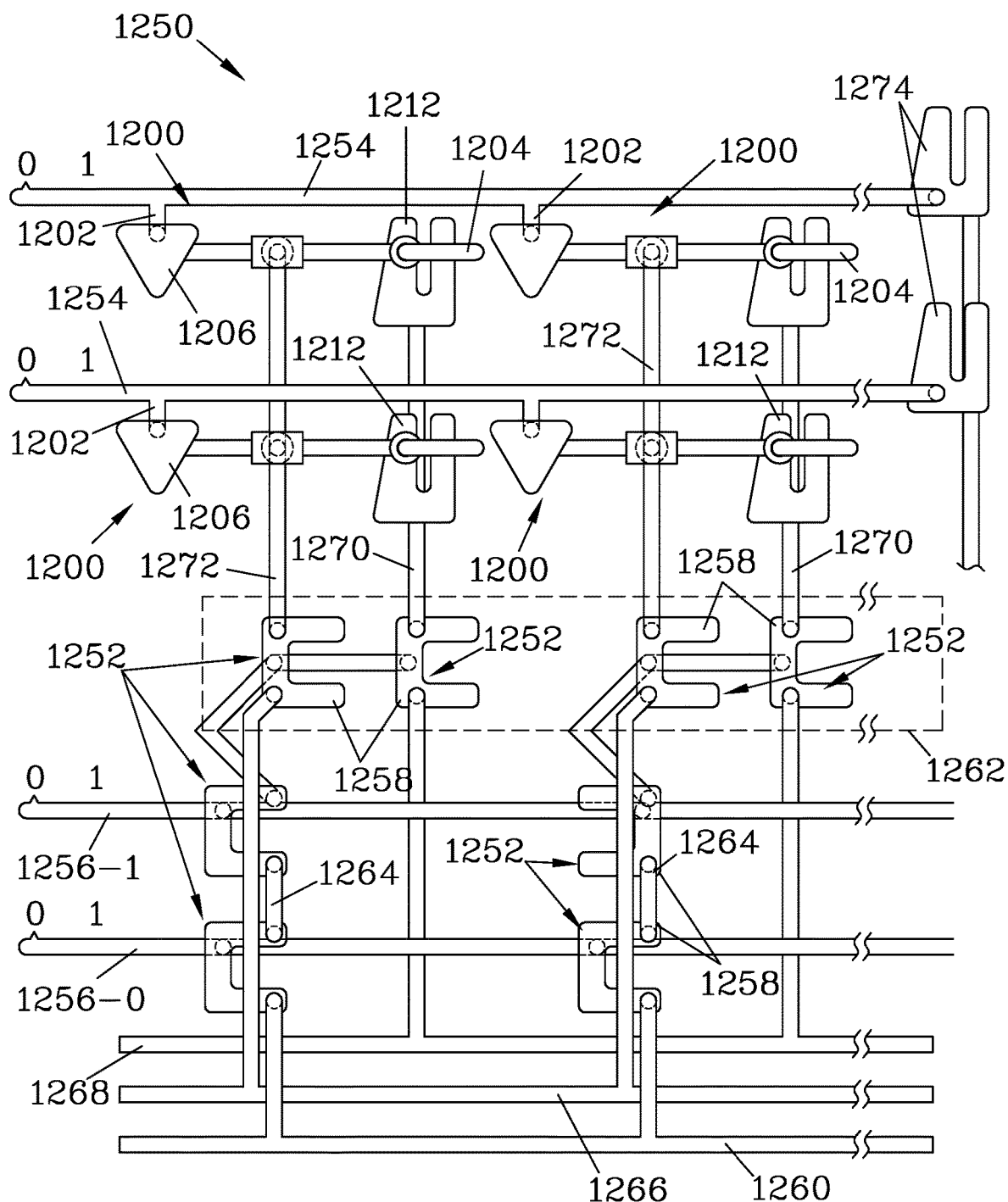
FIG. 12F illustrates a portion of a grid memory array that is formed from latches and an array of transmission gates connected to select a memory address where values can be either written or retrieved.

FIG. 12F shows another example of a mechanism employing latches 1200, a portion of a grid memory 1250 (the view shown illustrates 2 of 4 columns of the entire memory structure). In this case, the latches 1200 are used in combination with an arrangement of transmission gates 1252 that can be similar to the gates (750, 800, 840) shown in FIGS. 7H-7I, 8A-8B. In the memory 1250, the latches 1200 can store values received from a pair of data lines 1254, until these values are "read" back to the data lines 1254; in this scheme, the positions of the outputs 1204 are not read, and the outputs 1204 serve only to limit the motion of the copy elements 1206. FIG. 12F shows two memory addresses (00 and 01), and a similar additional pair of memory addresses (10 and 11, positioned in the cut-out portion on the right) are not shown; each memory address can store two bits of data. Each memory address has a pair of latches 1200, with two data inputs 1202, each connected to the data line 1254 for that bit of information. Each data line 1254 connects together the data inputs 1202 for that bit for each of the memory addresses.

The transmission gates 1252 are arranged to select one of the memory addresses for current action, based on the positions of two address bars 1256, each of which identifies one bit of the memory address. The position of the address bar 1256-0 determines the first bit of the currently-active memory address, and the position of the address bar 1256-1 determines the second bit; as shown, both address bars (1256-0, 1256-1) are in their 0-value positions, so the memory address 00 is currently selected. In each case, the positions of address bars (1256-0, 1256-1) place at least one transmission plate 1258 of a transmission gate 1252 for the inactive memory addresses into a position to interrupt transmission of motion from a memory select bar 1260 to transmission gates 1252 in a cell selector 1262 (in a manner similar to that of the chained transmission gates 700A-C in the NOR gate 720 shown in in FIG. 7C). In such position, the transmission plate 1258 is positioned to accommodate motion of either the memory select bar 1260 itself or a memory select link 1264, without causing motion of the transmission plate 1258. For example, in the position shown, for the currently inactive memory address 01, the lower transmission plate 1258 is positioned to transmit motion of the memory select bar 1260 to the memory select link 1264, but the upper transmission plate 1258 is positioned to accommodate movement of the memory select link 1264 without transmitting such motion to the cell selector 1262. The transmission plates for the memory addresses 10 and 11 are arranged similarly to those for the addresses 00 and 01, but with their lower transmission plates positioned such that they can accommodate motion of the memory select bar 1260 when the address bar 1256-0 is in its 0-value position (thus, they are inactive in the situation illustrated), but transfer movement to memory select links when the address bar 1256-0 is in its 1-value position, with the position of the upper transmission plates (positioned by the address bar 1256-1) determining which memory select link can be accommodated, and which acts to transmit movement. When the memory select bar 1260 is displaced upward, only one path through the transmission gates exists, defining the active memory address based on the positions of the address bars (1256-0, 1256-1).

In the cell selector 1262, displacement of the transmission gates 1252 in the selected path acts on a pair of linked transmission gates 1252; such action moves the pair of gates 1252 from inactive positions (where movement of an unlock bar 1266 and a copy bar 1268 can be accommodated without moving the transmission plates 1258, as shown) to active positions, where the transmission plates 1258 act to transmit movement of the unlock bar 1266 to an unlock link 1270, and movement of the copy bar 1268 to a copy link 1272. When moved, the unlock link 1270 serves as a lock actuator to move the lock plates 1212 of the latches in the active memory address, while the copy link 1272 serves as the copy actuator (or driven element) to move the copy elements 1206.

To store values encoded by the current positions of the data lines 1254 into the copy elements 1206 of the currently selected memory address, the data lines are first immobilized by data locks 1274. The unlock bar 1266 is then raised, to free translational motion of the copy elements 1206 for the selected address. The copy bar 1268 is then raised, and the interaction of the copy elements 1206 with the inputs 1202 (fixed in position by the data locks 1274) acts to move the copy elements 1206 to positions that correspond to the positions of the inputs 1202 (which are set by the positions of the data lines 1254) as the copy elements 1206 are pivoted upwards by the copy link 1272. The unlock bar 1266 is then lowered, preventing the copy elements 1206 from translating between positions, and storing the encoded values. Thereafter, the copy bar 1268 can be lowered, and the data locks 1274 released to allow the data lines 1254 to be reset to new values.

To retrieve the stored values, the actions of the copy bar 1268 and the unlock bar 1266 can be reversed. The data lines 1254 are unlocked to allow the inputs 1202 to move, and then the copy bar 1268 is raised. Since the unlock bar 1266 has not yet been raised, the copy elements 1206 for the selected memory address are blocked from translating, and thus each retain the position reflecting their current value (the value previously stored after copying the value of the associated input 1202); when the copy bar 1268 is raised, the pivoting movement of each copy element 1206 acts to move the associated input 1202 to either its 0-value or 1-value position, to match the value currently encoded by the copy element 1206 (the inputs 1202 in this case essentially serving as outputs). The inputs 1202 are then locked in position by activating the data locks 1274, and the copy bar 1268 can then be lowered, before the memory select bar 1260 is lowered to allow selection of a new memory address from which to retrieve values.

Figure 13A:
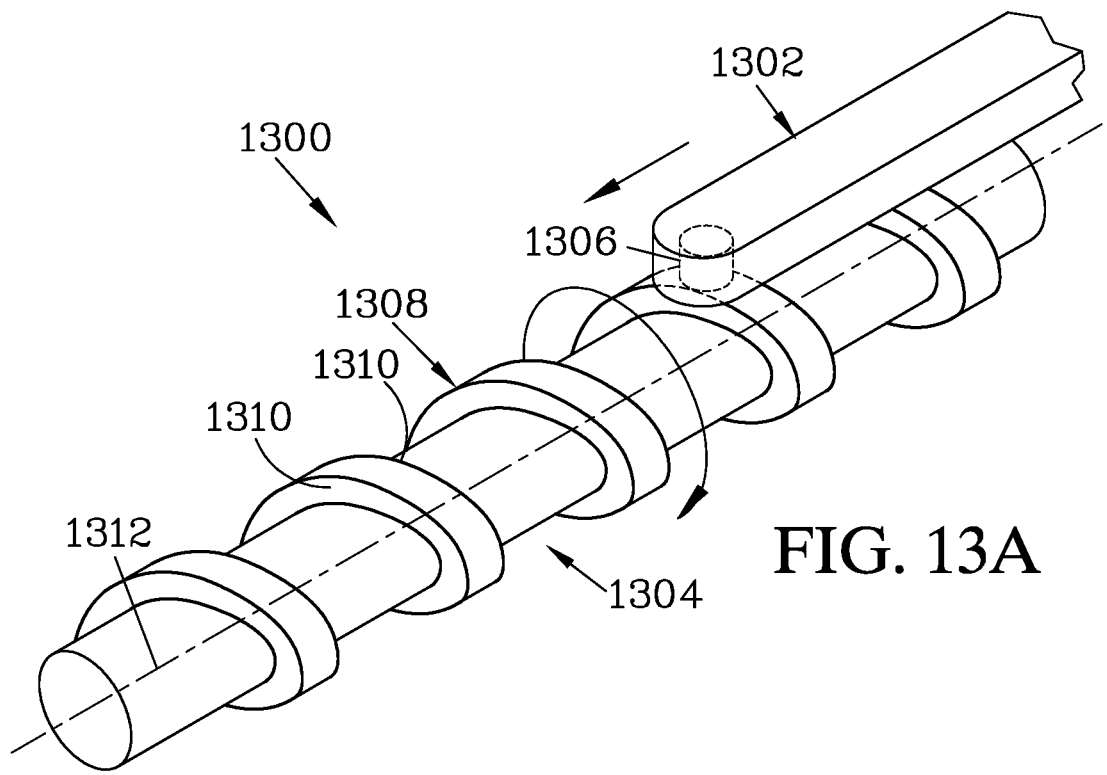
FIGS. 13A to 13E show examples of mechanisms that employ NCF to generate or transfer rotational motion.

Camming action using NCF interactions can be used to provide simple motors. FIG. 13A illustrates one example of a rotator mechanism 1300 that employs NCF interaction to convert translational motion to rotational motion. The rotator mechanism 1300 has a driver 1302 and a driven element 1304. The driver 1302 has an attractive element 1306, while the driven element 1304 has a helical thread 1308, bounded by edges 1310, and to which the attractive element 1306 is attracted; in the mechanism shown, the attractive element 1306 is a magnet, and the helical thread 1308 is formed of a ferromagnetic material. The driven element 1304 is mounted so as to rotate about an axis 1312, and the driver 1302 is translatable parallel to the axis 1312. When the driver 1302 translates, the driven element 1304 rotates to avoid moving the attractive element 1306 beyond either of the edges 1310, in order to maintain a constant NCF between the translating attractive element 1306 and the helical thread 1308. The helical thread 1308 provides an active surface, and movement is forced to avoid pushing the attractive element 1306, serving as an engaging element, against one of the edges 1310. In effect, the helical thread 1308 provides a similar camming action as the shaped plate 1106 of the mechanism shown in FIGS. 11A & 11B if the plate 1106 were elongated and rolled into a cylindrical shape (as noted earlier, many mechanisms can function in a similar manner with flat plates or cylinders, and adaptations to other shapes, such as spherical or semi-spherical shapes, may be practical for some applications). The motions could be reversed, with the rotating element being driven and causing translation of the other element.

Figure 13B:
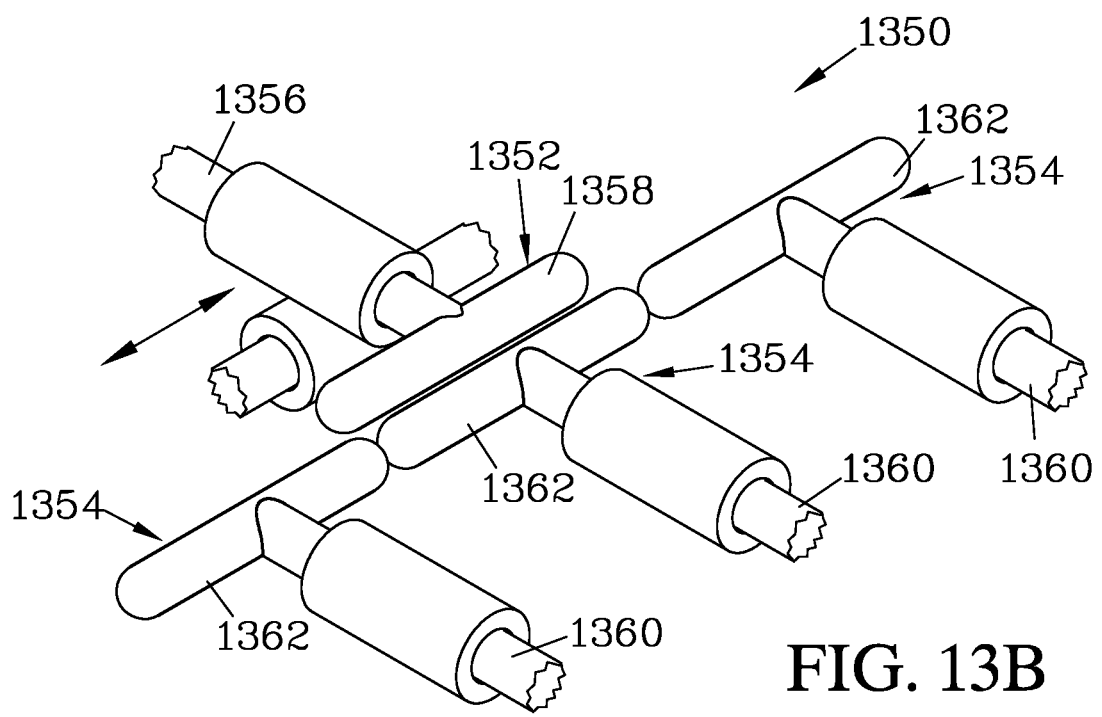
Figure 13C:
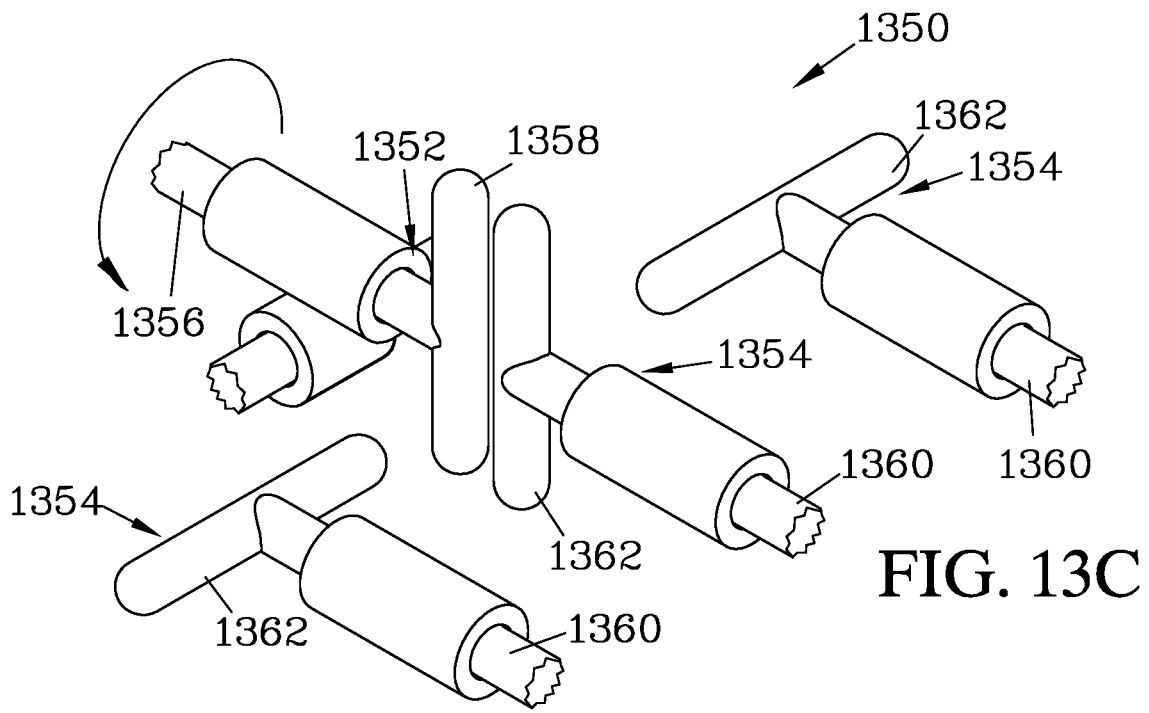

FIGS. 13B and 13C illustrate a rotator mechanism 1350 that serves to selectively transmit rotational motion between a single input 1352 and a number of outputs 1354, such as could be employed in a mechanical multiplexer; the transmission scheme could be reversed, with multiple inputs selectively transmitting rotational motion to a single output. The input 1352 has an input shaft 1356 and an elongated input head 1358. Similarly, each of the outputs 1354 has an output shaft 1360 and an elongated output head 1362. When the outputs 1354 are arranged with their output heads 1362 aligned, the input 1352 can be positioned with the input head 1358 extending parallel to the output heads 1362, and can be moved (by means not shown) to place the input head 1358 alongside a selected one of the output heads 1362. Because the output heads 1362 form a line with only small interruptions, such motion of the input 1352 results in only slight VDW barriers to overcome as the input head 1358 is moved beyond the edge of a corresponding output head 1362. Once aligned with the selected output head 1362, the input 1352 can be rotated (as shown in FIG. 13C), and VDW forces cause the output head 1362 to rotate with the input head 1358 to avoid overcoming the VDW attraction between the heads (1358, 1362) that would be required to move them out of alignment with each other. Rotational motion is transmitted to the selected output shaft 1360. The mechanism 1350 can be designed such that the input 1352 rotates in increments of 180°, such that the input head 1358 and the aligned output head 1362 come to rest at positions where the output heads 1362 are aligned. The input 1352 can then be moved to place the input head into opposition to another of the output heads 1362, after which rotation of the input 1352 forces rotation of that output 1354.

Figure 13D:
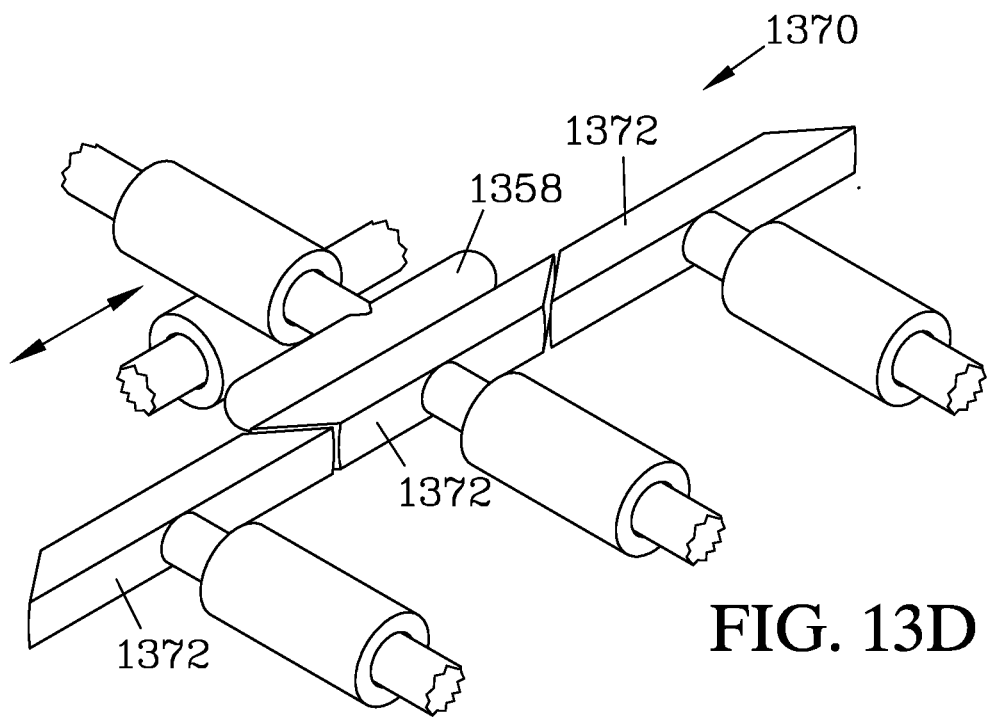

To further reduce the VDW force to be overcome to move the input head from alignment alongside one output head to alignment alongside another, the geometry of the input head or the output heads could be adjusted to reduce the barrier when moving between output heads. As one example, FIG. 13D shows a rotator mechanism 1370 which differs from the mechanism 1350 only in the shape of output heads 1372, which are beveled such that they overlap portions of the adjacent output heads 1372. As the input head 1358 is moved between output heads 1372, the VDW barrier to movement across the gap between output heads 1372 is more gradual, and should require less force to overcome the resistance caused by VDW forces.

Figure 13E:
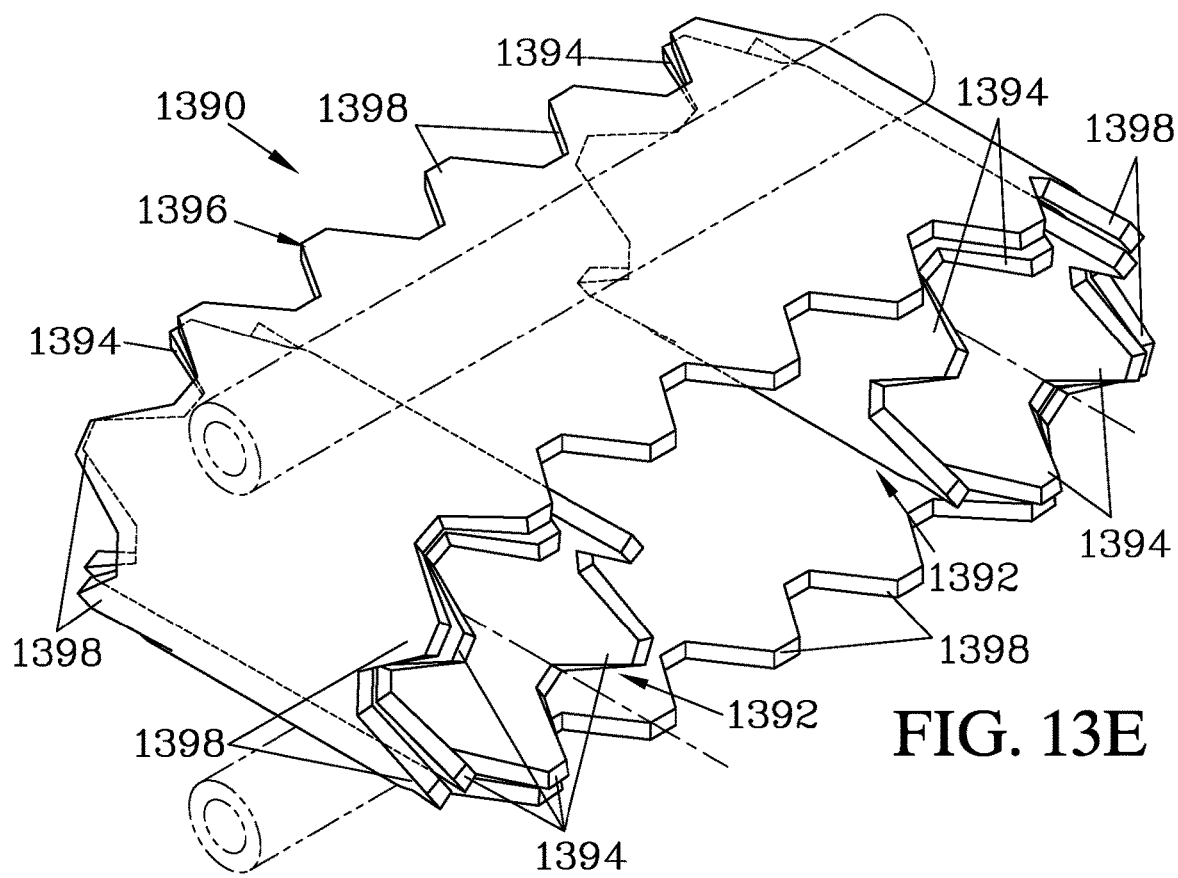

FIG. 13E shows another use of NCF energy barriers to cause motion of parts to avoid having to overcome an energy barrier to move an element beyond an effective edge. A belt-drive mechanism 1390 employs a pair of pulleys 1392 that have edges formed with pulley teeth 1394. A belt 1396 having edges with belt teeth 1398 engages the pulleys 1392. The belt teeth 1398 match up with and are superimposed over the pulley teeth 1394, and create a NCF barrier to being moved beyond the edges of the pulley teeth 1394. This energy barrier acts to keep the teeth (1394, 1398) aligned, such that rotating one of the pulleys 1392 moves the belt 1396 to maintain the alignment of the teeth (1394, 1398), and such motion of the belt 1396 similarly causes the other pulley 1392 to move with it. For a molecular-scale mechanism, the pulleys 1392 could be formed from CNTs, and the belt 1396 made of graphene. When the spacing between the pulleys 1392 is larger, CNT guides that extend along the belt 1396 could be used to counteract the sides of the belt 1396 being attracted to each other.

Figure 14A:
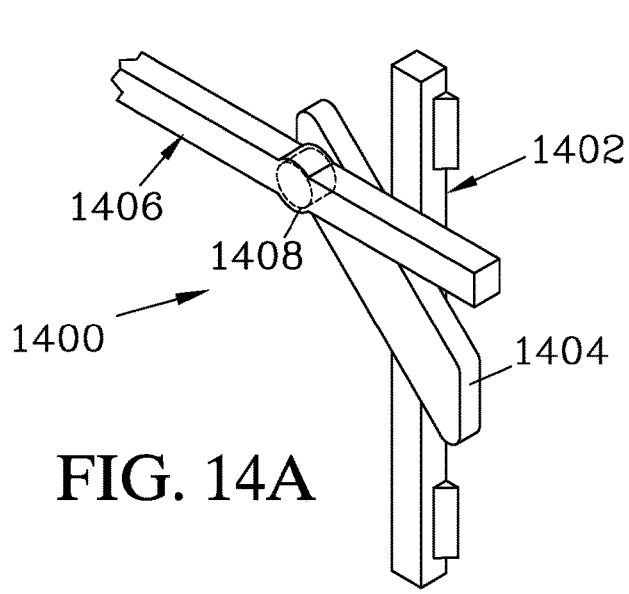
FIGS. 14A to 14D illustrate mechanisms where interaction between a shaped plate and one or more attractive elements serve to guide the motion of parts. The relative movement is directed along a path that is constrained by edges to avoid having to overcome attractive forces between the parts.
Figure 14B:
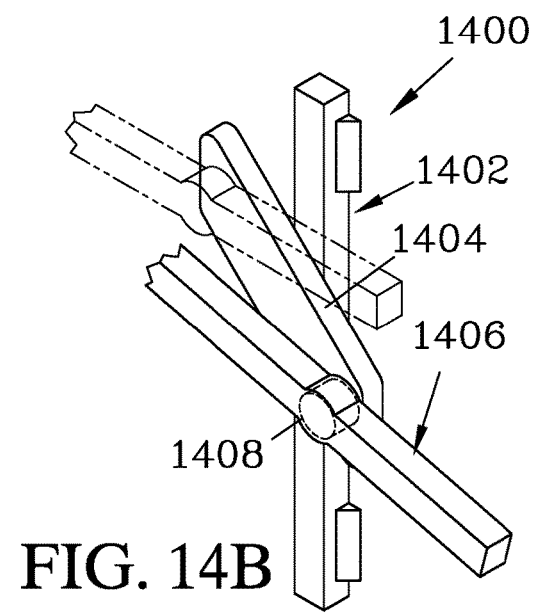
Figure 14C:
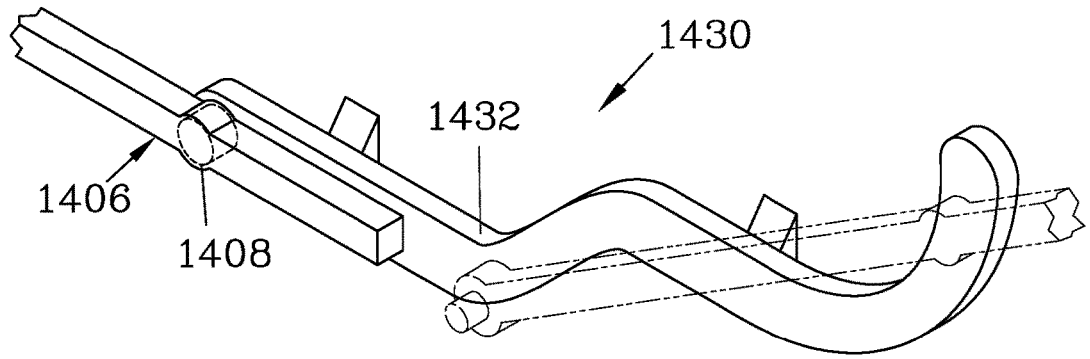

NCFs can also be employed to guide or limit motion of a part, so as to avoid an NCF-reactive portion or element of one part from contacting an edge of another part (such second part being considered immobile for purposes of discussion). FIGS. 14A & 14B illustrate a guide mechanism 1400 that employs parts similar to those of the linkage 1100 shown in FIGS. 11A & 11B. The guide 1400 again has a first part 1402 with a shaped plate 1404 (providing an active surface), and a second part 1406 with an attractive element 1408 (providing an engaging element); however, in the guide 1400, the first part 1402 is immobile, and the second part 1406 is not limited to translational motion along its axis of extension (in the example illustrated, the second part 1406 both pivots about an axis out of view to the left, and moves as that pivot axis is translated). When a force is applied to translate the pivot axis of the second part 1406 (as shown in FIG. 14B), the NCF between the attractive element 1408 and the shaped plate 1404 acts to guide the motion of the second part 1406 to avoid bringing the attractive element 1408 into contact with an edge of the shaped plate 1404. FIG. 14C illustrates a guide mechanism 1430 that extends the same principal, with a guide track 1432 that serves as a first part that is fixed in position. The guide track 1432 again serves to guide movement of the second part 1406 to direct it along a desired path of motion, to avoid bringing the attractive element 1408 into contact with an edge of the guide track 1432, which would require overcoming the NCFs between the attractive element 1408 and the guide track 1452. In this case, the guide track 1432 directs the attractive element along a curvilinear path as the pivot axis of the second part 1406 is translated.

Figure 14D:
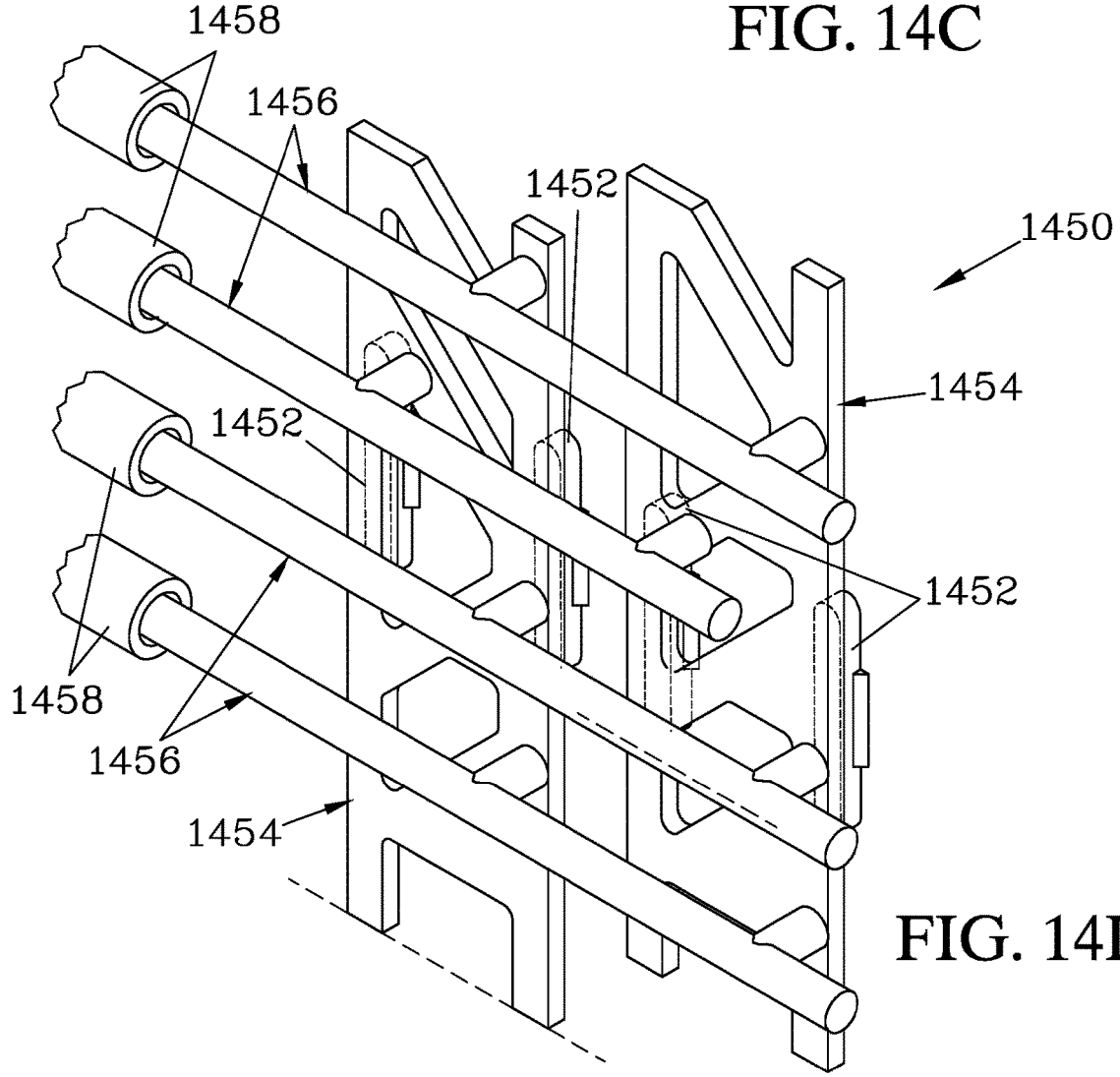

The same guidance effect can be accomplished by changing relative positions of the components, such that the track moves and the element that follows the track is fixed. As one example of such a scheme, FIG. 14D illustrates a data reader mechanism 1450 that incorporates components that are functionally similar to those of the data reader mechanism 1170 shown in FIG. 11H, but which are designed for nano-scale fabrication employing van der Waals attraction as the NCF. The mechanism 1450 has two pairs of attractive vertical guide elements 1452 (which could be formed of a diamondoid material such as lonsdaleite), each positioned to engage one of two data ribbons 1454 (which could be formed from graphene tape). The guide elements 1452 are fixed and positioned opposite to unobstructed vertical regions of the data ribbons 1454 such that the data ribbons 1454 are limited to essentially vertical movement, as off-axis motion would bring one of the edges of the data ribbon 1454 into contact with one of the guide elements 1452, requiring force to overcome the NCF. In the data reader 1450, the guiding effect of the guide elements 1452 serves to avoid problems with drifting of the data ribbons 1454 with respect to four bit readers 1456 (which could be formed from modified CNTs). FIG. 14D also shows the bit readers 1456 mounted in sleeves 1458 (which could be formed by larger CNTs). Nested CNTs could be employed as springs, if the motion of each bit reader 1456 in its associate sleeve 1458 acts to change the depth of overlap in these elements, as van der Waals attraction tends to draw the elements towards a position of greatest overlap, providing a restoring force against movement that decreases the overlap. Such restoring force could be used to tension the bit readers 1456, either using the sleeves 1458 shown or another set of sleeves overlapping another portion of the bit readers 1456.

Similar guiding action can be used to limit the motion between two parts to either rotational or translational movement, when the parts are configured such as to allow one type of motion without any changes in NCF, but to require overcoming NCF to allow the other type of motion. This can be employed to simplify mechanisms, by reducing the number of parts needed to limit motion to a desired type and/or range, as well as to design mechanisms where parts can both rotate and translate, but move freely in one case while requiring force to move in the other case. FIG. 15A illustrates a rotary joint 1500 having an inner part 1502 and an outer part 1504. The inner part 1502 is elongated along an axis 1506, and has an inner part bearing section 1508 that is enlarged and symmetrical about the axis 1506. The outer part 1504 has an outer part passage 1510 and is provided with attractive elements 1512 positioned near the ends of the passage 1510. The parts (1502, 1504) are free to rotate with respect to each other about the axis 1506 (subject to frictional forces if in contact), since such rotation causes no changes in the NCF between the inner part bearing section 1508 and the attractive elements 1512. However, translational motion along the axis 1506 requires overcoming the NCF between the attractive elements 1512 and the bearing section 1508, since such motion would move the attractive elements 1512 at one end of the passage 1510 into contact with the effective edge where the bearing section 1508 terminates. Unless sufficient force is applied to overcome the NCF, the parts (1502, 1504) can rotate but not translate with respect to each other. It should be noted that such limit on translational motion is achieved without additional motion-limiting parts which would complicate the mechanism. In a nano-scale mechanism, modified CNTs could be used for the inner and outer elements of the rotary joint (possibly similar to the elements 552, 554, and 564 shown in FIGS. 5C & 5D) with VDW forces providing the NCFs to retain the inner part at its axial position. It should also be noted that the relative lengths of the bearing section 1508 and the passage 1510 could be varied, to allow rotation and a limited range of translation. FIG. 15B illustrates a rotary joint 1530 that employs an inner part 1532 and the same outer part 1504. The inner part 1532 in this example has two enlarged bearing sections 1534, either of which can be rotationally engaged by the outer part passage 1510. The outer part 1508 can be forcibly moved translationally between two different positions relative to the inner part 1532, and can rotate freely when in either longitudinal position.

FIG. 15C illustrates a sliding joint 1550 which is functionally reversed compared to the rotary joint 1500 shown in FIG. 15A, allowing free translation (within a limited range) but resisting rotation. In the sliding joint 1550, an inner part 1552 and an outer part 1554 are respectively provided with a bearing section 1556 and a passage 1558, with the parts (1552, 1554) configured to allow translation along an axis 1560 without overcoming NCFs, but requiring force to allow rotation of the parts (1552, 1554) with respect to each other. In the sliding joint 1550, this is accomplished by positioning attractive elements 1562 on the outer part 1554, and configuring the bearing section 1556 with bearing surfaces 1564 positioned to oppose the attractive elements 1562. Translation of the parts (1552, 1554) moves the bearing surfaces 1564 along the attractive elements 1562 without any significant change in NCF, while rotation of the parts (1552, 1554) would require effectively moving the attractive elements 1562 into contact with edges of the bearing surfaces 1564, creating a resistance to such rotation. Since there are four pairs of attractive elements 1562 and four bearing surfaces 1564, the parts (1552, 1554) can be forcibly rotated between four angular positions with respect to each other, and can freely translate a limited distance when in any of the four positions.

The above discussion, which employs particular examples for illustration, should not be seen as limiting the spirit and scope of the appended claims.

The invention claimed is:

1. A mechanism comprising:
a first part; and
a second part movable with respect to said first part through a defined range of motion and generating an attractive non-contact force with respect to said first part due to van der Waals attraction,
wherein said first part and said second part are configured relative to each other such that movement throughout the defined range of motion does not move any portion of either part into such close proximity of an effective edge of another part so as to cause a material change in van der Waals attraction, and thus the non-contact force therebetween does not materially change throughout the defined range of motion,
the mechanism being configured to accept data in the form of one or more mechanical inputs that encode values by position and to output data in the form of one or more mechanical outputs that encode values by position, wherein the mechanism is configured such that the position of at least one output is determined by performing a logic operation on at least one of said inputs, the logic operation including at least one operation from the group of combinatorial logic operations, sequential logic operations, and Boolean logic operations.

2. The mechanism of claim 1 wherein said first part can move between at least an inactive position, in which said second part can move relative to said first part without materially changing the attractive force therebetween, and an active position, where motion of said second part relative to said first part would require overcoming a significant change in the attractive force.

3. The mechanism of claim 2 wherein said first part blocks motion of said second part in at least one direction when said first part is in its active position.

4. The mechanism of claim 1 wherein said first part and said second part are configured with respect to each other such that, at least in an active operational state of the mechanism, movement of said first part requires a corresponding movement of said second part in order to maintain the attractive force between said parts materially unchanged.

5. The mechanism of claim 4 wherein the mechanism can be set in an inactive operational state, where movement of said first part can be accommodated without requiring movement of said second part in order to maintain the attractive force between said parts materially unchanged.

6. The mechanism of claim 1 further comprising:
a driven element, and wherein the position(s) of said input(s) determine the allowed range of motion within the mechanism to determine whether or not displacement of said driven element can be accommodated without being conveyed to a selected one of said outputs.

7. The mechanism of claim 1 wherein the mechanism occupies a volume no greater than 0.001 mm3.

8. A mechanism comprising:
a first part; and
a second part movable with respect to said first part and interacting with said first part so as to generate a non-contact force therebetween due to van der Waals attraction,
one of said first part and said second part having at least one active surface provided thereon, said active surface(s) having at least one effective edge, and
wherein said first part and said second part are configured with respect to each other such that the non-contact force between said parts defines the range of allowed motion of said second part with respect to said first part, such range of motion of said second part being defined as the range of motion that does not move either of said first part or said second part relative to said effective edge(s) of said active surface(s) so as to create a material change in van der Waals attraction between said first part and said second part, and thus motion of said second part within such range not materially changing the non-contact force between said parts.

9. The mechanism of claim 8 wherein said effective edge is provided by structure residing below a surface that continues beyond said effective edge.

10. The mechanism of claim 8 wherein the mechanism occupies a volume no greater than 0.001 mm3.

11. A mechanism comprising:
a first movable part;
a second movable part;
one of said first part and said second part having at least one active surface provided thereon, and the other of said first part and said second part having at least one engaging element provided thereon, said active surface(s) having at least one effective edge, said engaging element(s) and said active surface(s) generating a non-contact force therebetween due to van der Waals attraction, and said first part and said second part being configured such that, at least in an active operational state of the mechanism, said second part is forced to move in response to motion of said first part, said second part moving so as to avoid material changes in the van der Waals attraction generated between said first part and said second part that would result from said engaging element(s) moving relative to said effective edge(s) if said second part did not move.

12. The mechanism of claim 11 wherein the mechanism can be selectively configured in an active operational state, where said second part moves responsive to motion of said engaging element(s) relative to said effective edge(s), and in an inactive operational state, where motion of said engaging element(s) can be accommodated without creating a material change in non-contact forces therebetween that would require motion of said second part responsive to motion of said first part to avoid material changes in non-contact forces therebetween.

13. The mechanism of claim 11 wherein at least one of said first part and said second part is positioned by at least one input.

14. The mechanism of claim 13 wherein motion of said second part responsive to motion of said engaging element(s) relative to said effective edge(s) is determined by a Boolean function performed on the positions of more than one input.

15. The mechanism of claim 14 wherein the mechanism provides the function of a logic gate selected from the group of NOR, NAND, and XOR gates.

16. The mechanism of claim 13 where the mechanism is driven by a mechanical clock signal and is configured such that the position of at least one of the first part and the second part is stored between cycles of the clock signal.

17. The mechanism of claim 11 where at least one of said first part and said second part comprises a carbon nanotube.

18. The mechanism of claim 11 wherein the mechanism requires no more than 1 µN force to cause motion of said second part.

19. The mechanism of claim 11 wherein the mechanism occupies a volume no greater than 0.001 mm3.

20. A mechanism comprising:
a first part; and
a second part movable with respect to said first part through a defined range of motion,
wherein said first part and said second part generate an attractive non-contact force therebetween due to van der Waals attraction,
wherein said first part and said second part are configured relative to each other such that throughout the defined range of motion, only portions of said first part and said second part that are separated by a sufficiently large distance that VDW attraction is insignificant change distance with respect to each other, and
wherein the mechanism occupies a volume no greater than 0.001 mm3.

21. A mechanism comprising:
a first part; and
a second part attracted to said first part by a van der Waals attractive force,
one of said first part and said second part having at least one active surface provided thereon, and the other of said first part and said second part having at least one engaging element provided thereon, said active surface(s) having at least one effective edge, and
said first part and said second part being configured such that, at least in an active operational state of the mechanism, said second part is forced to move in response to motion of said first part, said second part moving so as to minimize changes in the van der Waals attractive force generated between said first part and said second part by moving so as to result in a less stiff change in the van der Waals attractive force than the change in such force that would result from said second part not moving, such changes in the force resulting from motion of said engaging element(s) relative to said effective edge(s).

22. The mechanism of claim 21 wherein the mechanism can be selectively configured in an active operational state, where said second part moves responsive to motion of said first part, and in an inactive operational state, where components of the mechanisms are arranged such that moving said second part would result in a stiffer change in the van der Waals attractive force generated between said first part and said second part than the change in such force that would result from said second part not moving.

* * * * *